United States Patent
Facchini et al.

(10) Patent No.: US 9,831,857 B2
(45) Date of Patent: Nov. 28, 2017

(54) POWER SPLITTER WITH PROGRAMMABLE OUTPUT PHASE SHIFT

(71) Applicant: Peregrine Semiconductor Corporation, San Diego, CA (US)

(72) Inventors: Marc Facchini, San Diego, CA (US); Peter Bacon, Derry, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/645,217

(22) Filed: Mar. 11, 2015

(65) Prior Publication Data

US 2016/0269008 A1   Sep. 15, 2016

(51) Int. Cl.

| | |
|---|---|
| H01P 5/12 | (2006.01) |
| H03K 5/13 | (2014.01) |
| H03F 1/02 | (2006.01) |
| H03F 3/193 | (2006.01) |
| H03F 1/56 | (2006.01) |
| H03F 3/60 | (2006.01) |
| H03K 5/00 | (2006.01) |

(52) U.S. Cl.
CPC ............ *H03K 5/13* (2013.01); *H03F 1/0288* (2013.01); *H03F 1/565* (2013.01); *H03F 3/193* (2013.01); *H03F 3/601* (2013.01); *H03F 2200/451* (2013.01); *H03K 2005/00286* (2013.01)

(58) Field of Classification Search
CPC H03K 5/13; H03K 2005/0286; H03F 1/0288; H03F 3/193; H03F 2200/451
USPC ........................................ 333/100
See application file for complete search history.

(56) References Cited

U.S. PATENT DOCUMENTS

| | | |
|---|---|---|
| 3,646,361 A | 2/1972 | Pfiffner |
| 3,699,359 A | 10/1972 | Shelby |
| 3,974,465 A * | 8/1976 | White .................. H01P 5/16 333/136 |
| 3,975,671 A | 8/1976 | Stoll |
| 3,983,414 A | 9/1976 | Stafford et al. |
| 3,988,727 A | 10/1976 | Scott |
| 4,053,916 A | 10/1977 | Cricchi et al. |
| 4,139,826 A | 2/1979 | Pradal |
| 4,145,719 A | 3/1979 | Hand et al. |
| 4,244,000 A | 1/1981 | Ueda et al. |

(Continued)

FOREIGN PATENT DOCUMENTS

| | | |
|---|---|---|
| CN | 1256521 A | 6/2000 |
| DE | 19832565 | 8/1999 |

(Continued)

OTHER PUBLICATIONS

C. Tinella et al., "A High-Performance CMOS-SOI Antenna Switch for the 2.55-GHz Band," IEEE Journal of Solid-State Circuits, vol. 38, No. 7, Jul. 2003.

(Continued)

*Primary Examiner* — Robert Pascal
*Assistant Examiner* — Kimberly Glenn
(74) *Attorney, Agent, or Firm* — Jaquez Land Greenhaus LLP; Martin J. Jaquez, Esq.; Alessandro Steinfl, Esq.

(57) ABSTRACT

Devices and methods for implementing an RF integrated circuit device operatively configured to provide the function of RF power splitter with programmable output phase shift are described. Configurable and adjustable phase shift units for use in such IC device are also described.

51 Claims, 35 Drawing Sheets

(56) References Cited

U.S. PATENT DOCUMENTS

| | | |
|---|---|---|
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |
| 4,390,798 A | 6/1983 | Kurafuji |
| RE31,749 E | 11/1984 | Yamashiro |
| 4,564,843 A | 1/1986 | Cooper |
| 4,638,184 A | 1/1987 | Kimura |
| 4,701,732 A | 10/1987 | Nestlerode |
| 4,736,169 A | 4/1988 | Weaver et al. |
| 4,739,191 A | 4/1988 | Puar |
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,825,145 A | 4/1989 | Tanaka et al. |
| 4,849,651 A | 7/1989 | Estes, Jr. |
| 4,883,976 A | 11/1989 | Deane |
| 4,890,077 A | 12/1989 | Sun |
| 4,891,609 A | 1/1990 | Eilley |
| 4,893,070 A | 1/1990 | Milberger et al. |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 4,999,585 A | 3/1991 | Burt et al. |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,107,152 A | 4/1992 | Jain et al. |
| 5,124,762 A | 6/1992 | Childs et al. |
| 5,125,007 A | 6/1992 | Yamaguchi et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,319,604 A | 6/1994 | Imondi et al. |
| 5,345,422 A | 9/1994 | Redwine |
| 5,350,957 A | 9/1994 | Cooper et al. |
| 5,375,257 A | 12/1994 | Lampen |
| 5,405,795 A | 3/1995 | Beyer et al. |
| 5,416,043 A | 5/1995 | Burgener et al. |
| 5,422,590 A | 6/1995 | Coffman et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,784,687 A | 7/1998 | Itoh et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,066 A | 9/1998 | Terk |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,864,328 A | 1/1999 | Kajimoto |
| 5,863,823 A | 2/1999 | Burgener |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,880,620 A | 3/1999 | Gitlin et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,093 A | 7/1999 | Huang et al. |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,953,557 A | 9/1999 | Kawahara |
| 5,959,335 A | 9/1999 | Bryant et al. |
| 5,969,560 A | 10/1999 | Kohama et al. |
| 5,973,363 A | 10/1999 | Staab et al. |
| 5,973,364 A | 10/1999 | Kawanaka |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,013,958 A | 1/2000 | Aytur |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,063,686 A | 5/2000 | Masuda et al. |

(56) References Cited

U.S. PATENT DOCUMENTS

| | | | |
|---|---|---|---|
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,443 A | 6/2000 | Morishita et al. |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,122,185 A | 9/2000 | Utsunomiya |
| 6,130,570 A | 10/2000 | Pan et al. |
| 6,133,752 A | 10/2000 | Kawagoe |
| 6,160,292 A | 12/2000 | Flaker et al. |
| 6,163,238 A | 12/2000 | Nestlerode |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shimo |
| 6,195,307 B1 | 2/2001 | Umezawa et al. |
| 6,201,761 B1 | 3/2001 | Wollesen |
| 6,218,248 B1 | 3/2001 | Hwang et al. |
| RE37,124 E | 4/2001 | Monk et al. |
| 6,215,360 B1 | 4/2001 | Callaway, Jr. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,310,508 B1 | 10/2001 | Westerman |
| 6,316,983 B1 | 11/2001 | Kitamura |
| 6,320,225 B1 | 11/2001 | Hargrove et al. |
| 6,337,594 B1 | 1/2002 | Hwang |
| 6,341,087 B1 | 1/2002 | Kunikiyo |
| 6,355,957 B1 | 3/2002 | Maeda et al. |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Bancal et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,411,156 B1 | 6/2002 | Borkar et al. |
| 6,414,353 B2 | 7/2002 | Maeda et al. |
| 6,414,863 B2 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,537,861 B1 | 3/2003 | Kroell et al. |
| 6,559,689 B1 | 5/2003 | Clark |
| 6,563,366 B1 | 5/2003 | Kohama |
| 6,573,533 B1 | 6/2003 | Yamazaki |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,670,655 B2 | 12/2003 | Lukes et al. |
| 6,677,641 B2 | 1/2004 | Kocon |
| 6,677,803 B1 | 1/2004 | Chiba |
| 6,683,499 B2 | 1/2004 | Lautzenhiser et al. |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,698,498 B1 | 3/2004 | Crenshaw et al. |
| 6,703,863 B2 | 3/2004 | Gion |
| 6,704,550 B2 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,747,522 B2 | 6/2004 | Pietruszynski et al. |
| 6,753,738 B1 | 6/2004 | Baird |
| 6,762,477 B2 | 7/2004 | Kunikiyo |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,882,210 B2 | 4/2005 | Asano et al. |
| 6,889,036 B2 | 5/2005 | Ballweber et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,901,023 B2 | 5/2005 | Kirsch et al. |
| 6,903,596 B2 | 6/2005 | Geller et al. |
| 6,906,653 B2 | 6/2005 | Uno |
| 6,908,832 B2 | 6/2005 | Farrens et al. |
| 6,917,258 B2 | 7/2005 | Kushitani et al. |
| 6,933,744 B2 | 8/2005 | Das et al. |
| 6,937,790 B2 * | 8/2005 | Bridges ............... G02F 1/2255 385/30 |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 6,992,543 B2 | 1/2006 | Luetzelschwab et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |

(56) References Cited

U.S. PATENT DOCUMENTS

| | | | |
|---|---|---|---|
| 7,129,545 B2 | 10/2006 | Cain | |
| 7,132,873 B2 | 11/2006 | Hollmer | |
| 7,138,846 B2 | 11/2006 | Suwa et al. | |
| 7,161,197 B2 | 1/2007 | Nakatsuka et al. | |
| 7,173,471 B2 | 2/2007 | Nakatsuka et al. | |
| 7,190,933 B2 | 3/2007 | De Ruijter et al. | |
| 7,199,635 B2 | 4/2007 | Nakatsuka et al. | |
| 7,212,788 B2 | 5/2007 | Weber et al. | |
| 7,266,014 B2 | 9/2007 | Wu et al. | |
| 7,269,392 B2 | 9/2007 | Nakajima et al. | |
| 7,299,018 B2 | 11/2007 | Van Rumpt | |
| 7,307,490 B2 | 12/2007 | Kizuki | |
| 7,345,342 B2 | 3/2008 | Challa | |
| 7,345,521 B2 | 3/2008 | Takahashi et al. | |
| 7,355,455 B2 | 4/2008 | Hidaka | |
| 7,391,282 B2 | 6/2008 | Nakatsuka et al. | |
| 7,404,157 B2 | 7/2008 | Tanabe | |
| 7,405,982 B1 | 7/2008 | Flaker, et al. | |
| 7,432,552 B2 | 10/2008 | Park | |
| 7,460,852 B2 | 12/2008 | Burgener et al. | |
| 7,515,882 B2 | 4/2009 | Kelcourse et al. | |
| 7,546,089 B2 | 6/2009 | Bellantoni | |
| 7,561,853 B2 | 7/2009 | Miyazawa | |
| 7,616,482 B2 | 11/2009 | Prall | |
| 7,659,152 B2 | 2/2010 | Gonzalez et al. | |
| 7,710,189 B2 | 5/2010 | Toda | |
| 7,714,676 B2 | 5/2010 | McKinzie, III | |
| 7,733,156 B2 | 6/2010 | Brederlow et al. | |
| 7,733,157 B2 | 6/2010 | Brederlow et al. | |
| 7,741,869 B2 | 6/2010 | Hidaka | |
| 7,796,969 B2 | 9/2010 | Kelly et al. | |
| 7,825,715 B1 | 11/2010 | Greenberg | |
| 7,860,499 B2 | 12/2010 | Burgener et al. | |
| 7,890,891 B2 | 2/2011 | Stuber et al. | |
| 7,910,993 B2 | 3/2011 | Brindle et al. | |
| 7,928,759 B2 | 4/2011 | Hidaka | |
| 7,960,772 B2 | 6/2011 | Englekirk | |
| 7,982,265 B2 | 7/2011 | Challa et al. | |
| 8,081,928 B2 | 12/2011 | Kelly | |
| 8,129,787 B2 | 3/2012 | Brindle et al. | |
| 8,138,816 B2 | 3/2012 | Freeston et al. | |
| 8,405,147 B2 | 3/2013 | Brindle et al. | |
| 8,509,718 B2 * | 8/2013 | Khlat | H04B 1/18 455/150.1 |
| 8,514,007 B1 * | 8/2013 | Ahmed | G06G 7/10 327/355 |
| 8,527,949 B1 | 9/2013 | Pleis et al. | |
| 8,583,111 B2 | 11/2013 | Burgener et al. | |
| 8,604,864 B2 | 12/2013 | Ranta et al. | |
| 8,638,159 B2 | 1/2014 | Ranta et al. | |
| 8,653,890 B1 * | 2/2014 | Ahmed | 330/107 |
| 8,669,804 B2 | 3/2014 | Ranta et al. | |
| 8,736,347 B2 | 5/2014 | Ahmed et al. | |
| 8,742,502 B2 | 6/2014 | Brindle et al. | |
| 8,803,631 B2 | 8/2014 | Manssen et al. | |
| 8,816,767 B2 | 8/2014 | Ahmed et al. | |
| 8,954,902 B2 | 2/2015 | Stuber et al. | |
| 9,024,700 B2 | 5/2015 | Ranta | |
| 9,087,899 B2 | 7/2015 | Brindle et al. | |
| 9,106,227 B2 | 8/2015 | Ranta et al. | |
| 9,130,564 B2 | 9/2015 | Brindle et al. | |
| 9,197,194 B2 | 11/2015 | Reedy et al. | |
| 9,203,348 B2 | 12/2015 | Ahmed et al. | |
| 9,219,453 B2 | 12/2015 | Ahmed et al. | |
| 9,225,378 B2 | 12/2015 | Burgener et al. | |
| 9,374,051 B2 | 6/2016 | Ahmed et al. | |
| 9,397,656 B2 | 7/2016 | Dribinsky et al. | |
| 9,490,755 B2 | 11/2016 | Ahmed et al. | |
| 9,608,619 B2 | 3/2017 | Stuber et al. | |
| 9,653,601 B2 | 5/2017 | Brindle et al. | |
| 2001/0015461 A1 | 8/2001 | Ebina | |
| 2001/0031518 A1 | 10/2001 | Kim et al. | |
| 2001/0040479 A1 | 11/2001 | Zhang | |
| 2001/0045602 A1 | 11/2001 | Maeda et al. | |
| 2002/0029971 A1 | 3/2002 | Kovacs | |
| 2002/0115244 A1 | 8/2002 | Park et al. | |
| 2002/0126767 A1 | 9/2002 | Ding et al. | |
| 2002/0195623 A1 | 12/2002 | Horiuchi | |
| 2003/0002452 A1 | 1/2003 | Sahota | |
| 2003/0141543 A1 | 7/2003 | Bryant et al. | |
| 2003/0160515 A1 | 8/2003 | Yu et al. | |
| 2003/0181167 A1 | 9/2003 | Lida | |
| 2003/0201494 A1 | 10/2003 | Maeda et al. | |
| 2003/0205760 A1 | 11/2003 | Kawanaka et al. | |
| 2003/0222313 A1 | 12/2003 | Fechner | |
| 2003/0227056 A1 | 12/2003 | Wang et al. | |
| 2004/0021137 A1 | 2/2004 | Fazan et al. | |
| 2004/0061130 A1 | 4/2004 | Morizuka | |
| 2004/0080364 A1 | 4/2004 | Sander et al. | |
| 2004/0129975 A1 | 7/2004 | Koh et al. | |
| 2004/0204013 A1 | 10/2004 | Ma et al. | |
| 2004/0218442 A1 | 11/2004 | Kirsch et al. | |
| 2004/0227565 A1 | 11/2004 | Chen et al. | |
| 2004/0242182 A1 | 12/2004 | Hikada et al. | |
| 2005/0017789 A1 | 1/2005 | Burgener et al. | |
| 2005/0068103 A1 | 3/2005 | Dupuis et al. | |
| 2005/0077564 A1 | 4/2005 | Forbes | |
| 2005/0079829 A1 | 4/2005 | Ogawa et al. | |
| 2005/0121699 A1 | 6/2005 | Chen et al. | |
| 2005/0127442 A1 | 6/2005 | Veeraraghavan | |
| 2005/0167751 A1 | 8/2005 | Nakajima et al. | |
| 2005/0212595 A1 | 9/2005 | Kusunoki et al. | |
| 2005/0264341 A1 | 12/2005 | Hikita et al. | |
| 2005/0285684 A1 | 12/2005 | Burgener et al. | |
| 2005/0287976 A1 | 12/2005 | Burgener et al. | |
| 2006/0009164 A1 | 1/2006 | Kataoka | |
| 2006/0022526 A1 | 2/2006 | Cartalade | |
| 2006/0077082 A1 | 4/2006 | Shanks et al. | |
| 2006/0160520 A1 | 7/2006 | Naoyuki | |
| 2006/0194558 A1 | 8/2006 | Kelly | |
| 2006/0194567 A1 | 8/2006 | Kelly et al. | |
| 2006/0267093 A1 | 11/2006 | Tang et al. | |
| 2006/0270367 A1 | 11/2006 | Burgener et al. | |
| 2007/0018247 A1 | 1/2007 | Brindle et al. | |
| 2007/0023833 A1 | 2/2007 | Okhonin et al. | |
| 2007/0045697 A1 | 3/2007 | Cheng et al. | |
| 2007/0069291 A1 | 3/2007 | Stuber et al. | |
| 2007/0120103 A1 | 5/2007 | Burgener et al. | |
| 2007/0279120 A1 | 12/2007 | Brederlow et al. | |
| 2007/0290744 A1 | 12/2007 | Adachi et al. | |
| 2008/0034335 A1 | 2/2008 | Cheng et al. | |
| 2008/0073719 A1 | 3/2008 | Fazan et al. | |
| 2008/0076371 A1 | 3/2008 | Dribinsky et al. | |
| 2008/0106349 A1 | 5/2008 | McKinzie, III | |
| 2008/0191788 A1 | 8/2008 | Chen et al. | |
| 2008/0265978 A1 | 10/2008 | Englekirk | |
| 2008/0303080 A1 | 12/2008 | Bhattacharyya | |
| 2009/0007036 A1 | 1/2009 | Cheng et al. | |
| 2009/0029511 A1 | 1/2009 | Wu | |
| 2009/0117871 A1 | 5/2009 | Burgener et al. | |
| 2009/0224843 A1 | 9/2009 | Radoias et al. | |
| 2010/0295610 A1 * | 11/2010 | Svechtarov | H03F 1/0294 330/124 R |
| 2011/0002080 A1 | 1/2011 | Ranta | |
| 2011/0092179 A1 | 4/2011 | Burgener et al. | |
| 2011/0163779 A1 | 7/2011 | Hidaka | |
| 2011/0169550 A1 | 7/2011 | Brindle et al. | |
| 2011/0227637 A1 | 9/2011 | Stuber et al. | |
| 2011/0227666 A1 | 9/2011 | Manssen et al. | |
| 2012/0169398 A1 | 7/2012 | Brindle et al. | |
| 2012/0267719 A1 | 10/2012 | Brindle et al. | |
| 2013/0222075 A1 | 8/2013 | Reedy et al. | |
| 2013/0293280 A1 | 11/2013 | Brindle et al. | |
| 2014/0077874 A1 * | 3/2014 | Ahmed | H03F 3/211 330/124 R |
| 2014/0165385 A1 | 6/2014 | Englekirk et al. | |
| 2014/0167834 A1 | 6/2014 | Stuber et al. | |
| 2014/0179374 A1 | 6/2014 | Burgener et al. | |
| 2014/0253248 A1 | 9/2014 | Ahmed et al. | |
| 2014/0312422 A1 | 10/2014 | Brindle et al. | |
| 2015/0015321 A1 | 1/2015 | Dribinsky et al. | |
| 2015/0022256 A1 | 1/2015 | Sprinkle et al. | |
| 2015/0188504 A1 * | 7/2015 | Akesson | H03F 1/0288 330/286 |

(56) References Cited

U.S. PATENT DOCUMENTS

| | | | |
|---|---|---|---|
| 2016/0064561 A1 | 3/2016 | Brindle et al. | |
| 2016/0094187 A1* | 3/2016 | Staudinger | H03F 1/0288 330/295 |
| 2016/0191019 A1 | 6/2016 | Reedy et al. | |
| 2016/0191040 A1 | 6/2016 | Brindle et al. | |
| 2017/0162692 A1 | 6/2017 | Brindle et al. | |
| 2017/0236946 A1 | 8/2017 | Stuber et al. | |

FOREIGN PATENT DOCUMENTS

| | | |
|---|---|---|
| DE | 112011103554 | 9/2013 |
| EP | 385641 | 9/1990 |
| EP | 0622901 | 11/1994 |
| EP | 782267 | 7/1997 |
| EP | 0788185 | 8/1997 |
| EP | 3851561 | 1/1998 |
| EP | 913939 | 5/1999 |
| EP | 625831 | 11/1999 |
| EP | 1006584 | 6/2000 |
| EP | WO03032431 | 4/2003 |
| EP | 1925030 | 5/2008 |
| EP | 2348532 A2 | 7/2011 |
| EP | 2348533 A2 | 7/2011 |
| EP | 2348534 A2 | 7/2011 |
| EP | 2348535 A2 | 7/2011 |
| EP | 2348536 A2 | 7/2011 |
| EP | 2387094 | 11/2011 |
| EP | 2568608 | 5/2014 |
| EP | 2760136 | 7/2014 |
| EP | 3113280 | 1/2017 |
| EP | 1902474 | 4/2017 |
| JP | 55-75348 | 6/1980 |
| JP | 1254014 | 10/1989 |
| JP | 02-161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | A-06-334506 | 12/1994 |
| JP | 7046109 | 2/1995 |
| JP | 07-700245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | A-08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 9163721 | 6/1997 |
| JP | 09163721 | 6/1997 |
| JP | 09-200021 | 7/1997 |
| JP | 9181641 | 7/1997 |
| JP | 9186501 | 7/1997 |
| JP | 9200074 | 7/1997 |
| JP | 9238059 | 9/1997 |
| JP | 9243738 | 9/1997 |
| JP | 09-008621 | 10/1997 |
| JP | 09-284114 | 10/1997 |
| JP | 9270659 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10242826 | 9/1998 |
| JP | A-10-242829 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 2001157487 | 5/2001 |
| JP | 2001156182 | 6/2001 |
| JP | 2001274265 | 10/2001 |
| JP | 2004515937 | 5/2002 |
| JP | 2000358775 | 6/2002 |
| JP | 2003060451 | 2/2003 |
| JP | 2003101407 | 4/2003 |
| JP | 2003143004 | 5/2003 |
| JP | 2003167615 | 6/2003 |
| JP | 2003189248 | 7/2003 |
| JP | 2003332583 | 11/2003 |
| JP | 2003-347553 | 12/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-251931 | 9/2005 |
| JP | 2006-332778 | 12/2006 |
| JP | 5215850 | 3/2013 |
| JP | 5417346 | 11/2013 |
| JP | 5591356 | 8/2014 |
| JP | 5678106 | 1/2015 |
| JP | 6006219 | 9/2016 |
| KR | 1994027615 | 12/1994 |
| NO | WO2012054642 | 4/2012 |
| WO | WO86/01037 | 2/1986 |
| WO | WO9523460 | 8/1995 |
| WO | WO9806174 | 2/1998 |
| WO | WO9935695 | 7/1999 |
| WO | WO0227920 | 4/2002 |
| WO | WO2007/008934 A1 | 1/2007 |
| WO | WO2007/035610 A2 | 3/2007 |
| WO | WO2007033045 A2 | 3/2007 |
| WO | 2007060210 | 5/2007 |
| WO | WO-2008/133621 | 11/2008 |
| WO | 2009/108391 | 9/2009 |
| WO | WO2012054642 | 4/2012 |

OTHER PUBLICATIONS

T.-S. Chao et al., "High-voltage and High-temperature Applications of DTMOS with Reverse Schottky Barrier on Substrate Contacts," IEEE Electron Device Letters, vol. 25, No. 2, Feb. 2004, pp. 86-88.

Sleight, et al., "Transient Measurements of SOI Body Contact Effectiveness", IEEE Electron Device Letters, vol. 19, No. 12, Dec. 1998.

Hirano, et al., "Impact of Actively Body-bias Controlled (ABC) SOI SRAM by using Direct Body Contact Technology for Low-Voltage Application" IEEE, 2003, pp. 2.41-2.44.

Orndorff, et al., "CMOS/SOS/LSI Switching Regulator Control Device", ISSCC 78, Feb. 17, 1978, IEEE International Solid-State Circuits Conference, pp. 234-235 and 282.

Stuber, Michael, et al., an Amendment dated Mar. 16, 2009 filed in the USPTO for U.S. Appl. No. 11/520,912, 21 pages.

A translation of an Office Action dated Jul. 31, 2009 for Chinese appln. No. 200680025128.7, 3 pages.

(56) References Cited

OTHER PUBLICATIONS

Stuber, Michael, et al., A Response that was filed in the UPSTO for U.S. Appl. No. 11/520,912, dated Sep. 8, 2009, 3 pgs.
Kuang, J.B., et al., "A Floating-Body Charge Monitoring Technique for Partially Depleted SOI Technology", Int. J. of Electronics, vol. 91, No. 11, Nov. 11, 2004, pp. 625-637.
Chinese Patent Office, a translation of a Chinese Office Action dated Nov. 2, 2011 for related appln. No. 200680025128.7, 12 pgs.
Juhl, Andreas, Decision to refuse a European patent application received from the EPO dated Nov. 18, 2011 for related appln. No. 06786943.8-1528, 4 pgs.
Tieu, Binh, Notice of Allowance received from the USPTO dated Jun. 2, 2006 for related U.S. Appl. No. 10/922,135, 5 pgs.
Tieu, Binh Kien, Notice of Allowance received from the USPTO for related U.S. Appl. No. 11/347,014, dated Apr. 29, 2010, 12 pgs.
Shingleton, Michael B., Office Action received from the USPTO dated Oct. 14, 2010 for related U.S. Appl. No. 11/881,816, 15 pgs.
Shifrin, Mitchell B., "Monolithic FET Structures for High-Power Control Component Applications", IEEE Transactions on Microwave Theory and Techniques, vol. 37, No. 12, Dec. 1989, pp. 2134-2141.
Van Der Peet, H., Communication pursuant to Article 94(3) EPC for related application No. 02800982.7-2220 dated Aug. 6, 2009, 2 pgs.
Tieu, Binh Kien, Notice of Allowance received from the USTPO dated Aug. 11, 2010 for related U.S. Appl. No. 12/315,395, 26 pgs.
Kelly, Dylan, Amendment tiled in the USPTO dated Jan. 20, 2010 for related U.S. Appl. No. 11/347,671, 18 pgs.
Mow, Charles Chiang, Office Action received from the USPTO dated Aug. 20, 2010 for related U.S. Appl. No. 11/347,671, 18 pgs.
Chow, Charles Chiang, Notice of Panel Decision from Pre-Appeal Brief Review dated Jul. 11, 2011 for related U.S. Appl. No. 11/347,671, 2 pgs.
Chow, Charles Chiang, Notice of Allowance dated Aug. 16, 2011 for related U.S. Appl. No. 11/347,671, 12 pgs.
Peregrine Semiconductor Corporation, Appeal to the Decision for Refusal filed in the EPO dated Mar. 20, 2012 for related appln No. 067869431, 27 pgs.
Peregrine Semiconductor Corporation, Response filed in the EPO dated May 16, 2011 for related appln No. 111532271, 5 pgs.
Peregrine Semiconductor Corporation, Response filed in the EPO dated May 16, 2011 for related appln No. 11153313.9, 8 pgs.
Peregrine Semiconductor Corporation, Translation of Response filed in the Chinese Patent Office on Mar. 20, 2012 for related appln. No. 200680025128.7, 12 pgs.
Kelly, Dylan, Comments on Examiner's Statement of Reasons for Allowance filed in the USPTO dated Nov. 16, 2011 for related U.S. Appl. No. 11/347,671, 4 pgs.
Herne, et al., U.S. Statutory Invention Registration No. H1435, published May 2, 1995.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Fuse, et al., "0.5V SOI CMOS Pass-Gate Logic", 1996 IEEE Int'l Solid-State Circuits Conference, Feb. 1996, pp. 38-89,424.
Shimomura, et al., "A 1-V 46-ns 16-mb SOI-DRAM with Body Control Technique", IEEE Journal of Solid-State Circuits, vol. 32, No. 11, Nov. 1997, pp. 1712-1720.
Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.
Cho, et al., "Comparative Assessment of Adaptive Body-Bias SOI Pass-Transistor Logic", Fourth Int'l Symposium on Quality Electronic Design, Mar. 2003, pp. 55-60.

Nakayama, et al., "A 1.9 GHz Single-Chip RF Front-End GaAs MMICS with Low-Distortion Cascade FET Mixer for Personal Handy-Phone System Terminals", IEEE, 1998, pp. 101-104.
Nakayama, et al., "A 1.9GHz Single-Chip RF Front End GaAs MMIC with Low-Distortion Cascade FET Mixer for Personal Handy-Phone System Terminals", Radio Frequency Integrated Circuits Symposium, 1998, pp. 205-208.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Valeri, et al., "A Silicon-on-Insulator Circuit for High Temperature, High-Voltage Applications", IEEE, 1991, pp. 60-61.
Tsutsumi, et al., "A Single Chip PHS Front End MMIC with a True Single +3 Voltage Supply", IEEE Radio Frequency Integrated Circuits Symposium, 1998, pp. 105-108.
Burgener, et al., Amendment tiled in the USPTO dated Apr. 2010 relating to U.S. Appl. No. 11/501,125.
Van Der Peet, Communications pursuant to Article 94(3) EPC dated Aug. 2009 relating to appln. No. 02800982.7-2220.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Marenk, et al., "Layout Optimization of Cascode RF SOI Transistors", IEEE International SOI Conference, 2001, pp. 105-106.
Iyama et al. "L-Band SPDT Switch Using Si-MOSFET", IEICE Trans. Electron, vol. E79-C, No. 5, May 1996, pp. 636-643.
Koudymov, et al., "Low Loss High Power RF Switching Using Multifinger AlGaN/GaN MOSHFETs", University of South Carolina Scholar Commons, 2002, pp. 449-451.
De La Houssaye, et al., "Microwave Performance of Optically Fabricated T-Gate Thin Film Silicon on Sapphire Based MOSFETs", IEEE Electron Device Letters, 1995, pp. 289-292.
Wang, et al., "Efficiency Improvement in Charge Pump Circuits", IEEE Journal of Solid-State Circuits, vol. 32, No. 6, Jun. 1997, pp. 852-860.
"RF Amplifier Design Using HFA3046, HFA3096, HFA3127, FIFA3128 Transistor Arrays", Intersil Corporation, 1996, pp. 1-4.
Botto, et al., "Series Connected Soft Switched IGBTs for High Power, High Voltage Drives Applications: Experimental Results", IEEE, 1997, pp. 3-7.
Ajjkuttira, et al., "A Fully Integrated CMOS RFIC for Bluetooth Applications", IEEE International Solid-State aircuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Niishijima, et al., "A High Performance Transceiver Hybrid IC for PHS Hand Set Operating with Single Positive Voltage Supply", Microwave Symposium Digest, 1997, pp. 1155-1158.
O, et al. "CMOS Components for 802.11b Wireless LAN Applications", IEEE Radio Frequency Integrated Circuits Symposium, 2002, pp. 103-106.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Kuo, et al., "Low-Voltage SOI CMOS VLSI Devices and Circuits", Wiley Interscience, XP001090589, New York, 2001, 215 pgs.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.

(56) References Cited

OTHER PUBLICATIONS

Pozar, "Microwave and RF Design of Wireless Systems", Wiley, 2001.
Maas, "The RF and Microwave Circuit Design Cookbook", Artech House, 1998.
Couch, "Digital and Analog Communication Systems", 2001, Prentice-Hall.
Couch, "Modern Communication Systems", Prentice-Hall, 1995.
Freeman, "Radio System Design for Telecommunications", Wiley, 1997.
Gibson, "The Communications Handbook", CRC Press, 1997.
Itoh, "RF Technologies for Low Power Wireless Communications", Wiley, 2001.
Schaper, "Communications, Computations, Control, and Signal Processing", Kluwer Academic, 1997.
Willert-Porada, "Advanced in Microwave and Radio Frequency Processing", Spring, 2001.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science+Business Media, 2000.
Brinkman, et al., Respondents' Notice of Prior Art, Investigation No. 337-TA-848, dated Aug. 31, 2012, 59 pgs.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999.
Stuber, et al., Supplemental Amendment filed in the USPTO dated Nov. 8, 2012 for related U.S. Appl. No. 13/028,144, 17 pgs.
Brindle, et al., Response and Terminal Disclaimer filed in the USPTO dated Dec. 26, 2012 for related U.S. Appl. No. 13/277,108, 18 pgs.
Nguyen, Tram Hoang, Office Action received from the USPTO dated Apr. 11, 2012 for U.S. Appl. No. 13/412,529, 6 pgs.
Bringle, et al., Amendment filed in the USPTO dated Oct. 11, 2012 for U.S. Appl. No. 13/412,529, 15 pgs.
Brindle, et al., Amendment and Terminal Disclaimers filed in the USPTO dated Dec. 19, 2012 for U.S. Appl. No. 13/412,529, 17 pgs.
Nguyen, Niki Hoang, Notice of Allowance received from the USPTO dated Jan. 17, 2013 for U.S. Appl. No. 13/412,529, 13 pgs.
Nguyen, Niki Hoang, Notice of Allowance received from the USPTO dated Feb. 8, 2013 for U.S. Appl. No. 13/412,529, 19 pgs.
Brindle, et al., Comments on Examiner's Statement of Reasons for Allowance filed in the USPTO dated Feb. 8, 2013 for U.S. Appl. No. 13/412,529, 4 pgs.
Peregrine Semiconductor Corporation, Response filed in the EPO dated May 16, 2011 for related appln No. 11153281.8, 7 pgs.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Fuse, et al., "A 0.5V 200MHz 1-Stage 32b ALU Using a Body Bias Controlled SOI Pass-Gate Logic", IEEE Int'l Solid-State Circuits Conference, Feb. 1997.
Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.
Lee, et al., "Analysis of Body Bias Effect with PD-SOI or Analog and RF Applications", Solid State Electron, vol. 46, 2002, pp. 1169-1176.
Aquilani, Communication and supplementary European Search Report dated Nov. 2009 relating to appln. No. 35763216.
Unterberger, M., Summons to attend oral proceedings pursuant to Rule 115(1) EPC received from EPO dated Oct. 17, 2013 for related appln. No. 02800982.7, 15 pgs.
Kelly, Proposed Amendment After Final from the USPTO dated Jun. 2009 relating to U.S. Appl. No. 11/351,342.
Hirano, et al., "Impact of Actively Body-Bias Controlled (ABC) SOI SRAM by Using Direct Body Contact Technology or Low-Voltage Applications", IEEE, 2003, pp. 2.4.1-2.4.4.
Brindle, et al., Response and Terminal Disclaimer filed in the USPTO dated Dec. 26, 2012 for related U.S. Appl. No. 13/277,108, 17 pgs.
Corneglio, Bernard, International Preliminary Report on Patentability received from the EPO dated Feb. 6, 2013 for related appln. No. PCT/US2011/056942, 27 pgs.
Nguyen, Niki Hoang, Office Action received from the USPTO dated Apr. 10, 2013 for related U.S. Appl. No. 13/277,108, 184 pgs.
Stuber, et al., Response/Amendment filed in the USPTO dated Jul. 15, 2013 for related U.S. Appl. No. 13/028,144, 20 pgs.
Brindle, et al., Amendment filed in the USPTO dated Jul. 18, 2013 for related U.S. Appl. No. 13/277,108, 33 pgs.
Stuber, et al., "Comments on Examiner's Statement of Reasons for Allowance" filed in the USPTO dated Sep. 27, 2013 for related U.S. Appl. No. 13/028,144, 4 pgs.
Nguyen, Niki Hoang, Final Office Action received from the USPTO dated Sep. 27, 2013 for related U.S. Appl. No. 13/277,108, 9 pgs.
Tieu, Binh Kien, Notice of Allowance received from the USPTO dated Sep. 30, 2013 for related U.S. Appl. No. 12/980,161, 8 pgs.
Shingleton, Michael, Final Office Action received from the USPTO dated Oct. 23, 2013 for related U.S. Appl. No. 11/881,816, 25 pgs.
Burgener, et al., First Preliminary Amendment filed in the USPTO dated Apr. 27, 2012 for related U.S. Appl. No. 12/980,161, 21 pgs.
Tieu, Binh Kien, Office Action received from the USPTO dated Feb. 19, 2013 for related U.S. Appl. No. 12/980,161, 97 pgs.
Peregrine Semiconductor Corporation, Response filed in the EPO dated Sep. 6, 2016 for appln. No. 16020116.6, 2 pgs.
Chiquero, S. Sanchez, Minutes of Oral Proceedings received from the EPO dated Oct. 10, 2016 for appln. No. 06786943.8, 35 pgs.
Chiquero, S. Sanchez, Datasheet for the Decision of Sep. 29, 2016 received from the EPO for appln. No. 0678943.8, 15 pgs.
Brinle, et al., Preliminary Amendment filed in the USPTO dated Feb. 23, 2017 for U.S. Appl. No. 15/354,723, 7 pgs.
Nguyen, Niki Hoang, Final Office Action received from the USPTO dated Mar. 8, 2017 for U.S. Appl. No. 14/845,154, 28 pgs.
Nguyen, Niki Hoang, Office Action received from the USPTO dated Mar. 24, 2017 for U.S. Appl. No. 15/354,723, 15 pgs.
Brindle, et al., Response filed in the USPTO dated Mar. 24, 2017 for U.S. Appl. No. 14/845,154, 3 pgs.
Stuber, et al., Comments on Examiner's Statement of Reasons for Allowance filed in the USPTO dated Dec. 8, 2014 for U.S. Appl. No. 13/028,144, 4 pgs.
Shingleton, Michael, Office Action received from the USPTO dated Apr. 10, 15 for U.S. Appl. No. 14/257,808, 8 pgs.
Unterberger, Michael, Communication under Rule 71(3) EOC dated Dec. 1, 2015 for appln. No. 10011669.8, 64 pgs.
Peregrine Semiconductor Corporation communication received from the EPO dated Dec. 3, 2015 for appln. No. 11153247.9, 2 pgs.
Iguyen, Niki Hoang, Office Action received from the USPTO dated Mar. 2, 2016 for U.S. Appl. No. 14/804,198, 5 pgs.
Peregrine Semiconductor Corporation, Reply to Summons to Attend Oral Proceedings filed in the EPO dated Apr. 15, 2016 for appln. No. 0678943.8, 26 pgs.
Nguyen, Niki Hoang, Notice of Allowance received from the USPTO dated Apr. 10, 2017 for U.S. Appl. No. 14/845,154, 8 pgs.

(56) References Cited

OTHER PUBLICATIONS

F. Hameau and O. Rozeau, "Radio-Frequency Circuits Integration Using CMOS SOI 0.25μm Technology", 2002 RF IC Design Workshop Europe, Mar. 19-22, 2002, Grenoble, France.
O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, Nov. 2000.
C. Tinella et al., "A High-Performance CMOS-SOI Antenna Switch for the 2.55-GHz Band, "IEEE Journal of Solid-State circuits, vol. 38, No. 7, Jul., 2003.
H. Lee et al., "Analysis of body bias effect with PD-SOI for analog and RF applications," Solid State Electron., vol. 46, pp. 1169-1176, 2002.
J.-H. Lee, et al., "Effect of Body Structure on Analog Performance of SOI NMOSFETs," Proceedings, 1998 IEEE International SOI Conference, Oct. 5-8, 1998, pp. 61-62.
C. F. Edwards, et al., The Effect of Body Contact Series Resistance on SOI CMOS Amplifier Stages, IEEE Transactions on Electron Devices, vol. 44, No. 12, Dec. 1997 pp. 2290-2294.
S. Maeda, et al., Substrate-bias Effect and Source-drain Breakdown Characteristics in Body-tied Short-channel SOI MOSFET's, IEEE Transactions on Electron Devices, vol. 46, No. 1, Jan. 1999 pp. 151-158.
F. Assaderaghi, et al., "Dynamic Threshold-voltage MOSFET (DTMOS) for Ultra-low Voltage VLSI," IEEE Transactions on Electron Devices, vol. 44, No. 3, Mar. 1997, pp. 414-422.
G. O. Workman and J. G. Fossum, "A Comparative Analysis of the Dynamic Behavior of BTG/SOI MOSFETs and Circuits with Distributed Body Resistance," IEEE Transactions on Electron Devices, vol. 45, No. 10, Oct. 1998 pp. 2138-2145.
T.-S. Chao, et al. "High-voltage and High-temperature Applications of DTMOS with Reverse Schottky Barrier on Substrate Contacts," IEEE Electron Device Letters, vol. 25, No. 2, Feb. 2004, pp. 86-88.
Wei, et al., "Measurement of Transient Effects in SOI DRAM/SRAM Access Transistors", IEEE Electron Device Letters, vol. 17, No. 5, May 1996.
Kuang, et al., "SRAM Bitline Circuits on PD SOI: Advantages and Concerns", IEEE Journal of Solid-State Circuits, vol. 32, No. 6, Jun. 1997.
Sleight, et al., "Transient Measurements of 501 Body Contact Effectiveness", IEEE Electron Device Letters, vol. 19, No. 12, Dec. 1998.
Chung, et al., "SOI MOSFET Structure with a Junction-Type Body Contact for Suppression of Pass Gate Leakage", IEEE Transactions on Electron Devices, vol. 48, No. 7, Jul. 2001.
Lee, et al., "Effects of Gate Structures on the RF Performance in PD SOI MOSFETs", IEEE Microwave and Wireless Components Letters, vol. 15, No. 4, Apr. 2005.
Hirano, et al., "Impact of Actively Body-bias Controlled (ABC) SOI SRAM by using Direct Body Contact Technology for Low-Voltage Application" IEEE, 2003, pp. 2.4.1-2.4.4.
Lee, et al., "Harmonic Distortion Due to Narrow Width Effects in Deep sub-micron SOI-CMOS Device for analog-RF Applications", 2002 IEEE International SOI Conference, Oct. 2002.
Orndorff, et al., "CMOS/SOS/LSI Switching Regulator Control Device", ISSCC 78, Feb. 17, 1978, IEEE International Solid-State Circuits Conference, pp. 234-235 and 282.
Kuo, et al., "Low-Voltage SOI CMOS VLSI Devices and Circuits", 2001, Wiley Interscience, New York, XP001090589, pp. 57-60 and 349-354.
Tat, Binh C., International Search Report and Written Opinion received from USRO dated Jul. 3, 2008 for application No. PCT/US06/36240, 10 pgs.
Tat, Binh C., Office Action received from USPTO dated Sep. 15, 2008 for U.S. Appl. No. 11/520,912, 18 pgs.
Shingleton, Michael B., Office Action dated Oct. 7, 2008 received from the USPTO for U.S. Appl. No. 11/881,816, 4 pgs.
Hoffmann, Niels, Communication from the EPO dated Feb. 4, 2009 for appln No. 06786943.8, 7 pgs.

Stuber, Michael, et al., photocopy of an Amendment dated Mar. 16, 2009 filed in the USPTO for U.S. Appl. No. 11/520,912, 21 pages.
Shingleton, Michael B., Communication received from USPTO dated Apr. 28, 2009 for U.S. Appl. No. 11/881,816, 3 pgs.
Tat, Binh C., Office Action received from USPTO dated Jul. 8, 2009 for U.S. Appl. No. 11/520,912, 6 pgs.
Dribinsky, et al, Response filed in USPTO dated Aug. 28, 2009 for U.S. Appl. No. 11/881,816, 5 pgs.
Photocopy of a translation of an Office Action dated Jul. 31, 2009 for Chinese appln. no. 200680025128.7, 3 pages.
Stuber, Michael, et al., Photocopy of a Response that was filed in the UPSTO for U.S. Appl. No. 11/520,912, dated Sep. 8, 2009, 3 pgs.
Tat, Binh C., Office Action received from the USPTO dated Dec. 10, 2009 for U.S. Appl. No. 11/520,912, 19 pages.
Shingleton, Michael B., Office Action received from the USPTO dated Jan. 19, 2010 for U.S. Appl. No. 11/881,816, 16 pgs.
Brindle, Chris, et al., Translation of a Response filed in the Chinese Patent Office for appln No. 200680025128.7 dated Nov. 30, 2009, 3 pages.
Morena, Enrico, Supplementary European Search Report for appln. No. 06814836.0, dated Feb. 17, 2010, 8 pages.
Kuang, J. B., et al., "A Floating-Body Charge Monitoring Technique for Partially Depleted SOI Technology", Int. J. Of Electronics, vol. 91, No. 11, Nov. 11, 2004, pp. 625-637.
Stuber, et al., Amendment filed in the USPTO for U.S. Appl. No. 11/520,912, dated Jun. 10, 2010, 25 pages.
Sedra, Adel A., et al., "Microelectronic Circuits", Fourth Edition, University of Toronto, Oxford University Press, 1982, 1987, 1991 and 1998, pp. 374-375.
Tat, Binh C., Notice of Allowance received from the USPTO for U.S. Appl. No. 11/520,912, dated Sep. 16, 2010, 13 pages.
Brindle, et al., Response filed in the EPO for application No. 06 814 836.0-1235 dated Oct. 12, 2010, 24 pages.
Nguyen, Tram Hoang, Office Action received from the USPTO dated Sep. 19, 2008 for U.S. Appl. No. 11/484,370, 7 pgs.
Brindle, et al., Response filed in the USPTO dated Jan. 20, 2009 for U.S. Appl. No. 11/484,370, 5 pgs.
Nguyen, Tram Hoang, Office Action received from the USPTO dated Apr. 23, 2009 for U.S. Appl. No. 11/484,370, 11 pgs.
Brindle, et al., Response filed in the USPTO dated Aug. 24, 2009 for U.S. Appl. No. 11/484,370, 5 pgs.
Nguyen, Tram Hoang, Office Action received from the USPTO dated Jan. 6, 2010 for U.S. Appl. No. 11/484,370, 46 pgs.
Brindle, et al., Amendment filed in the USPTO dated Jul. 6, 2010 for U.S. Appl. No. 11/484,370, 23 pgs.
Bolam, et al., "Reliability Issues for Silicon-on-Insulator", 2000 IEEE, IBM Microelectronics Division, pp. 6.4.1-6.4.4, 4 pgs.
Hu, et al., "A Unified Gate Oxide Reliability Model", IEEE 99CH36296, 37th Annual International Reliability Physics Symposium, San Diego, CA 1999, pp. 47-51.
Tieu, Binh-Kien, Notice of Allowance received from the USPTO for related U.S. Appl. No. 11/347,014, dated Apr. 29, 2010, 12 pgs.
Shingleton, Michael B., Office Action received from the USPTO dated Oct. 14, 2010 for related Appl. No. 11/881,816, 15 pgs.
Dribinsky, et al., Response filed in the USPTO dated Jan. 14, 2011 for related U.S. Appl. No. 11/881,816, 19 pgs.
Shifrin, Mitchell B., "Monolithic Fet Structures for High-Power Control Component Applications", IEEE Transactions on Microwave Theory and Techniques, vol. 37, No. 12, Dec., 1989, pp. 2134-2141.
Miyajima, Ikumi, Notice of Reasons for Refusal received from the JPO dated Oct. 5, 2006 for related appln. No. 2003-535287, 4 pgs.
Tieu, Binh Kien, Office Action received from the USPTO dated Nov. 15, 2007 for related U.S. Appl. No. 11/582,206, 9 pgs.
Dinh, Le T., International Search Report received from the USRO dated Mar. 28, 2003 for related appln No. PCT/US02/32266, 2 pgs.
Burgener, et al., Amendment filed in the USPTO dated May 15, 2008 for related U.S. Appl. No. 11/582,206, 14 pgs.
Tieu, Binh Kien, Notice of Allowance received in the USPTO dated Jul. 15, 2008 for related U.S. Appl. No. 11/582,206, 7 pgs.
Van der Peet, H., Communication Pursuant to Article 94(3) EPC received from the EPO in related appln. No. 02800982.7-2220, dated Jun. 19, 2008, 3 pgs.

(56) References Cited

OTHER PUBLICATIONS

Caverly, Robert H., "A Silicon CMOS Monolithic RF and Microwave Switching Element", 1997 European Microwave conference, Jerusalem, Sep. 1987, 4 pgs.
Van Der Peet, H., Communication pursuant to Article 94(3) EPC for related application No. 02800982.7-2220 dated Mar. 6, 2009, 2 pgs.
Tieu, Binh Kien, Office Action received from the USPTO dated Sep. 16, 2009 for related U.S. Appl. No. 11/347,014, 26 pgs.
Shingleton, Michael B, Notice of Allowance received from the USPTO for related U.S. Appl. No. 11/881,816, dated Oct. 12, 2011, 5 pgs.
Tieu, Binh Kien, Notice of Allowance received from the USPTO dated Aug. 11, 2010 for related U.S. Appl. No. 12/315,395, 26 pgs.
Kelly, et al., Comments on Examiner's Statement of Reasons for Allowance filed in the USPTO dated Jul. 29, 2010 for related U.S. Appl. No. 11/347,014, 2 pgs.
Chow, Charles Chiang, Office Action received from the USPTO dated Aug. 19, 2008 for related U.S. Appl. No. 11/347,671, 14 pgs.
Kelly, Dylan, Amendment filed in the USPTO dated Dec. 19, 2008 for related U.S. Appl. No. 11/347,671, 12 pgs.
Chow, Charles Chiang, Office Action received from the USPTO dated Apr. 16, 2009 for related U.S. Appl. No. 11/347,671, 16 pgs.
Kelly, Dylan, Response filed in the USPTO dated Jun. 16, 2009 for related U.S. Appl. No. 11/347,671, 14 pgs.
Chow, Charles Chiang, Office Action received from the USPTO dated Jul. 20, 2009 for related U.S. Appl. No. 11/347,671, 17 pgs.
Kelly, Dylan, Amendment filed in the USPTO dated Jan. 20, 2010 for related U.S. Appl. No. 11/347,671, 18 pgs.
Chow, Charles Chiang, Office Action received from the USPTO dated Apr. 28, 2010 for related U.S. Appl. No. 11/347,671, 20 pgs.
Kelly, Dylan, Amendment filed in the USPTO dated Jul. 28, 2010 for related U.S. Appl. No. 11/347,671, 6 pgs.
Chow, Charles Chiang, Office Action received from the USPTO dated Aug. 20, 2010 for related U.S. Appl. No. 11/347,671, 18 pgs.
Kelly, Dylan, Amendment filed in the USPTO dated Dec. 20, 2010 for related U.S. Appl. No. 11/347,671, 12 pgs.
Chow, Charles Chiang, Office Action received from the USPTO dated Mar. 2, 2011 for related U.S. Appl. No. 11/347,671, 15 pgs.
Kelly, Dylan, Amendment filed in the USPTO dated May 2, 2011 for related U.S. Appl. No. 11/347,671, 6 pgs.
Chow, Charles Chiang, Advisory Action received from the USPTO dated May 12, 2011 for related U.S. Appl. No. 11/347,671, 3 pgs.
Kelly, Dylan, Notice of Appeal filed in the USPTO dated Jun. 2, 2011 for related U.S. Appl. No. 11/347,671, 6 pgs.
Chow, Charles Chiang, Notice of Panel Decision from Pre-Appeal Brief Review dated Jul. 22, 2011 for related U.S. Appl. No. 11/347,671, 2 pgs.
Kelly, Dylan, Supplemental Amendment filed in the USPTO dated Aug. 9, 2011 for related U.S. Appl. No. 11/347,671, 3 pgs.
Charles Chiang, Notice of Allowance dated Aug. 16, 2011 for related U.S. Appl. No. 11/347,671, 12 pgs.
Nguyen, Tram Hoang, Notice of Allowance received from the USPTO dated Nov. 17, 2011, 41 pgs.
Hoffmann, Niels, International Search Report received from the EPO dated Feb. 27, 2012, 12 pgs.
Iijima, M, et al., "Boosted Voltage Scheme with Active Body-Biasing Control on PD-SOI for Ultra Low Voltage Operation", IEICE Transactions on Electronics, Institute of Electronics, vol. E90C, No. 4, Apr. 1, 2007, pp. 666-674.
Peregrine Semiconductor Corporation, Response filed in the EPO dated Jan. 17, 2012 for related appln. No. 06786943.8, 1 pg.
Peregrine Semiconductor Corporation, Appeal to the Decision for Refusal filed in the EPO dated Mar. 20, 2012 or related appln No. 06786943.1, 27 pgs.
Peregrine Semiconductor Corporation, Response filed in the EPO dated May 16, 2011 for related appln No. 11153227.1, 5 pgs.
Hoffman, Niels, Extended Search Report received from the EPO dated May 4, 2012 for related appln No. 11153227.1, 4 pgs.
Peregrine Semiconductor Corporation, Response filed in the EPO dated May 16, 2011 for related appln No. 11153247.9, 6 pgs.

Hoffman, Niels, Extended Search Report received from the EPO dated May 7, 2012 for related appln. No. 111153247.9, 4 pgs.
Peregrine Semiconductor Corporation, Response filed in the EPO dated May 16, 2011 for related appln No. 11153241.2, 5 pgs.
Hoffman, Niels, Extended Search Report received from the EPO dated May 7, 2012 for related appln. No. 11153241.2, 4 pgs.
Hoffman, Niels, Extended Search Report received from the EPO dated May 8, 2012 for related appln. No. 11153281.8, 4 pgs.
Peregrine Semiconductor Corporation, Response filed in the EPO dated May 16, 2011 for related appln No. 1153313.9, 8 pgs.
Brindle, et al., Response filed in the USPTO dated Oct. 28, 2016 for U.S. Appl. No. 14/845,154, 9 pgs.
Chiquero, S. Sanchez, Datasheet for the Decision of Sep. 29, 2016 received from the EPO for appln. No. 678943.8, 15 pgs.
Peregrine Semiconductor Corporation, Response filed in the EPO dated Sep. 16, 2016 for appln. No. 16020116.6, 2 pgs.
Nguyen, Niki Hoang, Notice of Allowance received from the USPTO dated Sep. 23, 2016 for U.S. Appl. No. 14/804,198, 21 pgs.
Tieu, Binh Hien, Office Action received from the USPTO dated Oct. 4, 2016 for U.S. Appl. No. 14/883,499, 23 pgs.
Chiquero, S. Sanchez, Minutes of Oral Proceedings received from the EPO dated Oct. 10, 2016 for appln. No. 36786943.8, 35 pgs.
Brindle, et al., Response filed in the USPTO dated Apr. 17, 2017 for U.S. Appl. No. 15/354,723, 9 pgs.
Yamamoto, et al., "A Single-Chip GaAs RF Transceiver for 1.9GHz Digital Mobile Communication Systems", IEEE Journal of Solid-State Circuits, 1996.
Kelly, "Integrated Ultra CMIS Designs in GSM Front End", Wireless Design Magazine, 2004, pp. 18-22.
Tsutsumi, et al., "A Single Chip PHS Front End MMIC with a True Single 'Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Szedon, et al., "Advanced Silicon Technology for Microwave Circuits", Naval Research Laboratory, 1994, pp. 1-110.
Kai, An English translation of an Office Action received from the Japanese Patent Office dated Jul. 2010 relating to Appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"CMOS SOI RF Switch Family", Honeywell, 2002, pp. 1-4.
"CMOS SOI Technology", Honeywell, 2001, pp. 1-7.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 32800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.

(56) References Cited

OTHER PUBLICATIONS

Baker, et al., "Designing Nanosecond High Voltage Pulse Generators Using Power MOSFET's", Electronic Letters, 1994, pp. 1634-1635.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power Dpdt Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct., 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.

Bonkowski, et al., "Integraton of Triple Band GSM Antenna Switch Module Using SOI CMOS", IEEE Radio Frequency Integrated Circuits Symposium, 2004, pp. 511-514.
Marenk, et al., "Layout Optimization of Cascade RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multitinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
De La Houssaye, et al., "Microwave Performance of Optically Fabricated T-Gate Thin Film Silicon on Sapphire Based MOSFET's", IEEE Electron Device Letters, 1995, pp. 289-292.
Shifrin, et al., "Monolithic FET Structure for HighPower Control Component Applications", IEEE Transactions on Microwave Theory and Techniques, 1989, pp. 2134-2142.
McGrath, et al., "Multi Gate Fet Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon Fet-Based RF and Microwave Switches", IEEE, 1998, pp. 1-4.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
McGRATH, et al., "Novel High Performance SPDT Power Switches Using Multi-Gate FET's", IEEE, 1991, pp. 839-842.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
"Radiation Hardened CMOS Dual DPST Analog Switch", Intersil, 1999, pp. 1-2.
Newman, "Radiation Hardened Power Electronics", Intersil Corporation, 1999, pp. 1-4.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.

(56) References Cited

OTHER PUBLICATIONS

Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Nang, et al., "Efficiency Improvement in Charge Pump Circuits", IEEE Journal of Solid-State Circuits, vol. 32, No. 6, Jun. 1997, pp. 852-860.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Sotto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "Soi CMOS with High Performance Passive Components for Analog, RF and Mixed Signal Designs", IEEE International SOI Conference, 1998, pp. 99-100.
Fukuda, et al., "SOI CMOS Device Technology", Special Edition on 21st Century Solutions, 2001, pp. 54-57.
Kusunoki, et al., "SPDT Switch MMIC Using E/D Mode GaAs JFETs for Personal Communications", IEEE GaAs IC Symposium, 1992, pp. 135-138.
Anaren, "Application notes: Cased/caseless Hybrid Couplers", Jan. 2007, 6 pgs.
Chen, et al., "Performance Evaluation of Mobile WiMAX Beam Forming Network Implemented by RF Digital Step Attenuators", published in the Wireless Conference, 2008. EW 208, 14th European, 6 pgs.
Guo, et al., "Wideband Circularly Polarized Patch Antenna Using Broadband Baluns", published in the IEEE Transactions on Antennas and Propagation, vol. 56, No. 2, Feb. 2008.
Thakur, Amarjeetsingh, "Balanced Amplifiers", published on www.scribd.com on Oct. 27, 2014.
Anaren, "Hybrid Coupler 3 dB, 90 degrees", Model XC2100A-03, Oct. 2010, 24 pgs.
Doherty, W.H., "A New High-Efficiency Power Amplifier for Modulated Wave", presented before the Annual Convention of the Institute of Radio Engineers, May 11-13, 1936, at Cleveland, Ohio.
Willkinson, Ernest J. "An N-Way Hybrid Power Divider", published in the Jan. 1960 edition of the IRE Transactions on Microwave Theory and Techniques.
Bois, et al., "A Wide Band GaAs MMIC Delay Line Phase Shifter with On-Chip Drivers", presented at the 1992 Asia-Pacific Microwave Conference, Adelaide.
Willms, et al., "A Wideband Gaas 6-Bit True-Time Delay MMIC Employing On-Chip Digital Drivers", published in the Microwave Conference, 2000. 30th European.
Peregrine Semiconductor Corporation, Product Concept PE46120 Doherty Amplifier Control Circuit 1.8 to 2.2 GHz, Product Concept PC/0146-03, 2012-2013, 5 pgs.
Caverly, et al., "Spice Modeling of Microwave and RF Control Diodes", IEEE, 2000, pp. 28-31.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Karandikar, et al., "Technology Mapping for SOI Domino Logic Incorporating Solutions for the Parasitic Bipolar Effect", ACM, 2001, pp. 1-14.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Nave Monolithic Circuits Symposium, 1994, pp. 15-18.
Caverly, et al., "CMOS RF Circuits for Integrated Wireless Systems", IEEE, 1998, pp. 1-4.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSEETs on SOI: An Experimental Comparison with Bulk Si MOSFETs", IEEE Radio Frequency Integrated Circuits Symposium, 2001, pp. 43-46.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band Sos Resistive Gate Insulator Semiconductor (RIS) Switch", IEEE Transactions on Electron Device, 1980, pp. 442-448.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishima, et al., "A High Performance Transceiver Hybrid IC for PHS Hand Set Operating with Single Positive Voltage Supply", Microwave Symposium Digest, 1997, pp. 1155-1158.
O, et al., "Cmos Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.

(56) References Cited

OTHER PUBLICATIONS

Uda, et al., "A High Performance and Miniturized Dual Use (antenna/local) GaAs SPDT Switch IC Operating at +3V/0v", Microwave Symposium Digest, 1996, pp. 141-144.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Drozdovsky, et al., "Large Signal Modeling of Microwave Gallium Nitride Based HFETs", Asia Pacific Microwave conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Nguyen, Tram Hoang, Notice of Allowance received from the USPTO dated Nov. 12, 2010 for U.S. Appl. No. 11/484,370, 21 pgs.
Suehle, et al., "Low Electric Field Breakdown of Thin SiO2 Films Under Static and Dynamic Stress", IEEE Transactions on Electron Devices, vol. 44, No. 5, May 1997.
Hoffmann, N., Summons to Attend Oral Proceedings pursuant to Rule 115(1) EPC received from the EPO dated Jul. 22, 2011 for related appln. No. 06786943.8, 8 pgs.
Shingleton, Michael B., Advisory Action received from the USPTO dated Mar. 18, 2011 for related U.S. Appl. No. 11/881,816, 3 pgs.
Shingleton, Michael B., Interview Summary received from the USPTO dated Apr. 18, 2011 for related U.S. Appl. No. 11/881,816, 3 pgs.
Nguyen, Tram Hoang, Examiner Amendment received from the USPTO dated Nov. 1, 2010 for related U.S. Appl. No. 11/484,370, 7 pgs.
Peregrine Semiconductor Corporation, Reply filed in the EPO dated Oct. 24, 2011 for related appln. No. 06786943.8, 1 pg.
Chinese Patent Office, copy of a translation of a Chinese Office Action dated Nov. 2, 2011 for related appln. No. 200680025128.7, 12 pgs.
Juhl, Andreas, Decision to refuse a European patent application received from the EPO dated Nov. 18, 2011 for related appln. No. 06786943.8. 1528, 4 pgs.
Tat, Binh C., Office Action received from the USPTO dated Jan. 18, 2012 for related U.S. Appl. No. 13/028,144, 33 pgs.
Peregrine Semiconductor Corporation, Response to Communication filed in the EPO dated Aug. 12, 2009 for related application No. 06786943,8, 31 pgs.
Iperione, Analia, International Search Report and Written Opinion received from the EPO dated Nov. 7, 2006 for related appln. No. PCT/US2006/026965, 19 pgs.
Geier, Adolf, International Preliminary Report on Patentability received from the EPo dated Jun. 21, 2007 for related appln. No. PCT/US2006/026965, 12 pgs.

Stuber, et al., Proposed Amended Claims for Examiner's Consideration filed in the USPTO dated Aug. 27, 2010 for related U.S. Appl. No. 11/520,912, 11 pgs.
Stuber, et al., Comments on Examiner's Statement of Reasons for Allowance filed in the USPTO dated Dec. 15, 2010 for related U.S. Appl. No. 11/520,912, 5 pgs.
Huang, "A 0.5 um Cmos T/R Switch for 900-MHz Wireless Applications"; IEEE Journal of Solid-State Circuits, vol. 36, No. 3, Mar. 2001, pp. 486-492.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.
Tieu, Binh, Office Action received from the USPTO dated Jun. 3, 2005 for related U.S. Appl. No. 10/922,135, 8 pgs.
Rodgers, et al., "Silicon UTSi COMS RFIC for CDMA Wireless Communications Systems", Peregrine Semiconductor Corporation, 1999 IEEE MTT-S Digest, p. 485-488.
Megahed, et al., "Low Cost UTSI Technology for RF Wireless Applications", Peregrine Semiconductor Corporation, 1998 IEEE MTT-S Digest p. 981-984.
Burgener, et al., Amendment filed in the USPTO dated Dec. 5, 2005 for related U.S. Appl. No. 10/922,135, 7 pgs.
Burgener, CMOS SOS Switched Offer Useful Features, High Integration, CMOS SOS Switches, Microwaves & RF, Aug. 2001, p. 107-118.
Johnson, et al., "Advanced Thin-Film Silicon-on-Sapphire Technology: Microwave Circuit Applications", IEEE Transactions on Electron Devices, vol. 45, No. 5, May 1998, pp. 1047-1054.
Miyajima, Notice of Reasons for Refusal received from the Japanese Patent Office for appln. No. 2003-535287 dated Feb. 13, 2006, 3 pgs.
Tieu, Binh, Office Action received from USPTO dated Jan. 17, 2006 for related U.S. Appl. No. 10/922,135, 8 pgs.
Burgener, Response filed in the UPSTO including Terminal Disclaimer dated May 16, 2006 for U.S. Appl. No. 10/922,135, 3 pgs.
Tieu, Binh, Notice of Allowance received from the USPTO dated Jun. 2, 2006 for related appln. No. 10/922,135, 5 pgs.
Tieu, Binh, Notice of Allowance received from the USPTO dated May 12, 2004 for related U.S. Appl. No. 10/267,531, 7 pgs.
Burgener, et al., Comments on Examiner's Statement of Reasons for Allowance dated Aug. 12, 2004 for related U.S. Appl. No. 10/267,531, 2 pgs.
Dribinsky, et al., Response filed in the USPTO dated Jan. 7, 2009 for related U.S. Appl. No. 11/881,816, 7 pgs.
Weman, Eva, Communication under Rule 71(3) EPC and Annex Form 2004 received from the European Patent Office for related appln. No. 02800982.7 dated Nov. 27, 2009, 68 pgs.
Kelly, Dylan, et al., Response and Terminal Disclaimers filed in the USPTO for related U.S. Appl. No. 11/347,014, dated Mar. 16, 2010, 10 pgs.
Dribinsky, et al., Response filed in the USPTO for related U.S. Appl. No. 11/881,816, dated Jul. 19, 2010, 22 pgs.
Hoffman, Niels, Extended Search Report received from the EPO dated May 8, 2012 for related appln. No. 11153313.9, 4 pgs.
Peregrine Semiconductor Corporation, Translation of Response filed in the Chinese Patent Office on Feb. 29, 2012 for related appln. No. 200680025128.7, 1 pg.
Peregrine Semiconductor Corporation, Translation of Response filed in the Chinese Patent Office on May 20, 2012 for related appln. No. 200680025128.7, 12 pgs.
Shingleton, Michael B., Notice of Allowance received from the USPTO dated Jun. 4, 2012 for related U.S. Appl. No. 11/881,816, 13 pgs.
Stuber, et al., Response filed in the USPTO dated Feb. 21, 2012 for related U.S. Appl. No. 13/028,144, 3 pgs.
Tat, Binh C., Office Action received from the USPTO dated Apr. 12, 2012 for related U.S. Appl. No. 13/028,144, 19 pgs.

(56) References Cited

OTHER PUBLICATIONS

Unterberger, Michael, extended European Search Report received from the EPO dated Sep. 30, 2011 for related appln. No. 10011669.8-2220, 9 pgs.
Weman, Eva, Communication of a Notice of Opposition received from the EPO dated Nov. 8, 2011 for related appln. No. 028000982.7, 33 pgs.
Kelly, Dylan, Amendment filed in the USPTO dated Dec. 20, 2012 for related U.S. Appl. No. 11/347,671, 10 pgs.
Kelly, Dylan, Comments on Examinees Statement of Reasons for Allowance filed in the USPTO dated Nov. 16, 2011 for related U.S. Appl. No. 11/347,671, 4 pgs.
Peregrine Semiconductor Corporation, Response filed in EPO dated May 15, 2012 for related appln. No. 10011669.8, 19 pgs.
Nishide, Ryuji, Office Action received from the Japanese Patent Office dated Jul. 17, 2012 for related appln. No. 2008-521544, 4 pgs.
Stuber, et al., Response filed in the USPTO dated Aug. 3, 2012 for related U.S. Appl. No. 13/028,144, 6 pgs.
Peregrine Semiconductor Corporation, Demand filed in the EPO dated Aug. 17, 2012 for related appln. No. PCT/US2011/056942, 41 pgs.
Nguyen, Niki Hoang, Office Action received from the USPTO dated Sep. 26, 2012 for related U.S. Appl. No. 13/277,108, 47 pgs.
Cherne, et al., U.S. Statutory Invention Registration No. H1435, published May 2, 1995.
Matloubian, "Smart Body Contact for SOI MOSFETs", 1989 IEEE SOS/SOI Technology Conference, Oct. 1999, pp. 128-129.
Chuang, et al., "SOI for Digital CMOS VLSI Design: Design Consideration and Advances", Proceedings of the IEEE, vol. 86, No. 4, Apr. 1998, pp. 689-720.
Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-858.
Casu, et al., "Synthesis of Low-Leakage PD-SOI Circuits with Body Biasing", Int'l Symposium on Low Power Electronics and Design, Aug. 2001, pp. 287-290.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State circuits Conference, Feb. 1997.
Assaderaghi, et al, "Transient Pass-Transistor Leakage Current in SOI MOSFET's", IEEE Electron Device Letters, vol. 18, No. 6, Jun. 1997, pp. 241-243.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies or Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", 1996 IEEE Intl Solid-State Circuits Conference, Feb. 1996, pp. 88-89,424.
Chen, et al., "Low Power, Multi-Gigabit DRAM Cell Design Issues Using SOI Technologies", http://bwrc.eecs.berkeley.edu/people/grad_students/chenff/reports, May 1999.

Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.
Wei, "Measurement and Modeling of Transient Effects in Partially Depleted SOI MOSFETs", M.S. Thesis, MIT, Jul. 1996.
Shoucair, "Modeling, Decoupling and Supression of MOSFET Distortion Components", IEEE Proceeding Circuit Devices Systems, vol. 146, No. 1, Feb. 1999.
Shahidi, et al., "Partially Depleted SOI Technology for Digital Logic", IEEE Int'l Solid-State Circuits Conference, 1999, pp. 426-427.
Giffard, et al., "Dynamic Effects in SOI MOSFET's", IEEE 1991, pp. 160-161.
Numata, et al., "A +2.4/0 V Controlled High Power GaAs SPDT Antenna Switch IC for GSM Application", IEEE Radio Frequency Integrated Circuits Symposium, 2002, pp. 141-144.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs Mmic with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-urn CMOS Process", IEEE custom Integrated Circuits Conference, 2000, pp. 341-344.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.

(56) References Cited

OTHER PUBLICATIONS

Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 50-61.
Hoffmann, et al., Communication under Rule 71(3) EPC received from the EPO dated Dec. 1, 2016 for appln. No. 06786943.8, 3 pgs.
Unterberger, Michael, Extended Search Report received from the EPO dated Dec. 6, 2016 for appln. No. 16020116.6, 10 pgs.
Nguyen, Niki Hoang, Notice of Allowance received from the USPTO dated Dec. 7, 2016 for U.S. Appl. No. 14/804,198, 12 pgs.
Douseki, et al., "A 0.5-V MTCMOS/SIMOX Logic Gate", IEEE Journal of Solid-State Circuits, vol. 32, No. 10, Oct. 1997.
Douseki, et al., "A 0.5v SIMOX-MTMCOS Circuit with 200ps Logic Gate", IEEE Int'l Solid-State Circuits Conference, 1996, pp. 84-85, 423.
Shimomura, et al., "A 1-V 46-ns. 16-mb SOI-DRAM with Body Control Technique", IEEE Journal of Solid-State circuits, vol. 32, No. 11, Nov. 1997, pp. 1712-1720.
Keys, "Low Distortion Mixers or RF Communications", Ph.D. Thesis, University of California-Berkeley, 1995.
Kuang, et al., "A Dynamic Body Discharge Technique for SOI Circuit Applications", IEEE Int'l SOI Conference, Oct. 1999, pp. 77-78.
Assaderaghi, et al., "A Dynamic Threshold Voltage MOSFET (DTMOS) for Ultra-Low Voltage Operation", Int'l Electron Devices Meeting, Dec. 1994, pp. 809-812.
Gil, et al., "A High Speed and Low Power SOI Inverter Using Active Body-Bias", Proceedings Int'l Symposium on Low Power Electronics and Design, Aug. 1998, pp. 59-63.
Gil, et al., "A High Speed and Low Power SOI Inverter Using Active Body-Bias", Solid-State Electronics, vol. 43, 1999, pp. 791-799.

Kuang, et al., "A High-Performance Body-Charge-Modulated Soi Sense Amplifier", IEEE Int'l SOI Conference, Oct. 2000, pp. 100-101.
Chung, et al., "A New SOI Inverter for Low Power Applications", IEEE SOI Conference, Oct. 1996, pp. 20-21.
Chung, et al., "A New SOI Inverter Using Dynamic Threshold for Low-Power Applications", IEEE Electron Device Letters, vol. 18, No. 6, Jun. 1997, pp. 248-250.
Chung, et al., "A New SOI MOSFET Structure with Junction Type Body Contact", Int'l Electron Device Meeting (IEDM) Technical Digest, 1999, pp. 59-62.
Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.
Wang, et all., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.
Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.
Nakatani, "A Wide Dynamic Range Switched-LNA in SiGe BICMOS", IEEE Radio Frequency Integrated Circuits Symposium, 2001, pp. 223-226.
Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pp. All.
Tseng, et al., "AC Floating-Body Effects in Submicron Fully Depleted (FD) SOInMOSFET's and the Impact on Analog Applications", IEEE Electron Devices, vol. 19, No. 9, Sep. 1998, pp. 351-353.
Wada, et al., "Active Body-Bias SOI-CMOS Driver Circuits", Symposium on VLSI Circuits Digest of Technical Papers, 1997, pp. 29-30.
Saccamango, et al., "An SOI Floating Body Charge Monitor Technique", IEEE Int'l SOI Conference, Oct. 2000, pp. 88-89.
Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.
Gautier, et al., "Body Charge Related Transient Effects in Floating Body SOI NMOSFETs", IEDM Tech. Digest, 1995, pp. 623-626.
Koh, et al., "Body-Contracted SOI MOSFET Structure and its Application to DRAM", IEEE Transactions on Electron Devices, vol. 45, No. 5, May 1998, pp. 1063-1070.
Koh, et al., "Body-Contacted SOI MOSFET Structure with Fully Bulk CMOS Compatible Layout and Process", IEEE Electron Device Letters, vol. 18, No. 3, Mar. 1997, pp. 102-104.
Tseng, et al., "Characterization of Floating Body and Body-Grounded Thin Film Silicon-on-Insulator MOSFETs for Analog Circuit Applications", Ph.D. Thesis, UCLA, 1999, pp. All.
Madihian, et al., "CMOS RF ICs for 900MHz-2.4GHz Band Wireless Communication Networks", IEEE Radio Frequency Integrated Circuits Symposium, 1999, pp. 13-16.
Eschenbach, Communication from the EPO dated Feb. 4, 2009 for related appln. No. 06786943.8, 101 pgs.
Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.

(56) References Cited

OTHER PUBLICATIONS

Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Duality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.
Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Krishnan, "Efficacy of Body Ties Under Dynamic Switching Conditions in Partially Depleted SOI CMOS Technology", Proceedings IEEE Int'l SOI Conference, Oct. 1997, pp. 140-141.
Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Damiano, et al., "Integrated Dynamic Body Contact for H Gate PD SOI MOSFETs for High Performance/Low Power", IEEE SOI Conference, Oct. 2004, pp. 115-116.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.
Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.
Morena, Enrico, Communication pursuant to Article 94(3) EPC received from the EPO dated Dec. 18, 2013 for related appln. No. 06814836.0, 5 pgs.
Stuber, et al., Amendment filed in the USPTO dated Dec. 20, 2013 for related U.S. Appl. No. 13/028,144, 25 pgs.
Brindle, et al., Amendment After Final filed in the USPTO dated Dec. 27, 2013 for related U.S. Appl. No. 13/277,108, 8 pgs.
Peregrine Semiconductor Corporation, Response filed in the EPO dated Jan. 9, 2014 for related appln. No. 02800982.7, 21 pgs.
Nguyen, Niki Hoang, Notice of Allowance received from the USPTO dated Jan. 10, 2014 for related U.S. Appl. No. 13/277,108, 24 pgs.
European Patent Office, Brief Communication dated Jan. 16, 2014 regarding Oral Proceedings to be held Feb. 12, 2014, letter from opponent dated Jan. 10, 2014, for related appln. No. 02800982.7, 7 pgs.

Scheinberg, et al., "A Computer Simulation Model for Simulating Distortion in FET Resistors", IEEE Transactions on Computer-Aided Design of Integrated Circuits and Systems, vol. 19, No. 9, Sep. 2000, pp. 981-989.
Streetman, et al., "Solid State Electronic Devices", Microelectronics Research Center, Dept. of Electrical and Computer Engineering, The University of Texas at Austin, Chapter 6, 2004 by Pearson Education Inc., 4 pgs.
Tokumitsu, et al, "A Low-Voltage, High-Power T/R-Switch MMIC Using LC Resonators", IEEE Transactions on Microwave Theory and Techniques, vol. 43, No. 5, May 1995, pp. 997-1003.
Adan, et al., "Off-State Leakage Current Mechanisms in BulkSi and SOI MOSFETs and Their Impact on CMOS ULSIs Standby Current"IEEE Transactions on Electron Devices, vol. 48, No. 9, Sep. 2001, pp. 2050-2057.
Chan, et al., "A Novel SOI CBiCMOS Compatible Device Structure for Analog and Mixed-Mode Circuits", Dept. of EECS, University of California at Berkeley, IEEE 1995, pp. 40-43.
Street, A.M., "RF Switch Design", The Institution of Electrical Engineers, 2000, pp. 4/1-4/7.
Adan, et al., "Linearity and Low-Noise Performance of SOI MOSFETs for RF Applications", IEEE Transactions on Electron Devices, vol. 49, No. 5, May 2002, pp. 881-888.
Cristoloveanu, et al., "The Four-Gate Transistor", Institute of Microelectronics, Electromagnetism and Photonics, ESSDERC 2001, pp. 323-326.
Ayasli, et al., "An X-Band 10 W Monolithic Transmit-Receive GaAs FET Switch", Raytheon Research Division, 1982 IEEE, pp. 42-46.
Dufrene, et al., "The G4-FET: Low Voltage to High Voltage Operation and Performance", Dept. Of Electrical and Computer Engineering, The University of Tennessee, IEEE 2003, pp. 55-56.
Pucel, et al., "A Multi-Chip GaAs Monolithic Transmit/Receive Module for X-Band", Research Division, Raytheon company, 1982 IEEE MTT-S Digest, pp. 489-492.
Dufrene, et al., "Investigation of the Four-Gate Action in G4-FETs", IEEE Transactions on Electron Devices, vol. 51, No. 11, Nov. 2004, pp. 1931-1935.
Ayasli, et al., "A Monolithic Single-Chip X-Band Four-Bit Phase Shifter", IEEE Transactions on Microwave Theory and Techniques, vol. MTT-30, No. 12, Dec. 1982, pp. 2201-22.
Akarvardar, et al., "Multi-Bias Dependence of Threshold Voltage, Subthreshold Swing, and Mobility in G4-FETs", Institute of Microelectronics, Electromagnetism, and Photonics, IEEE 2003, pp. 127-130.
Lim, et al., "Partial SOI LDMOSFETs for High-Side Switching", Dept. of Engineering, University of Cambridge, 1999 IEEE, pp. 149-152.
Akarvardar, et al., "Threshold Voltage Model of the SOI 4-Gate Transistor", 2004 IEEE International SOI Conference, Oct. 2004, pp. 89-90.
Ming, et al., "A New Structure of Silicon-on-Insulator Metal-Oxide-Semiconductor Field Effect Transistor to Suppress the Floating Body Effect", Chin. Phys. Lett., vol. 20, No. 5 (2003), pp. 767-769.
Allen, Thomas P., "Characterization and Modeling of Silicon-on-Insulator Field Effect Transistors", Department of Electrical Engineering and Computer Science, MIT, May 20, 1999, 80 pgs.
Fung, et al., "Frequency Dispersion in Partially Depleted SOI MOSFET Output Resistance", Proceedings 1996 IEEE International SOI Conference, Oct., 1996, pp. 146-147.
Chen, Suheng, "G4-FET Based Voltage Reference", Masters Theses, University of Tennessee, Knoxville, Trace: Tennessee Research and Creative Exchange, May 2004, 57 pgs.
Zhu et al., "Simulation of Suppression of Floating-Body Effect in Partially Depleted SOI MOSFET Using a Si1-xGex Dual Source Structure", Materials Science and Engineering B 114-115 (2004), pp. 264-268.
Hieda, et al., Floating-Body Effect Free Concave SOI-MOSFETs (COSMOS), ULSI Research Center, Toshiba Corporation, IEEE 1991, pp. 26.2.1-26.2.4.
Marks, Jeffery Earl, "SOI for Frequency Synthesis in RF Integrated Circuits", Thesis submitted to North Carolina State University, 2003, 155 pgs.

(56) References Cited

OTHER PUBLICATIONS

Moye, et al., "A Compact Broadband, Six-Bit MMIC Phasor with Integrated Digital Drivers+", IEEE 1990 Microwave and Millimeter-Wave Monolithic Circuits Symposium, 1988 IEEE, pp. 123-126.
Smuk, et al. "Monolithic GaAs Multi-Throw Switches with Integrated Low-Power Decoder-Driver Logic", Hittite Microwave Corporation, Jun. 1997, 4 pgs.
Dribinsky, et al., Notice of Appeal and Pre-Appeal Brief Request for Review filed in the USPTO dated Feb. 20, 2014 for related U.S. Appl. No. 11/881,816, 7 pgs.
Huber & Schussler, Report on Decision in EPO Opposition Division for related appln. No. 02800982.7-2220 dated Feb. 25, 2014, 13 pgs.
Dang, Hung J., Office Action received from the USPTO dated Feb. 26, 2014 for related U.S. Appl. No. 12/735,954, 34 pgs.
Dribinsky, et al., Response filed in the USPTO dated Feb. 4, 2014 for related U.S. Appl. No. 11/881,816, 20 pgs.
Shingleton, Michael, Advisory Action received from the USPTO dated Feb. 19, 2014 or related U.S. Appl. No. 11/881,816, 3 pgs.
Tat, Binh C., Office Action received from the USPTO dated May 23, 2014 for related U.S. Appl. No. 13/948,094, 7 pgs.
Unterberger, Michael, Communication pursuant to Article 101(1) and Rule 81(2) to (3) received from the EPO dated Mar. 3, 2014 for related appln. No. 02800982.7, 3 pgs.
Weman, Eva, Provision of a copy of the minutes in accordance with Rule 124(4) EPC received from the EPO dated Jan. 10, 2014 for related appln. No. 02800982.7, 9 pgs.
European Patent Office, Brief Communication received from the EPO dated May 8, 2014 for related appln. No. 02800982.7, 2 pgs.
Peregrine Semiconductor Corporation, Reply filed in the EPO dated May 8, 2014 for related appln. No. 02800982.7, 79 pgs.
Unterberger, Michael, Communication pursuant to Article 94(3) EPC received from the EPO dated Apr. 9, 2014 for related appln. No. 10011669.8, 5 pgs.
Tieu, Binh Kien, Office Action received from the USPTO dated Jun. 24, 2014 for related U.S. Appl. No. 14/062,791, 7 pgs.
Peregrine Semiconductor Corporation, English translation of Response filed in the JPO dated Jul. 3, 2014 for related appln. No. 2013-003388, 14 pgs.
Tat, Binh C., Notice of Allowance received from the USPTO dated Jul. 18, 2014 for related U.S. Appl. No. 13/028,144, 29 pgs.
Ranta, et al., Response filed in the USPTO dated May 23, 2012 for related U.S. Appl. No. 12/803,133, 7 pgs.
Patel, Reema, Notice of Allowance received from the USPTO dated May 24, 2012 for related U.S. Appl. No. 13/046,560, 15 pgs.
Dang, Hung Q., Notice of Allowance received from the USPTO dated Jul. 12, 2012 for related U.S. Appl. No. 12/735,954, 20 pgs.
Le, Dinh Thanh, Office Action received from the USPTO dated Dec. 1, 2011 for related U.S. Appl. No. 12/803,064, 23 pgs.
Patel, Reema, Office Action received from the USPTO dated Dec. 5, 2011 for related U.S. Appl. No. 13/046,560, 13 pgs.
Englekirk, Robert Mark, Amendment tiled in the USPTO dated Mar. 5, 2012 for related U.S. Appl. No. 13/046,560, 4 pgs.
Cole, Brandon S., Notice of Allowance received from the USPTO dated Jun. 8, 2012 for related U.S. Appl. No. 12/803,133, 12 pgs.
Le, Dinh Thanh, Office Action received from the USPTO dated Jun. 13, 2012 for related U.S. Appl. No. 12/803,064, 14 pgs.
Theunissen, Lars, Communication under Rule 71(3) EPC dated Jul. 2, 2012 for related appln. No. 09715932.1, 98 pgs.
Ranta, et al., Comments on Examiner's Statement of Reasons for Allowance filed in the USPTO dated Sep. 10, 2012 for related U.S. Appl. No. 12/803,133, 3 pgs.
Ranta, et al., Amendment filed in the USPTO dated Sep. 12, 2012 for related U.S. Appl. No. 12/803,064, 13 pgs.
Funakoshi, Ryo, Office Action and English translation received from JPO dated Oct. 29, 2013 for related appln. No. 2013-006353, 15 pgs.
Communication under Rule 71(3) EPC, Intention to Grant received from the EPO dated Nov. 12, 2013 for related appln. No. 12194187.6-1802, 94 pgs.

Dang, Hung, Office Action received from the USPTO dated Feb. 26, 2014 for related U.S. Appl. No. 12/735,954, 34 pgs.
Gonzalez, Brosa, Decision to Grant a European Patent pursuant to Article 97(1) EPC received from the EPO dated Apr. 17, 2014 for related appln. No. 12194187.6, 1 pgs.
Peregrine Semiconductor Corporation, Response and English translation filed in the JPO dated Apr. 28, 2014 for related appln. No. 2013-006353, 22 pgs.
European Patent Office, Noting of Loss of Rights Pursuant to Rule 112(1) EPC received from the EPO dated May 2, 2014 for related appln. No. 07794407.2, 1 pg.
Brosa, Anna-Maria; European Search Report received from the EPO dated May 27, 2014 for related appln. No. 14165804.7, 8 pgs.
Ranta, Tero Tapia, Amendment filed in the USPTO dated Jun. 26, 2014 for related U.S. Appl. No. 12/735,954, 33 pgs.
Japanese Patent Office, Notice of Allowance received from the JPO dated Jul. 8, 2014 for related appln. No. 2013-006353, 3 pgs.
Peregrine Semiconductor Corporation, Response filed in the EPO dated Jul. 11, 2014 for related appln. No. 07794407.2, 32 pgs.
European Patent Office, Communication pursuant to Rule 58 EPC—Invitation to Remedy Deficiencies in the application documents received from the EPO dated Jul. 21, 2014 for appln. No. 07794407.2, 5 pgs.
Peregrine Semiconductor Corporation, Response filed in the EPO dated Jul. 30, 2014 for appln. No. 07794407.2, 25 pgs.
Rojas, Daniel E., Office Action received from the USPTO dated Aug. 12, 2014 for U.S. Appl. No. 14/178,116, 9 pgs.
Patel, Reema, Office Action received from the USPTO dated Aug. 15, 2014 for U.S. Appl. No. 14/028,357, 8 pgs.
Ranta, et al., Response filed in the USPTO dated Nov. 12, 2014 for U.S. Appl. No. 14/178,116, 8 pgs.
Dang, Hung, Notice of Allowance received from the USPTO dated Nov. 18, 2014 for U.S. Appl. No. 12/735,954, 33 pgs.
Wong, Alan, Notice of Allowance received from the USPTO dated Nov. 21, 2014 for U.S. Appl. No. 13/586,738, 205 pgs.
Ichikawa, Takenori, Office Action and English translation received from the JPO dated Nov. 18, 2014 for appln. No. 2013-181032, 15 pgs.
Peregrine Semiconductor Corporation, Response filed in the EPO dated Dec. 10, 2014 for appln. No. 14165804.7, 76 pgs.
Englekirk, Robert Mark, Response filed in the USPTO dated Dec. 15, 2014 for U.S. Appl. No. 14/028,357, 10 pgs.
Bawell, et al., Comments on Examiner's Statement of Reasons for Allowance filed in the USPTO dated Feb. 23, 2015 for U.S. Appl. No. 13/586,738.
Puentes, Daniel, Notice of Allowance received from the USPTO dated Mar. 31, 2015 for U.S. Appl. No. 14/178,116, 181 pgs.
Patel, Reema, Final Office Action received from the USPTO dated Apr. 7, 2015 for U.S. Appl. No. 14/028,357, 159 pgs.
Englekirk, Robert Mark, Response After Final Office Action filed in the USPTO dated Jun. 8, 2015 for U.S. Appl. No. 14/028,357, 3 pgs.
Patel, Reema, Notice of Allowance received from the USPTO dated Jun. 25, 2015 for U.S. Appl. No. 14/028,357, 12 pgs.
Ranta, Tero, Preliminary Amendment filed in the USPTO dated Jul. 8, 2015 for U.S. Appl. No. 14/638,917, 8 pgs.
Peregrine Semiconductor Corporation, Response filed in the EPO dated Sep. 10, 2015 for appln. No. 14165804.7, 14 pgs.
Le, Dinh Thanh, Office Action received from the USPTO dated Sep. 22, 2015 for U.S. Appl. No. 14/165,422, 4 pgs.
Ichikawa, Takenori, Office Action and English translation received from the JPO dated Aug. 18, 2015 for appln. No. 2013-181032, 15 pgs.
Wong, Alan, Office Action received from the USPTO dated Sep. 12, 2014 for U.S. Appl. No. 13/595,893, 11 pgs.
Wong, Alan, Final Office Action received from the USPTO dated Mar. 4, 2015 for U.S. Appl. No. 13/595,893, 33 pgs.
Wong, Alan, Advisory Action received from the USPTO dated Apr. 23, 2015 for U.S. Appl. No. 13/595,893, 4 pgs.
Ionescu, et al., "A Physical Analysis of Drain Current Transients at Low Drain Voltage in Thin Film SOI MOSFETs", Microelectronic Engineering 28 (1995), pp. 431-434.
Suh, et al., "A Physical Charge-Based Model for Non-Fully Depleted SOI MOSFET's and Its Use in Assessing Foating-Body

(56) References Cited

OTHER PUBLICATIONS

Effects in SOI CMOS Circuits", IEEE Transactions on Electron Devices, vol. 42, No. 4, Apr. 1995, pp. 128-737.
Wang, et al., "A Robust Large Signal Non-Quasi-Static MOSFET Model for Circuit Simulation", IEEE 2004 Custom Integrated Circuits Conference, pp. 2-1-1—2-1-4.
Han, et al., "A Simple and Accurate Method for Extracting Substrate Resistance of RF MOSFETs", IEEE Electron Device Letters, vol. 23, No. 7, Jul. 2002, pp. 434-436.
Terauchi, et al., "A 'Self-Body-Bias' SOI MOSFET: A Novel Body-Voltage-Controlled SOI MOSFET for Low Voltage Applications", The Japan Sociey of Applied Physics, vol. 42 (2003), pp. 2014-2019, Part 1, No. 4B, Apr. 2003.
Dehan, et al., "Dynamic Threshold Voltage MOS in Partially Depleted SOI Technology: A Wide Frequency Band Analysis", Solid-State Electronics 49 (2005), pp. 67-72.
Kuroda, et al., "A 0.9-V, 150-MHz, 10-mW, 4 mm2, 2-D Discrete Cosine Transform Core Processor with Variable Threshold-Voltage (VT) Scheme", IEEE Journal of Solid-State Circuits, vol. 31, No. 11, Nov. 1996, pp. 1770-1779.
Kuroda, et al., "A 0.9-V, 150-MHz, 10-mW, 4 mm2, 2-D Discrete Cosine Transform Core Processor with Variable-Threshold-Voltage Scheme", Technical Paper, 1996 IEEE International Solid-State Circuits Conference, 1996 Digest of Technical Papers, pp. 166-167.
Cathelin, et al., "Antenna Switch Devices in RF Modules for Mobile Applications", ST Microelectronics, Front-End Technology and Manufacturing, Crolles, France, Mar. 2005, 42 pgs.
Cristoloveanu, Sorin, "State-of-the-art and Future of Silicon on Insulator Technologies, Materials, and Devices", Microelectronics Reliability 40 (2000), pp. 771-777.
Sivaram, et al., "Silicon Film Thickness Considerations in SOI-DTMOS", IEEE Device Letters, vol. 23, No. 5, May 2002, pp. 276-278.
Drake, et al., "Analysis of the Impact of Gate-Body Signal Phase on Dtmos Inverters in 0.13um PD-SOI", Department of EECS, University of Michigan, Ann Arbor, MI, Sep./Oct. 2003, 4 pgs.
Drake, et al., "Analysis of the Impact of Gate-Body Signal Phase on DTMOS Inverters in 0.13um PD-SOI", Department of EECS, University of Michican, Ann Arbor, MI, Sep./Oct. 2003, 16 pgs.
Drake, et al., Evaluation of Dynamic-Threshold Logic for Low-Power VLSI Design in 0.13um PD-SOI, University of Michigan, Ann Arbor, MI, Dec. 2003, 29 pgs.
Imam, et al., "A Simple Method to Determine the Floating-Body Voltage of SOI CMOS Devices", IEEE Electron Device Letters, vol. 21, No. 1, Jan. 2000, pp. 21-23.
Dehan, et al., "Alternative Architectures of SOI MOSFET for Improving DC and Microwave Characteristics", Microwave Laboratory, Universite catholique de Louvain, Sep. 2001, 4 pgs.
Colinge, Jean-Pierre, "An SOI Voltage-Controlled Bipolar-MOS Device", IEEE Transactions on Electron Devices, vol. Ed-34, No. 4, Apr. 1987, pp. 845-849.
Pelella, et al., "Analysis and Control of Hysteresis in PD/SOI CMOS", University of Florida, Gainesville, FL., 1999 IEEE, pp. 34.5.1—34.5.4.
Adriaensen, et al., "Analysis and Potential of the Bipolar- and Hybrid-Mode Thin-Film SOI MOSFETs for High-Temperature Applications", Laboratoire de Microelectronique, Universite catholique de Louvain, May 2001, 5 pgs.
Gentinne, et al., "Measurement and Two-Dimensional Simulation of Thin-Film SOI MOSETs: Intrinsic Gate Capacitances at Elevated Temperatures", Solid-State Electronics, vol. 39, No. 11, pp. 1613-1619, 1996.
Su, et al., "On the Prediction of Geometry-Dependent Floating-Body Effect in SOI MOSFETs", IEEE Transactions on Electron Devices, vol. 52, No. 7, Jul. 2005, pp. 1662-1664.
Fung, et al., "Present Status and Future Direction of BSIM SOIL Model for High-Performance/Low-Power/RF Application", IBM Microelectronics, Semiconductor Research and Development Center, Apr. 2002, 4 pgs.

Weigand, Christopher, "An ASIC Driver for GaAs FET Control Components", Technical Feature, Applied Microwave & Wireless, 2000, pp. 42-48.
Lederer, et al., "Frequency degradation of SOI MOS device output conductance", Microwave Laboratory of UCL, Belgium, IEEE 2003, pp. 76-77.
Lederer, et al., "Frequency degradation of SOI MOS device output conductance", Microwave Laboratory of Universite catholique de Louvain, Belgium, Sep./Oct. 2003, 1 pg.
Cheng, et al., "Gate-Channel Capacitance Characteristics in the Fully-Depleted SOI MOSFET", IEEE Transactions on Electron Devices, vol. 48, No. 2, Feb. 2001, pp. 388-391.
Ferlet-Cavrois, et al., "High Frequency Characterization of SOI Dynamic Threshold Voltage MOS (DTMOS) Transistors", 1999 IEEE International SOI Conference, Oct. 1999, pp. 24-25.
Yeh, et al., "High Performance 0.1um Partially Depleted SOI CMOSFET", 2000 IEEE International SOI Conference, Oct. 2000, pp. 68-69.
Bawedin, et al., "Unusual Floating Body Effect in Fully Depleted MOSFETs", IMEP, Enserg, France and Microelectronics Laboratory, UCL, Belgium, Oct. 2004, 22 pgs.
Flandre, et al., "Design of EEPROM Memory Cells in Fully Depleted 'CMOS SOI Technology", Catholic University of Louvain Faculty of Applied Science, Laboratory of Electronics and Microelectronics, Academic Year 2003-2004, 94 pgs.
Takamiya, et al., "High-Performance Accumulated Back-Interface Dynamic Threshold SOI MOSFET (AB-DTMOS) with Large Body Effect at Low Supply Voltage", Japanese Journal of Applied Physics, vol. 38 (1999), Part 1, No. 4B, Apr. 1999, pp. 2483-2486.
Drake, et al., "Evaluation of Dynamic-Threshold Logic for Low-Power VLSI Design in 0.13um PD-SOI", IFIP VLSI-SoC 2003, IFIP WG 10.5 International Conference on Very Large Scale Integration of System-on-Chip, Darmstadt, Germany, Dec. 1-3, 2003.
Huang, et al., "Hot Carrier Degradation Behavior in SOI Dynamic-Threshold-Voltage nMOSFET's (n-DTMOSFET) Measured by Gated-Diode Configuration", Microelectronics Reliability 43 (2003), pp. 707-711.
Goo, et al., "History-Effect-Conscious Spice Model Extraction for PD-SOI Technology", 2004 IEEE International SOI Conference, Oct. 2004, pp. 156-158.
Workman, et al., "Dynamic Effects in BTG/SOI MOSFETs and Circuits Due to Distributed Body Resistance", Proceedings 1997 IEEE International SOI Conference, Oct. 1997, pp. 28-29.
Ernst, et al., "Detailed Analysis of Short-Channel SOI DT-MOSFET", Laboratoire de Physique des Composants a Semiconducteurs, Enserg, France, Sep., 1999, pp. 380-383.
Huang, et al., "Device Physics, Performance Simulations and Measured Results of SOI MOS and DTMOS Transistors and Integrated Circuits", Beijing Microelectronics Technology Institute, 1998 IEEE, pp. 712-715.
Bernstein, et al., "Design and Cad Challenges in sub-90nm CMOS Technologies", IBM Thomas J. Watson Research Center, NY, Nov. 11-13, 2003, pp. 129-136.
Wiatr, et al., "Impact of Floating Silicon Film on Small-Signal Parameters of Fully Depleted SOI-MOSFETs Biased into Accumulation", Solid-State Electronics 49 (2005), Received 9/11/30, revised on Nov. 9, 2004, pp. 779-789.
Gritsch, et al., "Influence of Generation/Recombination Effects in Simulations of Partially Depleted SOI MOSFETs", Solid-State Electronics 45 (2001), Received Dec. 22, 2000, accepted Feb. 14, 2001, pp. 621-627.
Chang, et al., Investigations of Bulk Dynamic Threshold-Voltage MOSFET with 65 GHz "Normal-Mode" Ft and 220GHz "Over-Drive Mode" Ft for RF Applications, Institute of Electronics, National Chiao-Tung Universtiy, Taiwan, 2001 Symposium on VLSI Technology Digest of Technical Papers, pp. 89-90.
Horiuchi, Masatada, "A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000, pp. 1587-1592.
Horiuchi, Masatada, "A Dynamic-Threshold SOI Device with a J-FET Embedded Source Structure and a Merged Body-Bias-Con-

(56) References Cited

OTHER PUBLICATIONS trol Transistor—Part II: Circuit Simulation", IEEE Transactions on Electron Devices, vol. 47, No. 8, Aug. 2000, pp. 1593-1598.
Casu, Mario Roberto, "High Performance Digital CMOS Circuits in PD-SOI Technology: Modeling and Design", Tesi di Dottorato di Recerca, Gennaio 2002, Politecnico di Torino, Corso di Dottorato di Ricerca in Ingegneria Elettronica e delle Communicazioni, 200 pgs.
Tinella, Carlo, "Study of the potential of CMOS-SOI technologies partially abandoned for radiofrequency applications", Thesis for obtaining the standard of Doctor of INPG, National Polytechnic of Grenoble, Sep. 25, 2003, 187 pgs.
Wong, Alan, Applicant-Initiated Interview Summary received from the USPTO dated May 7, 2015 for U.S. Appl. No. 13/595,893, 4 pgs.
Wong, Alan, Notice of Allowance received from the USPTO dated Aug. 17, 2015 for U.S. Appl. No. 13/595,893, 12 pgs.
Reedy, et al. Comments on Examiner's Statement of Reasons for Allowance filed in the USPTO dated Oct. 6, 2015 for U.S. Appl. No. 13/595,893, 4 pgs.
Reedy, et al. Response filed in the USPTO dated Dec. 12, 2014 for U.S. Appl. No. 13/595,893, 24 pgs.
Reedy, et al. Submission with Rce Under 37 CFR 1.114 filed in the USPTO dated Jul. 6, 2015 for U.S. Appl. No. 13/595,893, 34 pgs.
Milosavljevic, Zlatoljub, "RF MEMS Switches", Microwave Review, Jun., 2004, pp. 2-8.
Willoughby, Terrence, Office Action received from the USPTO dated Jun. 29, 2016 for U.S. Appl. No. 14/883,512, 10 pgs.
Hanzo, "Adaptive Wireless Transceivers", Wiley, 2002.
Lossee, "RF Systems, Components, and Circuits Handbook", Artech House, 1997.
Miller, "Moderin Electronic Communications", Prentice-Hall, 1999.
Minoli, "Telecommunications Technology Handbook", Artech House, 2003.
Morreale, "The CRC Handbook of Modern Telecommunications", CRC Press, 2001.
Sayre, "Complete Wireless Design", McGraw-Hill, 2001.
Shafi, "Wireless Communications in the 21st Century", Wiley, 2002.
Wei, et al., "Large-Signal Model of Triple-Gate MESFET/PHEMT for Switch Applications", Alpha Industries, Inc., 1999 IEEE, pp. 745-748.
Soyuer, et al., "RF and Microwave Building Blocks in a Standard BiCMOS Technology", IBM T.J. Watson Research Center, 1996 IEEE, pp. 89-92.
Mizutani, et al., "Compact DC-60-GHz HJFET MMIC Switches using Ohmic Electrode-Sharing Technology", IEEE Transactions on Microwave Theory and Techniques, vol. 46, No. 11, Nov. 1998, pp. 1597-1603.
Ota, et al., "High Isolation and Low Insertion Loss Switch IC Using GaAs MESFETs", IEEE Transactions on Microwave Theory and Techniques, vol. 43, No. 9, Sep. 1995, pp. 2175-2177.
Koo, Raymond, "RF Switches", Univ. Toronto, Elec. And Computer Engineering Dept. 2001, 12 pgs.
Titus, et al., "A Silicon Bicmos Transceiver Front-End MMIC Covering 900 and 1900 MHZ Applications", Hittite Microwave Corporation, IEEE 1996 Microwave and Millimeter-Wave Monolithic Circuits Symposium, pp. 73-75.
Rossek, Sacha, "Direct Optical Control of a Microwave Phase Shifter Using GaAs Field-Effect Transistors", Communications Research Group, School of Electronic Engineering, Faculty of Technology, Middlesex University, Sep. 1998, 224 pgs.
Schindler, et al., "DC-20 GHZ N X M Passive Switches", Raytheon Co., 1998 IEEE MTT-S Digest, pp. 1001-1005.
Houng, et al., "60-70 dB Isolation 2-19 GHz Switches", Raytheon Electromagnetic Systems Division, 1989 IEEE, GaAs IC Symposium, pp. 173-176.
Schindler, et al., "DC-40 GHz and 20-40 GHz MMIC SPDT Switches", IEEE Transactions of Electron Devices, vol. Ed-34, No. 12, Dec. 1987, pp. 2595-2602.

Schindler, et al., "A 2-18 GHz Non-Blocking Active 2 X 2 Switch", Raytheon Company, 1989 IEEE, GaAs IC Symposium, pp. 181-183.
Schindler, et al., "A Single Chip 2-20 GHz T/R Module" 1988 IEEE, IEEE 1990 Microwave and Millimeter-Wave Monolithic Circuits Symposium, pp. 99-102.
McGRATH, et al., "Novel High Performance SPDT Power Switches using Multi-Gate FETs", 1991 IEEE, 1991 IEEE MTT-S Digest, pp. 839-842.
Schindler, et al., "DC-20 GHz N X M Passive Switches", IEEE Transactions on Microwave Theory and Techniques, vol. 36, No. 12, Dec. 1988, pp. 1604-1613.
Bernkopf, et al., "A High Power K/Ka-Band Monolithic T/R Switch", 1991 IEEE, IEEE 1991 Microwave and Millimeter-Wave Monolithic Circuits Symposium, pp. 15-18.
Copenheaver, Brian, International Search Report and Written Opinion for related appln. No. PCT/US2009/001358 dated May 27, 2009, 11 pages.
Peregrine Semiconductor Corporation, Article 19 Amendment Letter Under Section 205(b) and Rule 46.5 (b) PCT filed in WIPO for related appln. No. PCT/US2009/001358, dated Aug. 11, 2009, 12 pages.
Kao, W.H., et al., "Parasitic extraction: current state of the art and future trends", Proceedings of the IEEE, May 2001, vol. 89, Issue 5, pp. 729-739.
Brambilla, A., et al., "Measurements and extractions of parasitic capacitances in ULSI layouts", Electron Devices, IEEE Transactions, 11/2003, vol. 50, Issue 11, pp. 2236-2247.
Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.
Nabors, et al., "FastCap: A Multipole Accelerated 3-D Capacitance Extraction Program", IEEE Transactions on computer-Aided Design, vol. 10, No. 11, Nov. 1991, pp. 1447-1459.
Nabors, et al., "Fast Capacitance Extraction of General Three-Dimensional Structures", IEEE Transactions on Microwave Theory and Techniques, vol. 40, No. 7, Jul. 1992, pp. 1496-1506.
Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.
Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.
Nabors, et al., "A Fast Multipole Algorithm for Capacitance Extraction of Complex 3-D Geometries", IEEE 1989 custom Integrated Circuits Conference, May 1989, pp. 21.7.1-21.7.4.
Nabors, et al., "Fast Capacitance Extraction of General Three-Dimensional Structures", Proc. Int. Conf. on Computer Design, Cambridge, MA, Oct. 1991, pp. 479-484.
Nabors, et al., "Including Conformal Dielectrics in Multipole-Accelerated Three-Dimensional Interconnect Capacitance Extraction", proceedings of NUPAD IV, Seattle, WA, May 1992, 2 pgs.
Nabors, et al., "Multipole-Accelerated 3-D Capacitance Extraction Algorithms for Structures with Conformal Dielectrics", Proceeding of the 29th Design Automation Conference, Anaheim, CA, Jun. 1992, pp. 710-715.
Phillips, et al., "A Precorrected-FFT method for Capacitance Extraction of Complicated 3-D Structures", Int. Conf. On Computer-Aided Design, Santa Clara, CA, Nov. 1994, 4 pgs.
Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.
Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.

(56) References Cited

OTHER PUBLICATIONS

Kamon, et al., "FastPep: A Fast Parasitic Extraction Program for Complex Three-Dimensional Geometries", Proceedings of the IEEE Conference on Computer-Aided Design, San Jose, Nov., 1997, pp. 456-460.
Young, Lee W., International Search Report received from USRO for related appln. No. PCT/US2007/10331 dated Feb. 15, 2008, 14 pages.
Englekirk, Robert, Preliminary Amendment filed in the USPTO dated Sep. 11, 2009 for related U.S. Appl. No. 11/796,522, 9 pgs.
Patel, Reema, Office Action received from the USPTO dated Oct. 2, 2009 for related U.S. Appl. No. 11/796,522, 6 pgs.
Englekirk, Robert, Response filed in the USPTO dated Nov. 2, 2009 for related U.S. Appl. No. 11/796,522, 3 pgs.
Ranta, et al., Amendment filed in USPTO dated Apr. 30, 2012 for related U.S. Appl. No. 12/803,064, 16 pgs.
Kurisu, Masakazu, Japanese Office Action and translation received from the JPO dated Apr. 17, 2012 for related appln. No. 2010-506156, 4 pgs.
Volker, Simon, Communication from the EPO dated Dec. 3, 2009 for related appln. No. 09174085.2-1233, 6 pgs.
European Patent Office, Communication Pursuant to Rules 161 and 162 EPC dated Dec. 10, 2009 for related appln. No. 07794407.2, 2 pgs.
Volker, Simon, European Search Report received from the EPO dated Mar. 12, 2010 for related appln. 07794407.2, 8 pgs.
Patel, Reema, Office Action received from the USPTO dated Mar. 2, 2010 for related U.S. Appl. No. 11/796,522, 8 pgs.
Englekirk, Robert, Amendment filed in the USPTO dated Jun. 2, 2010 for related U.S. Appl. No. 11/796,522, 10 pgs.
Volker, Simon, Communication Pursuant to Article 94(3) EPC received from the EPO dated May 4, 2010 for related appln. No. 09174085.2, 1 pgs.
Volker, Simon, Communication Pursuant to Article 94(3) EPC received from the EPO dated Jun. 15, 2010 for related appln. No. 07794407.2, 1 pgs.
Peregrine Semiconductor Corporation, Response filed in the EPO for related appln. No. 07794407.2 dated Oct. 20, 2010, 13 pgs.
Peregrine Semiconductor Corporation, Response filed in the EPO for related appln. No. 09174085.2 dated Oct. 20, 2010, 14 pgs.
Patel, Reema, Office Action received from the USPTO dated Aug. 30, 2010 for related U.S. Appl. No. 11/796,522, 15 pgs.
Englekirk, Robert, Response filed in the USPTO dated Dec. 30, 2010 for related U.S. Appl. No. 11/796,522, 17 pgs.
Novak, Rodd, "Overcoming the RF Challenges of Multiband Mobile Handset Design", RF/Microwave Switches and Connectors, published Jul. 20, 2007, www.rfdesign.corn, 3 pgs.
Qiao, et al., "Antenna Impedance Mismatch Measurement and Correction for Adaptive CDMA Transceivers", published Jun. 12-17, 2005, by the IEEE in the 2005 Microwave Symposium Digest, 2005 IEEE MTT-S International, pp. 4, et seq.
Sjoblom, Peter, "An Adaptive Impedance Tuning CMOS Circuit for ISM 2.4-GHz Band", published in the IEEE Transactions on Circuits and Systems—1: Regular Papers, vol. 52, No. 6, pp. 1115-1124, Jun. 2005.
Sjoblom, Peter, "Measured CMOS Switched High-Quality Capacitors in a Reconfigurable Matching Network", IEEE Transactions on Circuits and Systems—II: Express Briefs, vol. 54, No. 10, Oct. 2007, pp. 858-862.
Patel, Reema, Notice of Allowance received from the USPTO dated Jan. 28, 2011 for related U.S. Appl. No. 11/796,522, 9 pgs.
Le, Dinh Thanh, Office Action received from the USPTO dated Jun. 23, 2011 for related U.S. Appl. No. 12/803,064, 16 pgs.
Brosa, Anna-Maria, extended European Search Report received from the EPO dated Jul. 15, 2011 for related application No. 09715932.1, 12 pgs.
Dang, Hung Q., Office Action received from the USPTO dated Dec. 22, 2011 for related U.S. Appl. No. 12/735,954, 32 pgs.
Peregrine Semiconductor Corporation, Response filed in the EPO dated Feb. 10, 2012 for related appln. No. 09715932.1, 47 pgs.
Cole, Brandon S., Office Action received from the USPTO dated Feb. 24, 2012 for related U.S. Appl. No. 12/803,133, 36 pgs.
Ranta, Tero Tapia, Amendment filed in the USPTO dated Mar. 21, 2012 for related U.S. Appl. No. 121735,954, 16 pgs.
Nguyen, Niki Hoang, Notice of Allowance received from the USPTO dated Aug. 20, 2014 for related U.S. Appl. No. 14/198,315, 11 pgs.
Tat, Binh C., Notice of Allowance received from the USPTO dated Oct. 1, 2014 for related U.S. Appl. No. 13/028,144, 15 pgs.
Stuber, et al., "Method and Apparatus Improving Gate Oxide Reliability by Controlling Accumulated Charge", patent application filed in the USPTO dated Jul. 22, 2013 for related U.S. Appl. No. 13/948,094, 132 pgs.
European Patent Office, Communication received from the EPO dated Aug. 14, 2014 for related appln. No. 02800982.7, 2 pgs.
Peregrine Semiconductor Corporation, Response filed in the EPO dated Oct. 14, 2014 for appln. No. 10011669.8, 30 pgs.
Tat, Binh C., Office Action received from the USPTO dated Jan. 2, 2015 for U.S. Appl. No. 13/948,094, 187 pgs.
Stuber, et al., Response/Amendment filed in the USPTO dated Oct. 23, 2014 for U.S. Appl. No. 13/948,094, 28 pgs.
Burgener, et al., Response filed in the USPTO dated Nov. 24, 2014 for U.S. Appl. No. 14/062,791, 10 pgs.
Tat, Binh C., Notice of Allowance received from the USPTO dated Dec. 5, 2014 for U.S. Appl. No. 13/028,144, 13 pgs.
Stuber, et al., Comments on Examiner's Statement of Reasons for Allowance filed in the USPTO dated Dec. 8, 2014 for Appl. No. 13/028,144, 4 pgs.
Tieu, Binh Kien, Notice of Allowance received from the USPTO dated Jan. 23, 2015 for U.S. Appl. No. 14/062,791, 8 pgs.
Brindle, et al., Notice of Allowance received from the USPTO dated Feb. 3, 2015 for U.S. Appl. No. 14/198,315, 10 pgs.
Stuber, et al., Response/Amendment filed in the USPTO dated Mar. 2, 2015 for U.S. Appl. No. 13/948,094, 11 pgs.
Tat, Binh C., Office Action received from the USPTO dated Mar. 27, 2015 for U.S. Appl. No. 13/948,094, 23 pgs.
Shingleton, Michael, Office Action received from the USPTO dated Apr. 10, 2015 for U.S. Appl. No. 14/257,808, 8 pgs.
Tieu, Binh Kien, Notice of Allowance received from the USPTO dated May 14, 2015 for U.S. Appl. No. 14/062,791, 211 pgs.
Nguyen, Niki, Office Action received from the USPTO dated Oct. 2, 2013 for U.S. Appl. No. 13/850,251, 22 pgs.
Nguyen, Niki, Office Action received from the USPTO dated Apr. 2, 2014 for U.S. Appl. No. 13/850,251, 9 pgs.
Nguyen, Niki, Final Office Action received from the USPTO dated Jan. 22, 2015 for U.S. Appl. No. 13/850,251, 245 pgs.
Nguyen, Niki, Notice of Allowance received from the USPTO dated Apr. 22, 2015 for U.S. Appl. No. 13/850,251, 22 pgs.
Brindle, et al., Comments on Examiner's Statement of Reasons for Allowance filed in the USPTO dated Jul. 22, 2015 for U.S. Appl. No. 13/850,251, 3 pgs.
Brindle, et al., Preliminary Amendment filed in the USPTO dated Jul. 19, 2013 for U.S. Appl. No. 13/850,251, 21 pgs.
Brindle, et al., Amendment filed in the USPTO dated Dec. 26, 2013 for U.S. Appl. No. 13/850,251, 22 pgs.
Brindle, et al., Amendment filed in the USPTO dated Oct. 2, 2014 for U.S. Appl. No. 13/850,251, 13 pgs.
Brindle, et al., Amendment filed in the USPTO dated Mar. 23, 2015 for U.S. Appl. No. 13/850,251, 14 pgs.
Stuber, et al., Response/Amendment and Terminal Disclaimers filed in the USPTO dated Jul. 27, 2015 for U.S. Appl. No. 13/948,094, 26 pgs.
Tieu, Binh Kien, Notice of Allowance received from the USPTO dated Sep. 4, 2015 for U.S. Appl. No. 14/062,791, 12 pgs.
Dribinsky, et al., Amendment filed in the USPTO dated Oct. 13, 2015 for U.S. Appl. No. 14/257,808, 19 pgs.
Tat, Binh, Final Office Action received from the USPTO dated Nov. 19, 2015 for U.S. Appl. No. 13/948,094, 34 pgs.
Unterberger, Michael, Communication under Rule 71(3) EPC dated Dec. 1, 2015 for appln. No. 10011669.8, 64 pgs.
Peregrine Semiconductor Corporation communication received from the EPO dated Dec. 3, 2015 for appln. No. 11153227.1, 2 pgs.

(56) References Cited

OTHER PUBLICATIONS

Peregrine Semiconductor Corporation communication received from the EPO dated Dec. 3, 2015 for appln. No. 11153247.9, 2 pg.
Peregrine Semiconductor Corporation communication received from the EPO dated Dec. 3, 2015 for appln. No. 11153241.2, 3 pgs.
Peregrine Semiconductor Corporation communication received from the EPO dated Dec. 4, 2015 for appln. No. 11153281.8, 3 pgs.
Shingleton, Michael B., Notice of Allowance received from the USPTO dated Dec. 10, 2015 for U.S. Appl. No. 14/257,808, 176 pgs.
Itoh, Tadashige, et al, English translation of Office Action received from the JPO dated Dec. 1, 2015 for appln. No. 2013-535054, 3 pgs.
Nguyen, Niki Hoang, Office Action received from the USPTO dated Mar. 2, 2016 for U.S. Appl. No. 14/804,198, 5 pgs.
Brindle, et al., Response filed in the USPTO dated Jun. 2, 2016 for U.S. Appl. No. 14/804,198, 9 pgs.
Peregrine Semiconductor Corporation, English translation of Response filed in the JPO dated Mar. 31, 2016 for Appln. No. 2013-535054, 7 pgs.
Peregrine Semiconductor Corporation, Response filed in the EPO dated Mar. 30, 2016 for appln. No. 11153227.1, 13 pgs.
Peregrine Semiconductor Corporation, Response filed in the EPO dated Mar. 30, 2016 for appln. No. 11153247.9, 13 pgs.
Peregrine Semiconductor Corporation, Response filed in the EPO dated Mar. 30, 2016 for appln. No. 11153241.2, 15 pgs.
Peregrine Semiconductor Corporation, Response filed in the EPO dated Mar. 30, 2016 for appln. No. 11153281.8, 13 pgs.
Peregrine Semiconductor Corporation, Reply to Summons to Attend Oral Proceedings filed in the EPO dated Apr. 15, 2016 for appln No. 0678943.8, 26 pgs.
Hoffmann, Niels, Communication pursuant to Article 94(3) EPC received from the EPO dated May 13, 2016 for appln. No. 11153313.9, 4 pgs.
Nguyen, Niki Hoang, Office Action received from the USPTO dated Jun. 1, 2016 for U.S. Appl. No. 14/845,154, 6 pgs.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Barker, Communications Electronics-Systems, Circuits, and Devices, 1987, Prentice-Hall.
Carr, "Secrets of RF Circuit Design", McGraw-Hill, 1997.
Sukman-Prahofer, Sibina, English translation of an Office Action received from the German Patent Office dated May 18, 2017 for appln. No. 112011103554.3, 8 pgs.
Tieu, Binh Kien, Final Office Action received from the USPTO dated May 18, 2017 for U.S. Appl. No. 14/883,499, 19 pgs.
Burgener, et al., Response to Final Office Action filed in the USPTO dated May 26, 2017 for U.S. Appl. No. 14/883,499, 3 pgs.
Tieu, Binh Kien, Notice of Allowane received from the USPTO dated Jun. 8, 2017 for U.S. Appl. No. 14/883,499, 14 pgs.
Nguyen, Niki Hoang, Notice of Allowance received from the USPTO dated Jun. 21, 2017 for U.S. Appl. No. 15/354,723, 23 pgs.
Itoh, Tadashige, et al., English translation of Office Action received from the Japanese Patent Office dated Jun. 27, 2017 or appln. No. 2016-175339, 14 pgs.
Stuber, et al., Preliminary Amendment filed in the USPTO dated Jul. 21, 2017 for U.S. Appl. No. 15/419,898, 10 pgs.
Nguyen, Niki Hoang, Notice of Allowance received from the USPTO dated Aug. 9, 2017 for U.S. Appl. No. 14/845,154, 12 pgs.
Shingleton, Michael B., Notice of Allowance received from the USPTO dated Aug. 10, 2017 for U.S. Appl. No. 14/987,360, 49 pgs.
Nguyen, Niki Hoang, Notice of Allowance received from the USPTO dated Aug. 11, 2017 for U.S. Appl. No. 15/354,723, 18 pgs.

\* cited by examiner

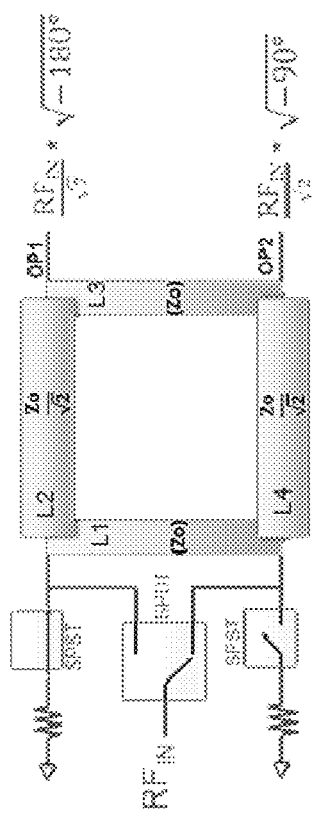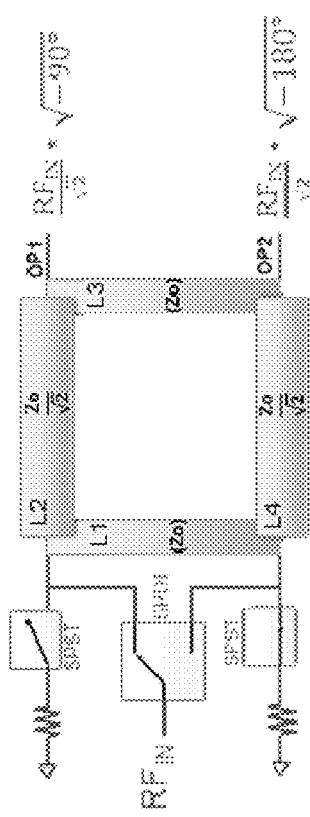
FIG. 12A
FIG. 12B

POWER SPLITTER WITH PROGRAMMABLE OUTPUT PHASE SHIFT

CROSS REFERENCE TO RELATED APPLICATIONS

The present application may be related to U.S. Pat. No. 6,804,502, issued on Oct. 12, 2004 and entitled "Switch Circuit and Method of Switching Radio Frequency Signals", the disclosure of which is incorporated herein by reference in its entirety. The present application may also be related to U.S. Pat. No. 7,910,993, issued on Mar. 22, 2011 and entitled "Method and Apparatus for use in Improving Linearity of MOSFET's using an Accumulated Charge Sink", the disclosure of which is incorporated herein by reference in its entirety. The present application may also be related to International Publication No. WO2009/108391 A1, published Sep. 3, 2009, entitled "Method and Apparatus for use in digitally tuning a capacitor in an integrated circuit device", the disclosure of which is incorporated herein by reference in its entirety. The present application may also be related to US Published Application No. 2013/0222075-A1, published Aug. 29, 2013 entitled "Methods and Apparatuses for Use in Tuning Reactance in a Circuit Device", the disclosure of which is incorporated herein by reference in its entirety.

BACKGROUND

1. Field

The present application relates to radio frequency (RF) systems and circuits. In particular, the present application relates to methods and systems for providing an RF power splitter with outputs having a desired phase difference (e.g. relative phase).

2. Description of Related Art

In the field of radio and telecommunications, such as, for example, transmission and/or manipulation of RF signals (e.g. in the range of 100 MHz to 100 GHz), it may be desirable to split an input RF signal of a given power amplitude in two signals with a desired phase relationship between the two signals. Such phase relationship can be obtained by shifting each of the two signals by a predetermined phase with respect to the input RF signal, so that the phase difference between the two signals provides the desired phase relationship. In some cases it can be desirable that the two split signals have a desired power amplitude relationship, based on the given power amplitude of the input RF signal, which can result in split signals with a desired relative phase and power relationships. In some cases it can be desirable that the power amplitude relationship provides two split signals of different power amplitudes. In some cases it can be desirable that the power amplitude relationship provides two split signals of same or similar power amplitudes. In some cases it can be desirable to minimize power loss (e.g. insertion loss) during such splitting of the RF signal in two signals, so that the combined power of the two signals is substantially the same (e.g. within 2 dB) as the power of the RF signal. An exemplary embodiment of such splitting function is provided by a hybrid coupler, which as known to the person skilled in the art uses transmission line properties at RF frequencies to divide (e.g. split) an input RF signal of a given power amplitude in two signals of a same power amplitude (e.g. half the power amplitude of the input RF signal) and a desired fixed phase relationship. In some cases, such signals obtained by splitting an RF signal can be used to drive different amplifiers whose outputs can be combined to provide an output RF signal with a desired characteristic, such as, for example, in a case of a Doherty amplifier. The Doherty amplifier may use two signals in quadrature (e.g. 90° phase difference between the two signals) to feed each of its two constituent amplifiers, the carrier amplifier and the peaking amplifier, where the signal feeding the peaking amplifier is at 90° phase with respect to the signal feeding the carrier amplifier. Given the fixed phase relationship between the signals feeding the two constituent amplifiers of the Doherty amplifier, an input RF signal to the latter amplifier can be split using a hybrid coupler, so that each output of the hybrid coupler is connected to a specific constituent amplifier input, and therefore physically linking the outputs of the coupler and the inputs of the constituent amplifiers and thereby imposing certain design and layout rules for a corresponding circuital implementation. More information about a Doherty power amplifier can be found, for example, in reference [1], which is a paper by W. H. Doherty: "A new High-Efficiency Power Amplifier for Modulated Waves", presented before the Annual Convention of the Institute of Radio Engineers, May 11-13, 1936, at Cleveland, Ohio, which is incorporated herein by reference in its entirety.

SUMMARY

By programmatically controlling a phase relationship between two RF signals of a power divider, such as for example, reversing the phase relationship (e.g. same absolute phase difference but opposite sign), added flexibility in usage of the power divider can be obtained. In some embodiments, such RF signals can be obtained via splitting of an input RF signal of a given power amplitude. In some embodiments such split RF signals can have a same power amplitude based on the power amplitude of the input RF signal. For example, in the exemplary case of the Doherty amplifier fed by a hybrid coupler discussed in the previous section of the present application, programmability of the output signals of the hybrid coupler can relax the amount of discrete tuning at a final manufacturing and test phase of the Doherty amplifier. Such programmability can be provided by a power splitter with programmable output phase shift as presented in the various embodiments of the present disclosure.

According to a first aspect of the present disclosure, an integrated circuit (IC) device configured for operation within a desired operating frequency range is presented, the IC device comprising: an input port configured to receive an input radio frequency (RF) signal; a first output port configured to output a first output RF signal based on the input RF signal; and a second output port configured to output a second output RF signal based on the input RF signal, wherein during operation within the desired operating frequency range and with respect to an input power level of the input power signal: the IC device is configured to operate in one of two modes of operation: a first mode of operation and a second mode of operation, a power of the first output RF signal in the first mode of operation is equal to a power of the first output RF signal in the second mode of operation, a power of the second output RF signal in the first mode of operation is equal to a power of the second output RF signal in the second mode of operation, a sum of the power of the first output RF signal and the power of the second output RF signal is constant, and a relative phase of the first output RF signal to the second output RF signal in the first mode of operation, ΔPhase_m1, is opposite of a relative phase of the first output RF signal to the second output RF signal in the second mode of operation, ΔPhase_m2, such that ΔPhase_m1=−ΔPhase_m2.

According to a second aspect of the present disclosure, an integrated circuit (IC) device configured for operation within a desired operating frequency range is presented, the IC device comprising: an input port configured to receive an input radio frequency (RF) signal; a first output port configured to output a first output RF signal based on the input RF signal; and a second output port configured to output a second output RF signal based on the input RF signal, wherein during operation within the desired operating frequency range and with respect to an input power level of the input RF signal: the IC device is configured to operate in one of two modes of operation: a first mode of operation and a second mode of operation, a power of the first output RF signal in the first mode of operation is equal to a power of the first output RF signal in the second mode of operation, a power of the second output RF signal in the first mode of operation is equal to a power of the second output RF signal in the second mode of operation, a sum of the power of the first output RF signal and the power of the second output RF signal is constant, and an absolute value of a difference between a relative phase of the first output RF signal to the second output RF signal in the first mode of operation, ΔPhase_m1, and a relative phase of the first output RF signal to the second output RF signal in the second mode of operation, ΔPhase_m2, is a desired phase offset, K, such that |ΔPhase_m1|−|ΔPhase_m2|=K.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 12A and 12B depict a switched branchline architecture according to an embodiment of the present disclosure that integrates a power splitter and a programmable phase shift.

DETAILED DESCRIPTION

Figure 1:
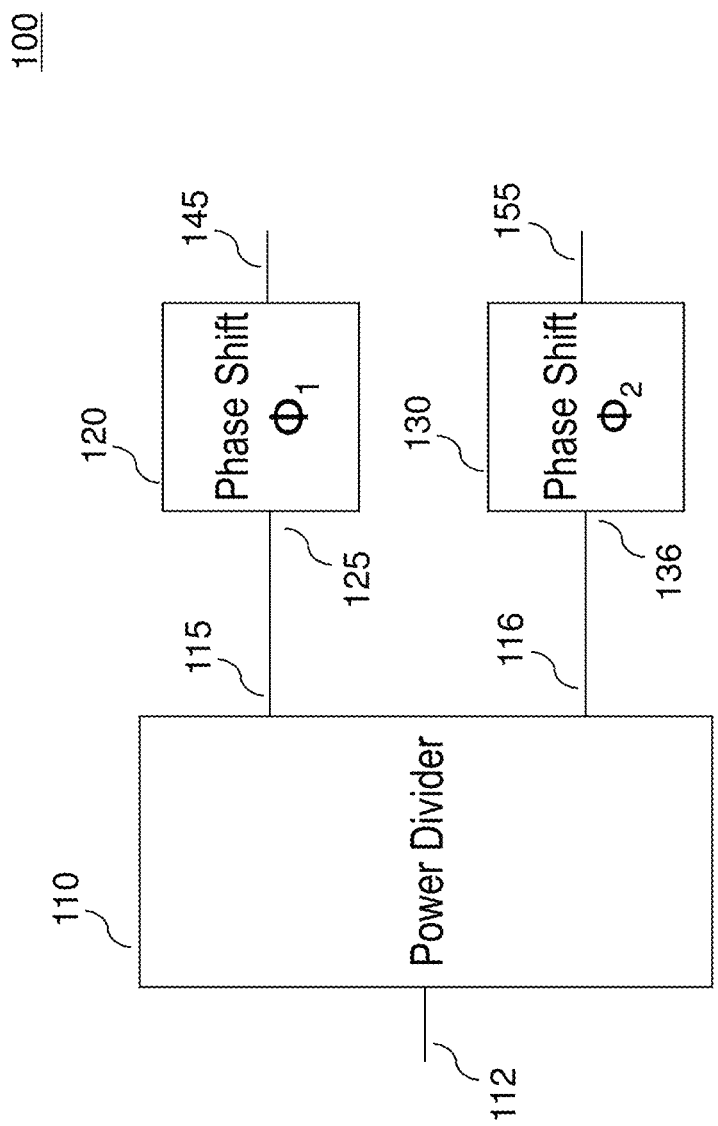
FIG. 1 shows a power splitter with fixed output phase shift.

Splitting of an RF signal into two signals of known power amplitudes and with a desired phase relationship can be performed using a two stage approach, as depicted by the block diagram in FIG. 1. In a first stage of the block diagram depicted in FIG. 1, an input RF signal of a given power amplitude can be divided into two signals of known power amplitudes based on the power amplitude of the input RF signal, via a power divider module (110). Such power divider module (110) can have a single input terminal (112) for providing the input RF signal and two output terminals for outputting the split RF signals (115, 116) based on the input RF signal provided at the input terminal (112). In some cases, the split RF signals can have a nearly same power amplitude (e.g. within 1 dB) and a zero phase difference between each other, which can be expressed as ΔPhase=0. In some cases and based on the internal architecture of the power divider module (110), the split RF signals at output terminals (115, 116) can have a fixed phase difference with respect to the input RF signal at the input terminal (112). Such fixed phase difference can be zero, negative or positive. According to some embodiments, the power divider module (110) can be a Wilkinson power divider as known to the person skilled in the art. More information about a Wilkinson power divider can be found, for example, in reference [2], which is a paper by Ernest J. Wilkinson: "An N-Way Hybrid Power Divider", published in the January 1960 edition of the IRE Transactions on Microwave Theory and Techniques, which is incorporated herein by reference in its entirety.

With further reference to the exemplary embodiment of FIG. 1, a desired phase relationship between the split RF signals output by the power divider module (110) can be provided by feeding each of the split RF signals at output terminals (115, 116) of the power divider module (110) to a phase shift module (120, 130). Accordingly, the RF signal at output terminal (115) of the power divider module (110) is fed to input terminal (125) of the phase shift module (120) which engenders a corresponding phase-shifted RF signal at the output terminal (145) of the phase shift module (120).

The phase difference between the RF signal at the input terminal (125) of the phase shift module (120) and the output terminal of said module is fixed and dependent on the internal circuital implementation of the phase shift module (120) Likewise, the RF signal at output terminal (116) of the power divider module (110) is fed to input terminal (136) of the phase shift module (130) which engenders a corresponding phase-shifted RF signal at the output terminal (155) of the phase shift module (130). The phase difference between the RF signal at the input terminal (136) of the phase shift module (130) and the output terminal of said module is fixed and dependent on the internal circuital implementation of the phase shift module (130).

By denoting $\Phi_1$ the phase shift provided by the phase shift module (120) and $\Phi_2$ the phase shift provided by the phase shift module (130), the absolute value of the phase difference, ΔPhase, between the two RF signals at output terminals (145, 155) can be provided by the expression |ΔPhase|=|$\Phi_1$-$\Phi_2$|. In some exemplary embodiments, each phase shift module (120, 130) can have a similar reduced power attenuation (e.g. insertion loss). In some exemplary embodiments, power attenuation of the phase shift modules (120, 130) can be within 1 dB of each other. This means that a power of an RF signal at an output terminal (145, 155) of the phase shift module (120, 130) can be nearly the same as a power of an RF signal at an input terminal (125, 136) of the corresponding phase shift module.

The person skilled in the art readily understands the concept of power loss of an RF signal through a circuital arrangement (e.g. at a corresponding input/output) and various methods for calculating such power loss and various corresponding units for measuring/expressing such power loss (e.g. percentage, decibels, absolute, relative, etc.). The person skilled in the art also knows that the notion of power loss and phases shift may be associated to a frequency of operation of a corresponding/affected signal, such as, for example, the phase shift ($\Phi_1$, $\Phi_2$) of the phase shift modules (120, 130) and/or the power of the split RF signals provided by the power divider module (110) may be constant for a given frequency range of a corresponding RF signal and may vary for frequencies outside of said range. The various circuital arrangements presented in the present disclosure are therefore designed to operate at a desired frequency range (e.g. contained within the frequencies of 100 MHz to 100 GHz) corresponding to a desired frequency of operation of an RF signal, and within which frequency range the circuital arrangements provide a desired frequency response such as to affect the RF signal's power attenuation and phase shift according to a desired characteristic. Such characteristic can be, for example, for the case of the power divider module (110), a fixed and equal phase shift and power attenuation for each of the split signals, and for the case of the phase shift modules (120, 130), a fixed and opposite phase shift (e.g. $\Phi_1$=-$\Phi_2$) with a fixed reduced power attenuation. In some embodiments, the fixed reduced power attenuation of the two phase shift modules (120, 130) can be nearly equal (e.g. within 1 dB).

Figure 2A:
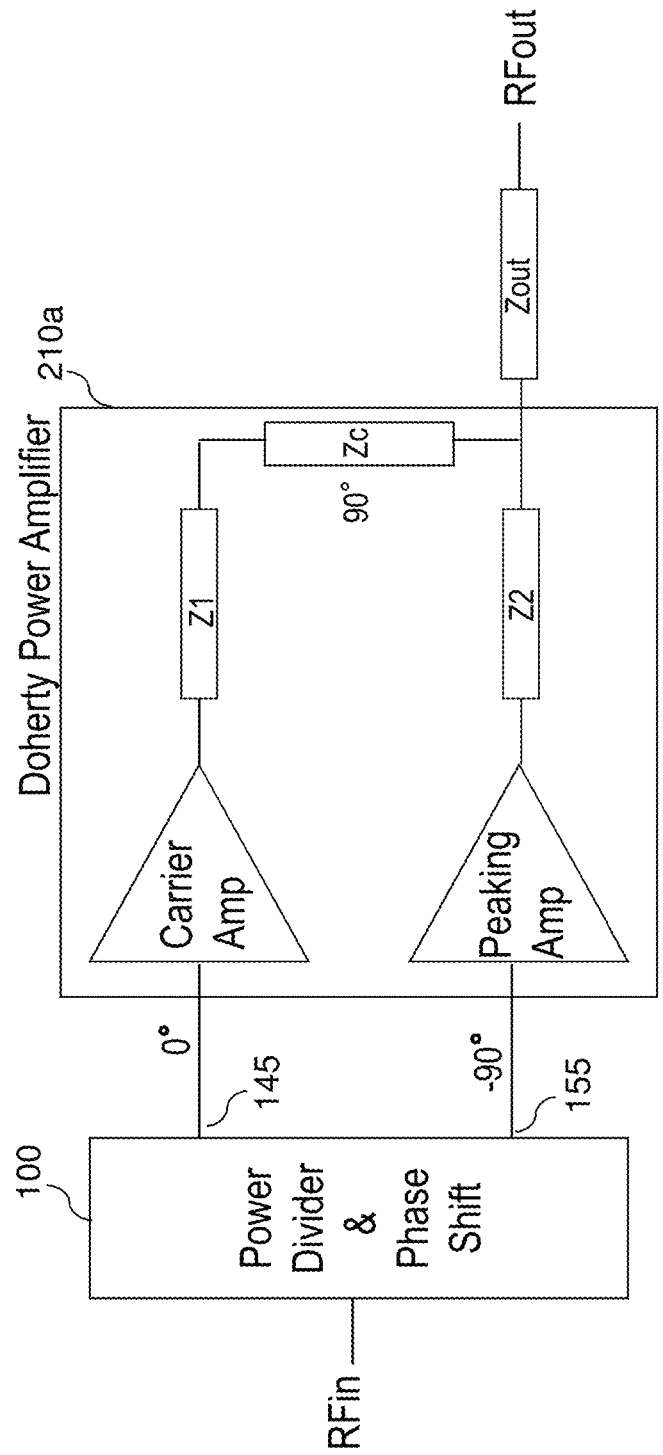
FIGS. 2A-2B show an exemplary implementation of a Doherty power amplifier as known in the art.
Figure 2B:
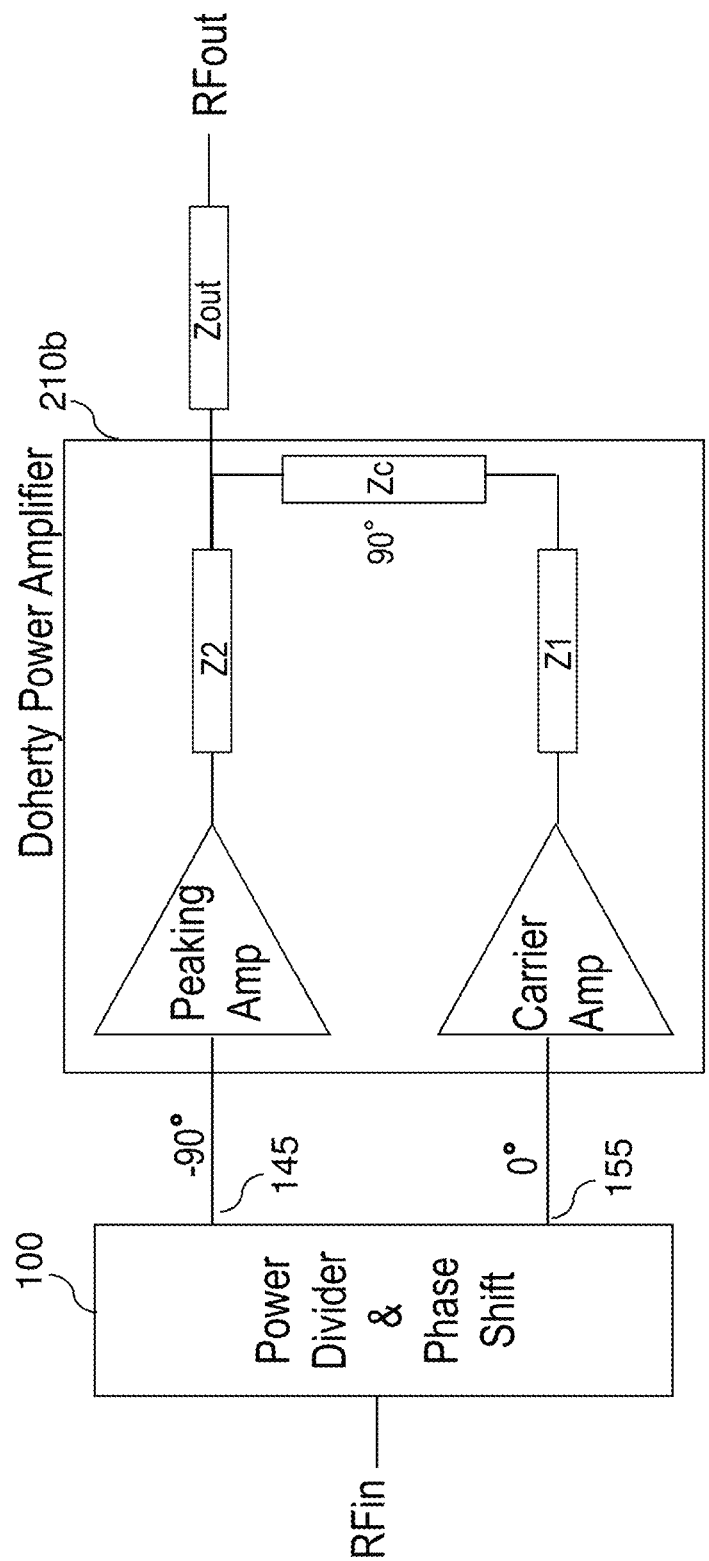
Figure 3:
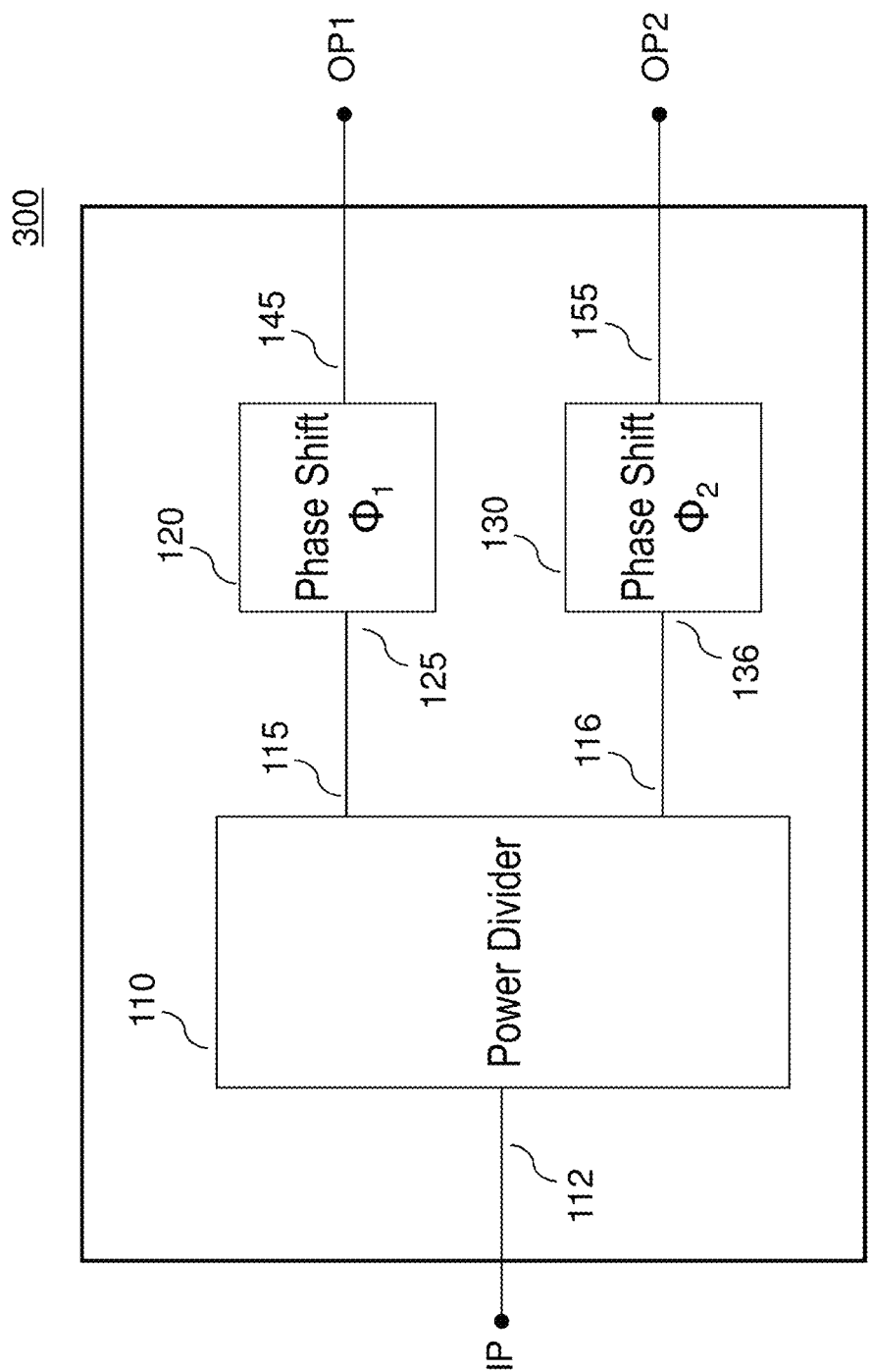
FIG. 3 shows an integrated chip device which performs the function of power splitter with fixed output phase shift.

With continued reference to FIG. 1, by designing the phase shift modules (120, 130) so as to provide a phase shift $\Phi_1$=-$\Phi_2$, the phase difference between the RF signals at terminals (145, 155) can therefore be provided by the expression |ΔPhase|=|$\Phi_1$-$\Phi_2$|=2 KN. In an exemplary case of a Doherty amplifier configuration, the required equal power split and 90° phase difference between the two split signals can be provided by the circuit represented by the block diagram of FIG. 1, where $\Phi_1$=-$\Phi_2$=+45° and therefore |ΔPhase|=|$\Phi_1$-$\Phi_2$|=2|$\Phi_1$|=90°. In such Doherty amplifier configuration, a first RF signal at output terminal (145) is connected to the input of the carrier amplifier of the Doherty amplifier configuration, and a second RF signal at output terminal (155), which lags the first RF signal by 90° (denoted as −90°), is connected to the input of the peaking amplifier of the Doherty amplifier configuration, as depicted in FIG. 2A. Alternatively, for a case where $\Phi_1$=-$\Phi_2$=-45°, and therefore the first RF signal at output terminal (145) lags the second RF signal at output terminal (155) by 90°, the inputs to the carrier amplifier and the peaking amplifier of the Doherty amplifier configuration are reversed, such as depicted in FIG. 2B. For a given phase relationship between the first and the second RF signals (e.g. −90°, +90°), an optimized layout of a corresponding circuital implementation for the Doherty amplifier configuration using the circuital arrangement whose block diagram is depicted in FIG. 1 (e.g. as seen in FIG. 3, later described) can take into account the required connections between the inputs of the constituent amplifiers (e.g. carrier, peaking) and the output terminals (145, 155) of the phase shifter modules (120, 130). Such optimized layout can be different for a case where the first signal leads the second and for an opposite case. This is depicted in FIGS. 2A and 2B, where depending on the phase relationship of the outputs (145, 155) of the power divider and phase shift module (100), a corresponding layout of the Doherty power amplifier (210a, 210b) can be different, and be made to better match the phase relationship of the outputs (145, 155). In a case where flexibility in layout of the Doherty amplifier is not provided, it can be advantageous to have a configurable output phase difference of the power divider and phase shift module (100), as presented in the various teachings according to the present disclosure and presented in the following sections.

FIG. 3 depicts an RF integrated circuit (IC) (300) which can comprise the circuitry to implement the block diagram depicted in FIG. 1. The integrated circuit depicted in FIG. 3 can have an input port denoted (IP) which internally to the IC can connect to the input terminal (112) of the power divider module (110), and two output ports denoted (OP1, OP2) which can internally to the IC be connected to the output terminals (145, 155) of the phase shift modules (120, 130) respectively. For a given design of the circuitry of the IC (300), the phase relationship between RF signals at the (OP1, OP2) ports is fixed. As described in the prior section of the present disclosure, such fixed phase relationship can affect usage of such IC in an RF system. The RF IC depicted in FIG. 3 can therefore be referred to as an RF power splitter with fixed output phase shift.

Figure 4:
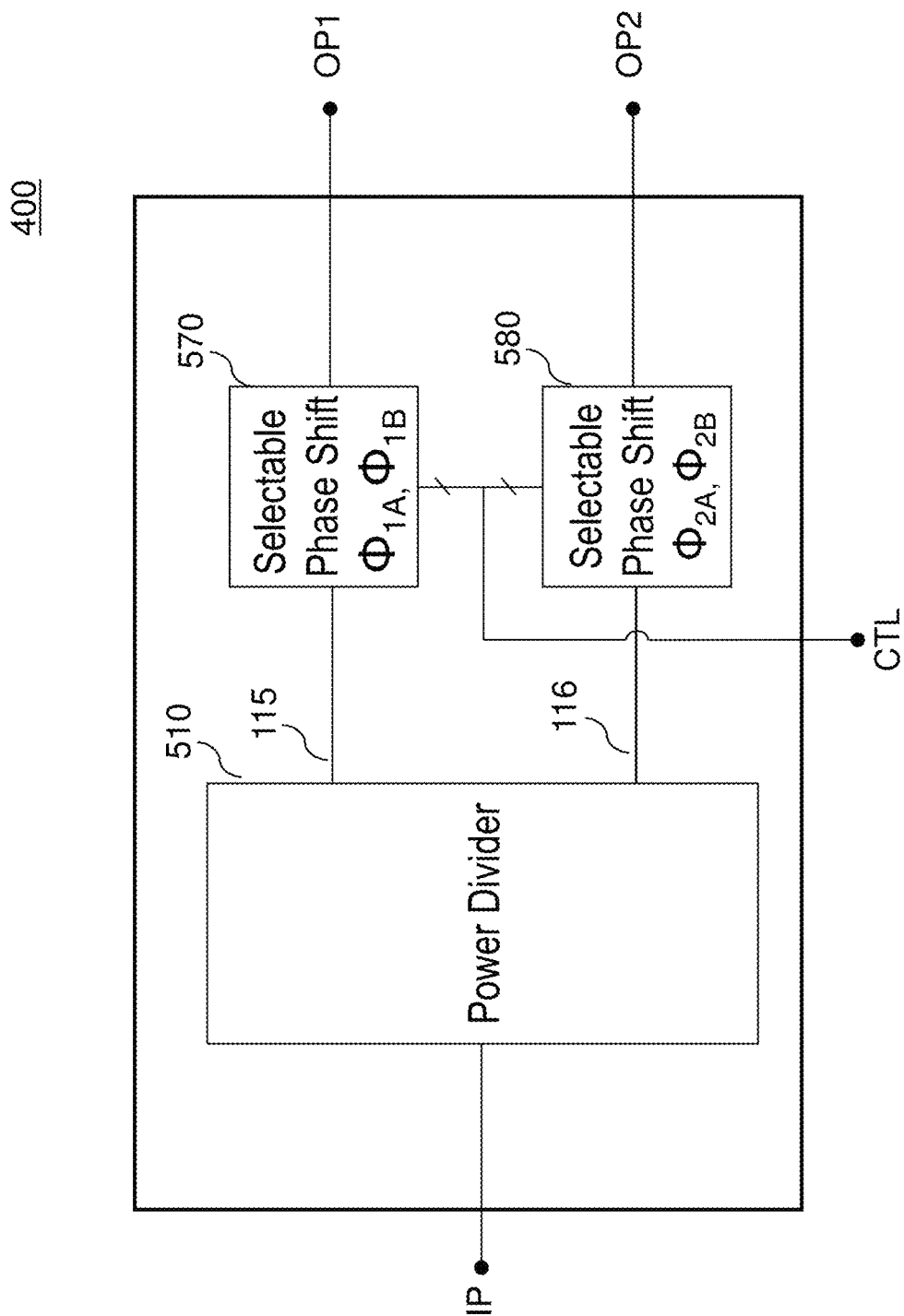
FIG. 4 shows an integrated chip device according to an embodiment of the present disclosure which performs the function of power splitter with programmable output phase shift.

According to an embodiment of the present disclosure, FIG. 4 depicts an RF power splitter with programmable output phase shift integrated circuit (400). Such programmable phase shift can define a phase difference between an output RF signal at first output port (OP1) and an output RF signal at a second output port (OP2) of the IC (400). Such phase difference can be controlled by a control signal (CTL) provided to the IC (400). According to one embodiment of the present disclosure the control signal (CTL) can be a digital control signal representing a digital word in correspondence of a desired phase difference. In an exemplary embodiment according to the present disclosure, a first digital word can configure the IC (400) to output a first output RF signal at (OP1) and a second output RF signal at (OP2) with a desired phase difference (e.g. relative phase) value between a phase of the first and a phase of the second output signal. A second digital word can configure the IC (400) to switch the relative phase of the two signals to the opposite value while maintaining the power of the two output RF signals (e.g. power at each of OP1 and OP2 is maintained irrespective to the relative phase). The person skilled in the art readily appreciates some benefits provided by the IC (400), such as, for example, an added flexibility in system design and layout using such IC. It should be noted that the power divider unit (510) can provide two split signals of same or different power amplitudes at output terminals (515, 516) based on the power amplitude of the input RF signal provided at the input port (IP) of the IC (400). Such split signals of same or different power amplitudes can be obtained, for example, by providing a different power divider ratio of the power divider unit used, or by providing a different insertion loss corresponding to the desired power amplitudes for each signal path of the two split signals. The person skilled in the art readily knows of various design implementations for obtaining the desired power amplitudes of the split signals via a power divider unit, and use such design in the teachings of the present disclosure.

Figure 5A:
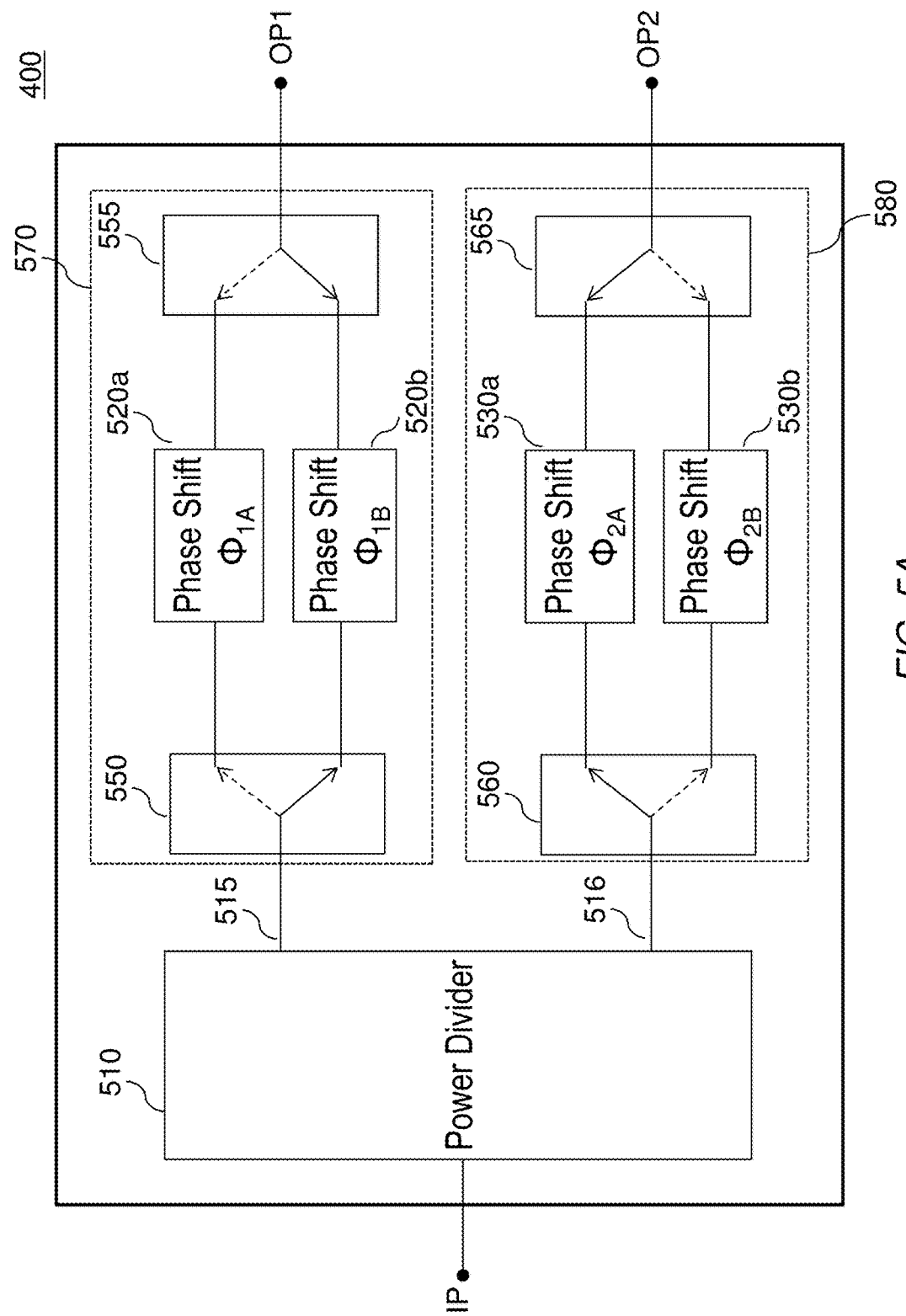
FIGS. 5A-5B show an exemplary functional block diagram according to an embodiment of the present disclosure of the integrated chip device depicted in FIG. 4.
Figure 5B:
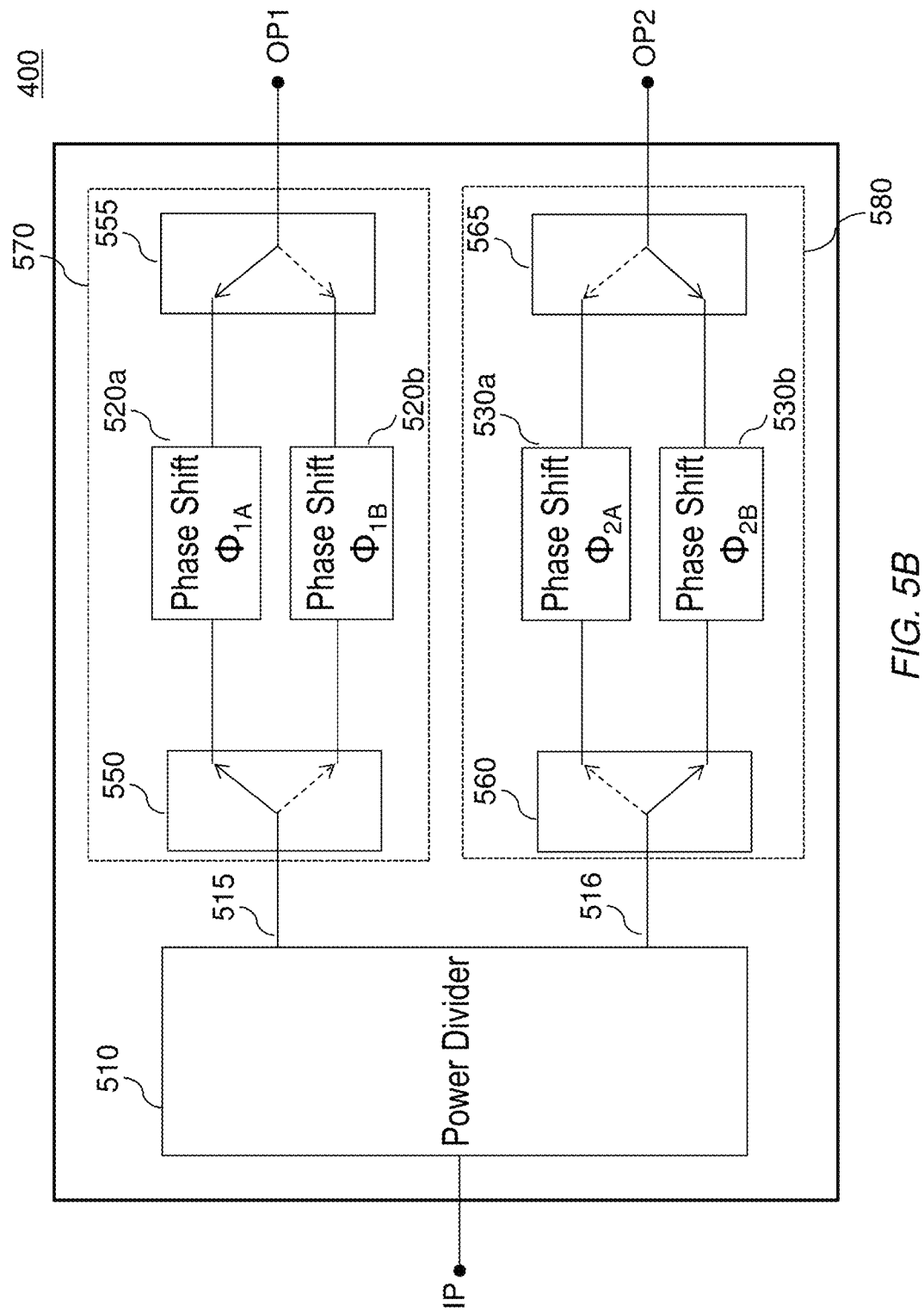

FIGS. 5A-5B depict an exemplary block diagram according to a further embodiment of the present disclosure corresponding to a circuital implementation of the IC (400). As depicted in the block diagram of FIGS. 5A-5B, switches (550, 555, 560, 565) are used to switch various phase shift modules (520a, 520b, 530a, 530b) similar to phase shift modules (120, 130) in/out a conduction path of each of the two power split RF signals provided by a power divider module (510) similar to the power divider module (110) of FIG. 1. For example, in a first mode of operation of the circuit represented by the block diagram of FIG. 5A, switches (550, 555) can be configured to provide a conduction path to a first split output RF signal at an output terminal (515) of the power divider module (510) that passes through a phase shift module (520b) and then to the output port (OP1) of the IC (400). In the same first mode of operation of the circuit represented by the block diagram of FIG. 5A, switches (560, 565) can be configured to provide a conduction path to a second split output RF signal at an output terminal (516) of the power divider module (510) that passes through a phase shift module (530a) and then to the output port (OP2) of the IC (400). In a similar manner, an exemplary second mode of operation of the circuit as represented by the block diagram of FIG. 5B, switches (550, 555) can be configured to provide a conduction path to a first split output RF signal at an output terminal (515) of the power divider module (510) that passes through a phase shift module (520a) and then to the output port (OP1) of the IC (400). In the same second mode of operation of the circuit represented by the block diagram of FIG. 5B, switches (560, 565) can be configured to provide a conduction path to a second split output RF signal at an output terminal (516) of the power divider module (510) that passes through a phase shift module (530b) and then to the output port (OP2) of the IC (400). For clarity reasons, the control signal (CTL) is not shown in the block diagram of FIGS. 5A-5B. The control signal (CTL) can be connected to the switches (550, 555, 560, 565) to control the ON/OFF state of such switches according to a desired mode of operation and therefore control the relative phase between RF signals at (OP1, OP2) output ports.

A person of ordinary skills readily realizes that in each of the first mode of operation and the second mode of operation the block diagram of FIG. 4 (and as seen in FIGS. 5A-5B) provides a substantially same set of connections (e.g. conduction path between an input RF and an output RF) as provided by the block diagram depicted in FIG. 1. Therefore and based on the discussion provided in the previous sections of the present disclosure as related to FIGS. 1 and 3, phase relationships between the output RF signals at output ports (OP1, OP2) of IC (400) can be readily derived.

With further reference to such first/second modes of operation and denoting ($\Phi_{1A}$, $\Phi_{2A}$, $\Phi_{2B}$) phase shift values of the phase shift modules (520a, 520b, 530a, 530b), when configured to operate in the first mode, the relative phase difference between the phase of the output RF signal at output port (OP1) and the phase of the output RF signal at output port (OP2) can be provided by the expression $\Delta Phase\_m1 = \Phi_{2A} - \Phi_{1B}$, and when configured to operate in the second mode, such relative phase difference can be provided by the expression $\Delta Phase\_m2 = \Phi_{2B} - \Phi_{1A}$.

According to an exemplary embodiment of the present disclosure, phase shift values ($\Phi_{1A}$, $\Phi_{1B}$, $\Phi_{2A}$, $\Phi_{2B}$) can be chosen such as $\Phi_{1A} = -\Phi_{1B}$, and $\Phi_{2A} = -\Phi_{2B}$, and therefore $\Delta Phase\_m1 = \Phi_{2A} = \Phi_{1B}$, and $\Delta Phase\_m2 = \Phi_{2B} - \Phi_{1A} = -\Phi_{2A} = \Phi_{1B} = -\Delta Phase\_m1$. Such exemplary embodiment according to the present disclosure with $\Phi_{1A} = -\Phi_{1B}$, and $\Phi_{2A} = -\Phi_{2B}$ can provide opposite relative phase shifts based on a selected mode of operation (e.g. first/second mode).

According to a further exemplary embodiment of the present disclosure, opposite relative phase shifts based on a selected mode of operation can be provided by choosing $\Phi_{1A} = \Phi_{2A}$, and $\Phi_{1B} = \Phi_{2B}$, and therefore $\Delta Phase\_m1 = \Phi_{2A} - \Phi_{1B} = \Phi_{1A} - \Phi_{1B}$, and $\Delta Phase\_m2 = \Phi_{2B} - \Phi_{1A} = \Phi_{1B} - \Phi_{1A} = -\Delta Phase\_m1$.

According to yet further exemplary embodiments of the present disclosure, the phase shift values ($\Phi_{1A}$, $\Phi_{1B}$, $\Phi_{2A}$, $\Phi_{2B}$) can be chosen to satisfy the equation $\Delta Phase\_m2 = -\Delta Phase\_m1$. The person skilled in the art realizes that such equation possesses infinite number of values for the phase shifts ($\Phi_{1A}$, $\Phi_{1B}$, $\Phi_{2A}$, $\Phi_{2B}$), including values where $|\Phi_{1A}| \neq |\Phi_{2A}| \neq |\Phi_{1B}| \neq |\Phi_{2B}|$. For example, ($\Phi_{1A}$, $\Phi_{1B}$, $\Phi_{2A}$, $\Phi_{2B}$) = (60, 30, 50, 40) is one possible solution for $\Delta Phase\_m2 = -\Delta Phase\_m1 = -20°$, and ($\Phi_{1A}$, $\Phi_{1B}$, $\Phi_{2A}$, $\Phi_{2B}$) = (70, 10, 30, 50) is yet another solution for same relative phase output of $-20°$.

The various embodiments according to the present disclosure allow for the flexibility to choose the phase shift values ($\Phi_{1A}$, $\Phi_{1B}$, $\Phi_{2A}$, $\Phi_{2B}$) in a manner suitable to other related design parameters (e.g. related to filters (520a, 520b, 530a, 530b)) while keeping a constraint related to the phase difference between signals at the output ports (OP1, OP2), such as, for example, $\Delta Phase\_m2 = -\Delta Phase\_m1$. According to some embodiments of the present disclosure, and as previously noted, the absolute value of the phase difference between signals at the output ports (OP1, OP2) can be constant in the first and the second modes of operation, such as $|\Delta Phase\_m1| = |\Delta Phase\_m2|$. According to further embodiments of the present disclosure, the absolute value of the phase difference of signals at the output ports (OP1, OP2) in the first mode of operation can be offset by a desired phase offset value with respect to the absolute value of the phase difference of the signals at the output port (OP1, OP2) in the second mode of operation, as expressed by: $|\Delta Phase\_m1| - |\Delta Phase\_m2| = K$, where K is the desired phase offset value. According to some embodiments the value of K can be any value comprised in a range of 0° to 180°.

In each of the two modes of operations, a conduction path provided to an input RF signal at the input terminal of the power divider module (510), can include conduction paths associated to the switches (550, 555, 560, 565). For example, in the first mode of operation, the input RF signal can have two distinct conduction paths for each of the first output RF signal at the (OP1) port and the second output RF signal at the (OP2) port. The first conduction path can include items (510, 550, 520b, 555) and the second conduction path can include items (510, 560, 530a, 565). Switches (550, 555, 560, 565) can be chosen to have a negligible effect on an RF signal through a corresponding conduction path at a frequency/band of operation of the RF signal, such as, for example, a power loss and/or a phase shift of the RF signal due to a switch (550, 555, 560, 565) can be negligible.

By way of further example and not limitation, switches (550, 555, 560, 565) and/or other switches used for implementation of the various embodiments according to the present disclosure of a power splitter with programmable output phase shift can be implemented using transistors, stacked transistors (FETs), diodes, or any other devices or techniques known to or which can be envisioned by a person skilled in the art. In particular, such switching circuitry can be constructed using CMOS technology and various architectures known to the skilled person, such as, for example, architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both incorporated herein by reference in their entirety.

Figure 6A:
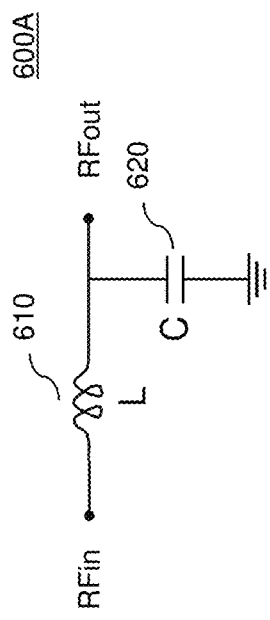
FIGS. 6A-6B show a low pass filter and a high pass filter which according to exemplary embodiments of the present disclosure can be used as phase shift modules.
Figure 6B:
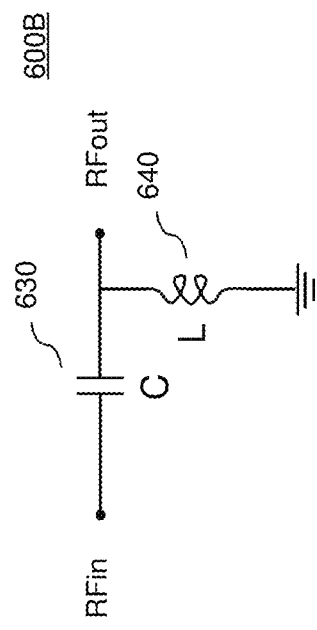

According to an embodiment of the present disclosure, the phase shift modules (520a, 520b, 530a, 530b) can be designed using various types of filters. The person skilled in the art is well aware of design techniques for implementing filters operative at RF frequencies (e.g. 100 MHz to 100 GHz) with given amplitude and phase responses. By way of example and not limitation, such filter circuits can be designed using lumped elements models when a frequency band of operation (e.g. wavelength) is much larger than the circuits' length (e.g. characteristic length). FIGS. 6A-6B depicts exemplary filter architectures using lumped elements components for use as phase shift modules.

The phase shift module represented by the second order low pass filter (600A) of FIG. 6A can provide a negative phase shift to an output RF signal (RFout) with respect to an input RF signal (RFin), whereas the phase shift module represented by the second order high pass filter (600B) of FIG. 6B can provide a positive phase shift to an output RF signal (RFout) with respect to an input RF signal (RFin). The person skilled in the art realizes that the second order filters depicted in FIGS. 6A-6B are one exemplary type of filter which can be used to provide a desired phase shift, and should not be considered as limiting the scope of the various teachings according to the present disclosure, as other type of filters (e.g. higher/lower order, T-type, π-type, as well pass band, all pass and band reject, as well as time delay circuits) known to the person skilled in the art can also be used. Furthermore, such filters can be time delay circuits, such as time delay circuits using constant-R networks or transmission lines of given lengths, which can provide, at a desired frequency band of operation, the desired phase delay. More information on time delay circuits using constant-R networks can be found, for example, in references [3] and [4], both of which are incorporated herein by reference in their entirety. Such filters (600A, 600B) can be chosen and configured such as to pass frequencies of interest (e.g. operating frequency band) with a reduced insertion loss and create a desired relative phase shift between the two filters that remains substantially constant within the frequencies of interest (e.g. a frequency band of operation), as depicted in FIGS. 6I and 6K later described. According to some exemplary embodiment of the present disclosure, such desired relative phase shift and a corresponding desired frequency band of operation can be defined by system specification which can therefore affect filters complexity (e.g. order of the filters). Given the current trends in cellular data transmission, some desired frequency bands can include the following frequency bands: 1.8-2.2 GHz, 2.3-2.7 GHz, 3.4-3.8 GHz and 5-12 GHz. In some cases it can be desirable to have a relative phase shift of the two filters to be within +/−10% of a target relative phase shift within the desired frequency band of operation. The present teachings can enable the person skilled in the art to design a power splitter with programmable output phase shift which can operate at any frequency band contained within the frequencies of 100 MHz to 100 GHz.

According to an embodiment of the present disclosure, capacitive elements (620, 630) and inductive elements (610, 640) of the filters (600A, 600B) can be chosen so as to provide a desired positive phase shift (e.g. filter 600B) and a desired negative phase shift (e.g. filter 600A) at a frequency band of operation. According to further embodiments of the present disclosure, difference between such positive phase shift and negative phase shift can provide a desired nearly constant phase difference across the entire frequency band of operation. It should be noted that such desired negative/positive phase shifts can be different (e.g. in absolute value) and yet provide a nearly constant phase difference over the frequency band of operation, as depicted, for example, in FIGS. 6G and 6I later described. In a case where the filters (600A, 600B) are time delay elements, at a given frequency, a corresponding phase delay is proportional to the time delay, as expressed by the equation:

Phase=Time_delay*360*Frequency and characteristics of the time delay elements can be chosen so as the desired relative phase shift (e.g. nearly constant phase difference) is provided by the two time delay elements within the desired frequency band of operation.

According to an exemplary embodiment of the present disclosure, by choosing such elements to provide a phase shift near −45° via the low pass filter (600A) and a phase shift near +45° via the high pass filter (600B) at the frequency band of operation and using filters (600A, 600B) as the phase shift modules (120, 130) of FIG. 3, in quadrature signals (e.g. 90° relative phase) can be obtained within the frequency band of operation at ports (OP1, OP2) of the IC (300) depicted in FIG. 3.

According to a further exemplary embodiment of the present disclosure, by using a low pass filter (600A) with −45° or near phase shift for the phase shift modules (520b, 530b) and a high pass filter (600B) with +45° or near phase shift for the phase shift modules (520a, 530a), in quadrature signals of opposite polarity can be obtained at ports (OP1, OP2) of the power splitter with programmable output phase shift IC (400) depicted in FIGS. 5A-5B, based on a selected mode of operation. During the first mode of operation depicted by switch settings (550, 555, 560, 565) of FIG. 5A, an RF signal output at port (OP2) leads an RF signal output at port (OP1) by 90°, and during the second mode of operation depicted by switch settings (550, 555, 560, 565) of FIG. 5B, the RF signal output at port (OP2) lags the RF signal output at port (OP1) by 90°.

Figure 6C:
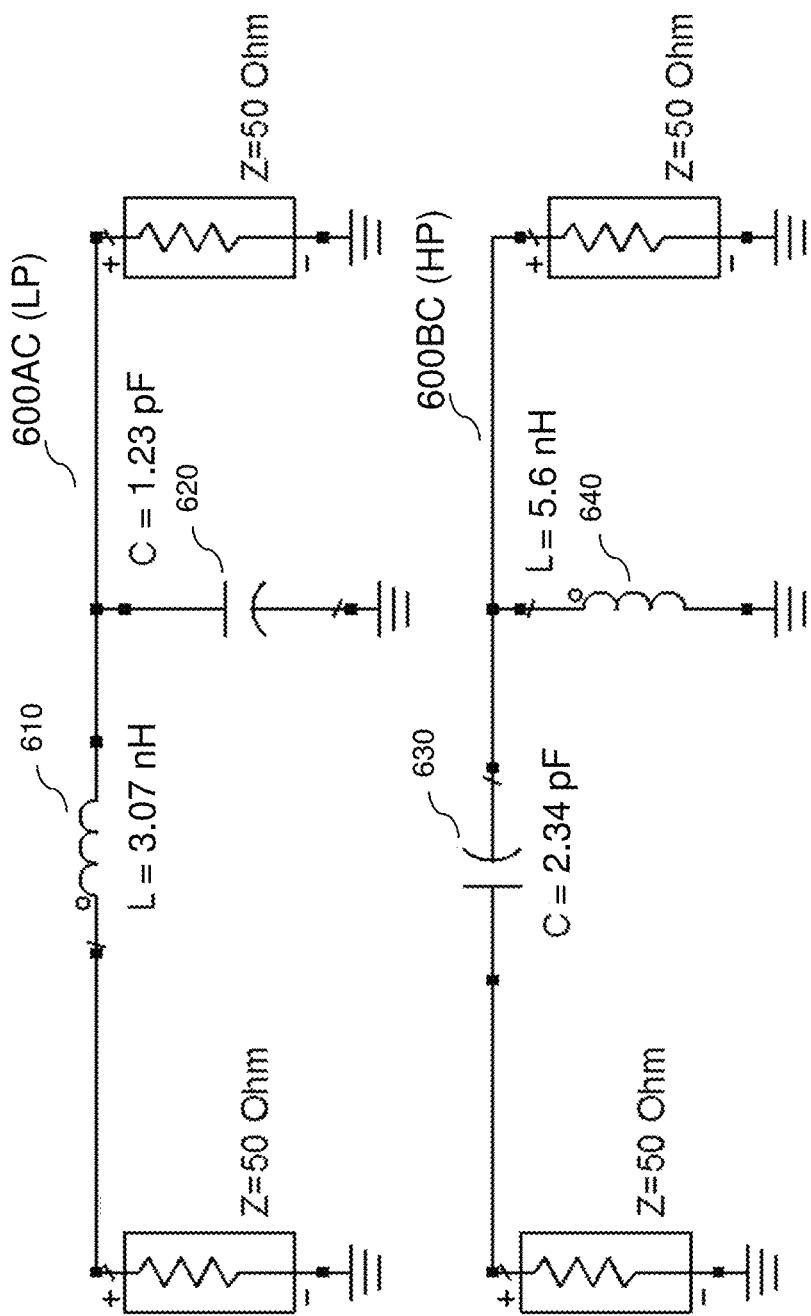
FIG. 6C shows an exemplary circuital implementation of the filters of FIGS. 6A and 6B with specific component values.

An exemplary second order low pass (LP) filter (600AC) and second order high pass (HP) filter (600BC) for providing −/+45° relative phase shift respectively (e.g. near −45° and near)+45° at an operating frequency band of 1.8-2.0 GHz are depicted in FIG. 6C via corresponding lumped elements components. Filters (600AC, 600BC) can be used as phase shift modules in the various power splitter with programmable output phase shift configurations according to the various embodiments of the present disclosure. Performance measurement for filters (600AC, 600BC) for application within a power splitter with programmable output phase shift according to the various embodiments of the present disclosure were performed by the applicants of the present disclosure for a case of same input/output impedance (e.g. 50 Ohm) at the filters input/output ports as depicted in FIG. 6C. Low pass filter (600AC) comprises a series inductor (610) of inductance (L) value of 3.07 nH and a shunted capacitor (620) of capacitance (C) value of 1.23 pF. High pass filter (600BC) comprises a series capacitor (630) of capacitance (C) value of 2.34 pF and a shunted inductor (640) of inductance (L) value of 5.6 nH. As known to a person skilled in the art, the capacitance (C) values and the inductance (L) values of the high pass and low pass filters (600BC, 600AC) may be modified to move a corresponding center frequency and characteristic impedance as may be required for other exemplary embodiments. The frequency scaling and impedance scaling can follow the known proportionality relationships:

$$Fc = \text{constant} * 1/\sqrt{(LC)} \text{ and } Zo = \text{constant} * \sqrt{(L/C)},$$

where Fc is a cut off frequency of the filter. Using such scaling technique can allow the person skilled in the art to design similar filters for RF signals operating within different frequency bands, such as, for example, a frequency band of [3.6 GHz, 4.0 GHz], [7.2 GHz, 8.0 GHz], etc. As mentioned in the above sections, the present teachings can enable the person skilled in the art to design a power splitter with programmable output phase shift which can operate at any frequency band contained within the frequencies of 100 MHz to 100 GHz, via usage of known filter design techniques, using either lumped element model and/or distributed element models (e.g. transmission lines).

Figure 6D:
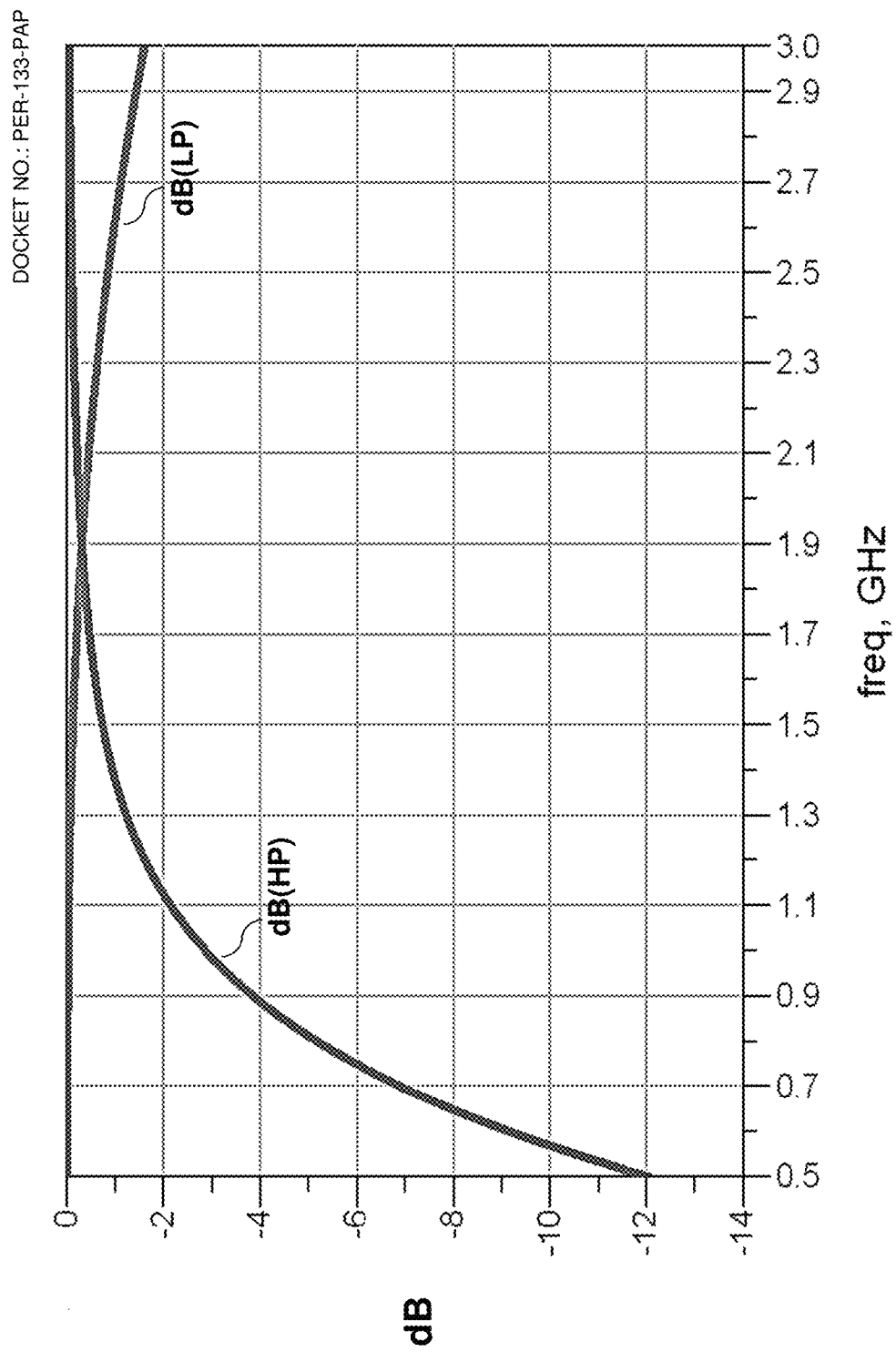
FIGS. 6D-6K show amplitude and phase response plots for an exemplary implementation of the phase shift modules depicted in FIGS. 6A-6B for a 90° relative phase shift at an operating frequency band of 1.8-2.0 GHz when measured with specific values and the configuration shown in FIG. 6C.
Figure 6E:
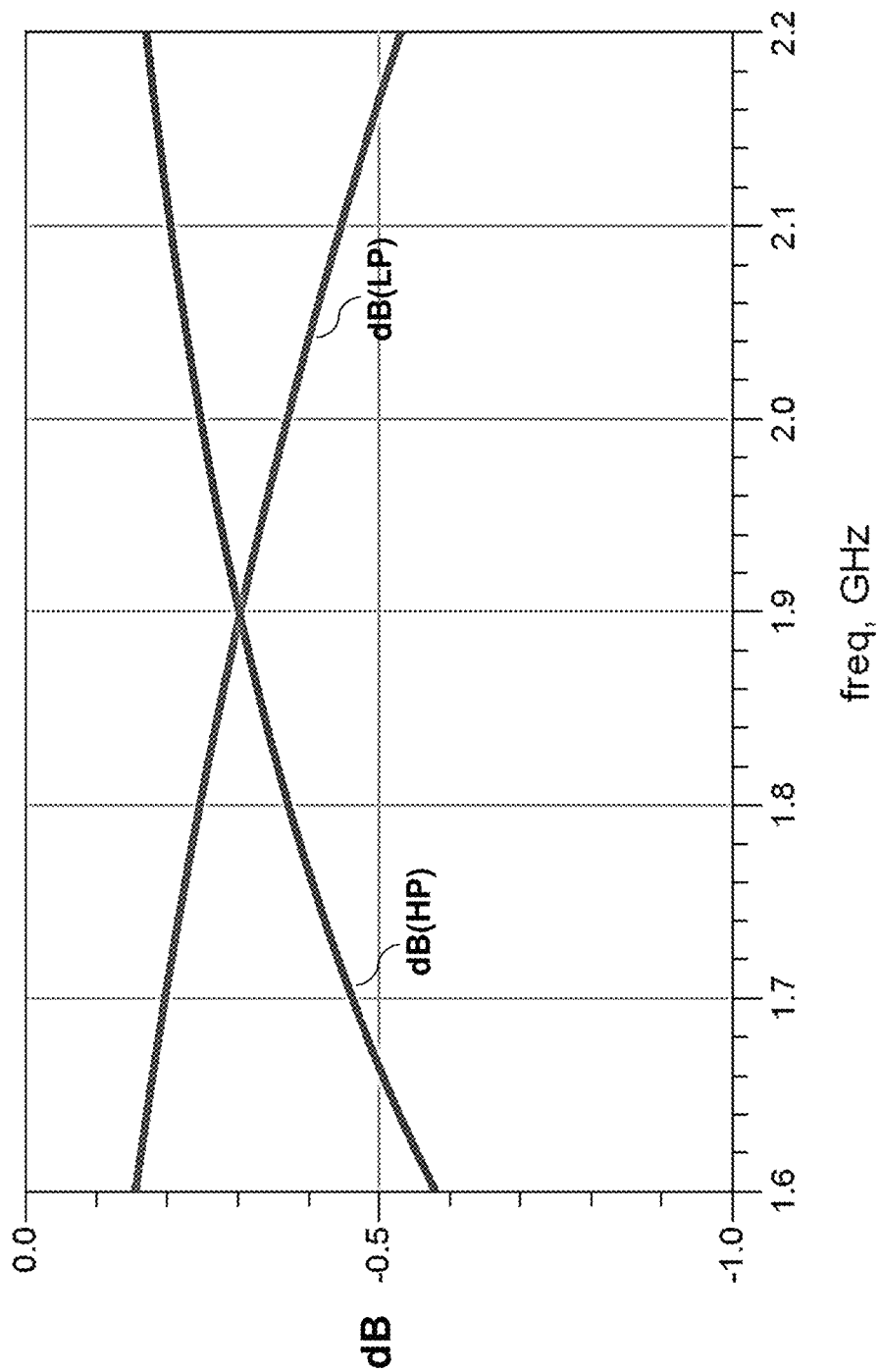

Frequency plots of the amplitude response (e.g. magnitude of ratio output_signal_amplitude/input_signal_amplitude) of the filters (600AC, 600BC) of FIG. 6C are depicted in FIGS. 6D and 6E where (LP, HP) are indicative of low pass and high pass (filter). The frequency plot depicted in FIG. 6E is a zoomed version of the frequency plot depicted in FIG. 6D around a target frequency band of operation (e.g. 1.8-2.0 GHz).

Figure 6F:
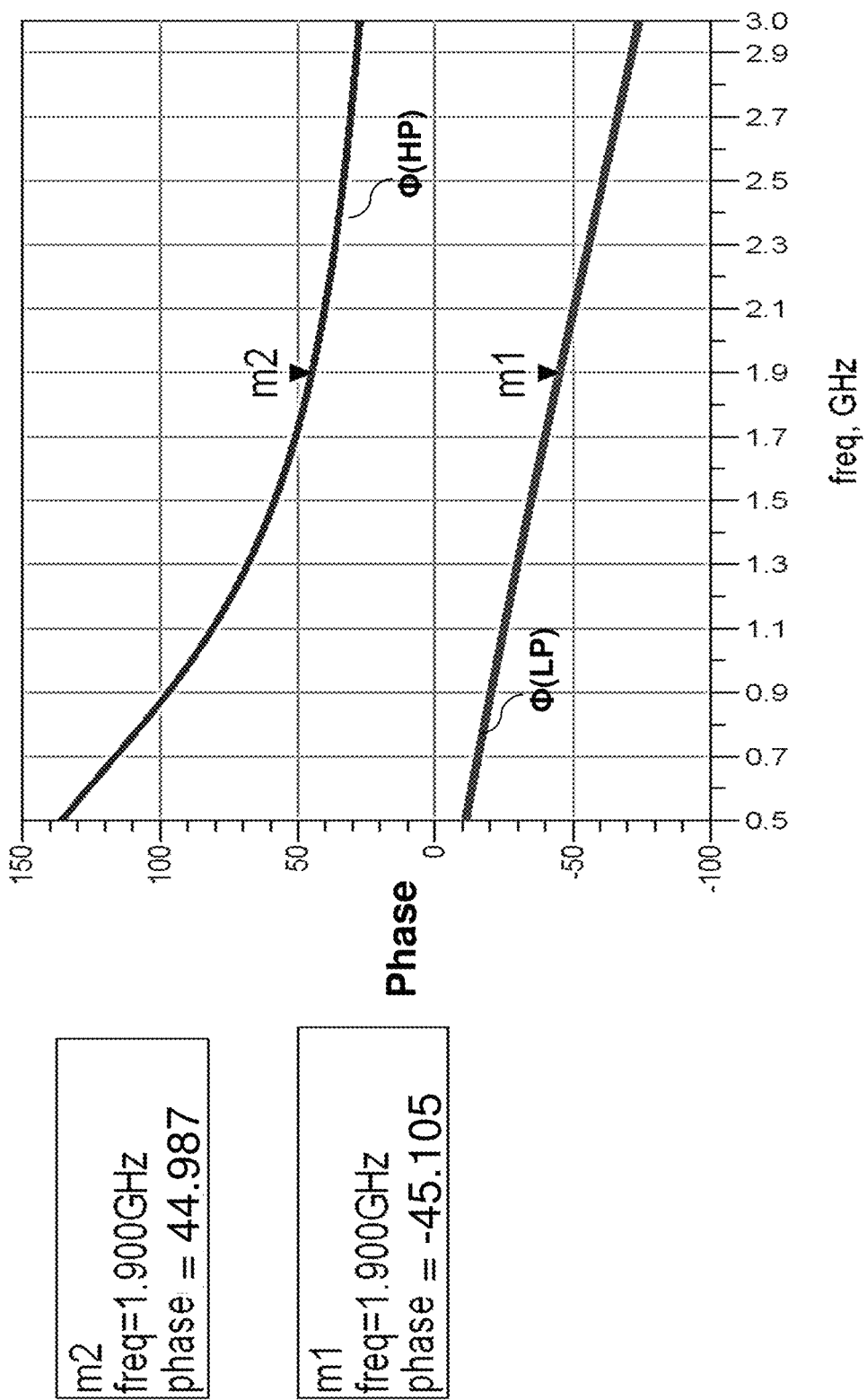
Figure 6G:
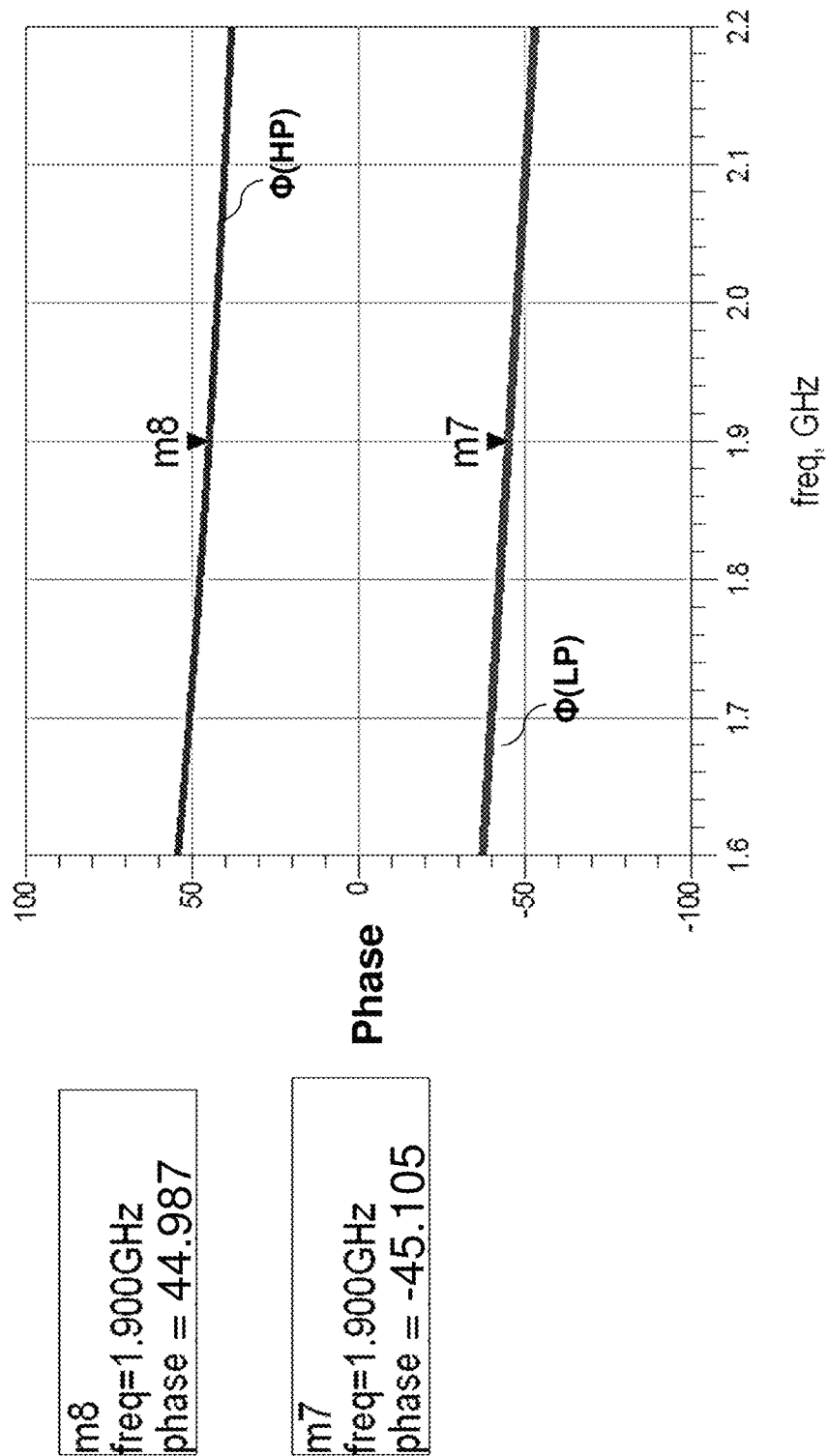
Figure 6H:
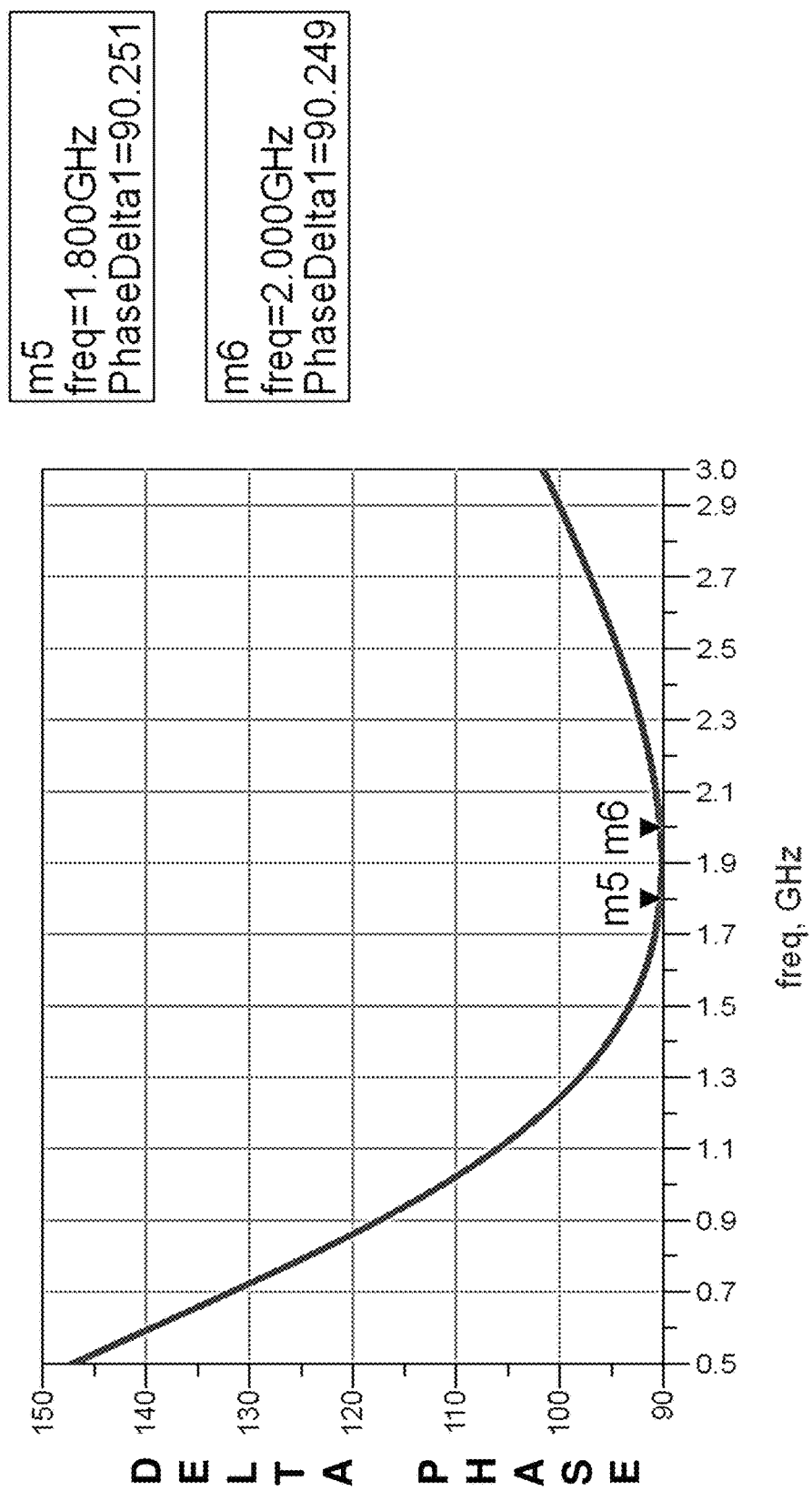
Figure 6I:
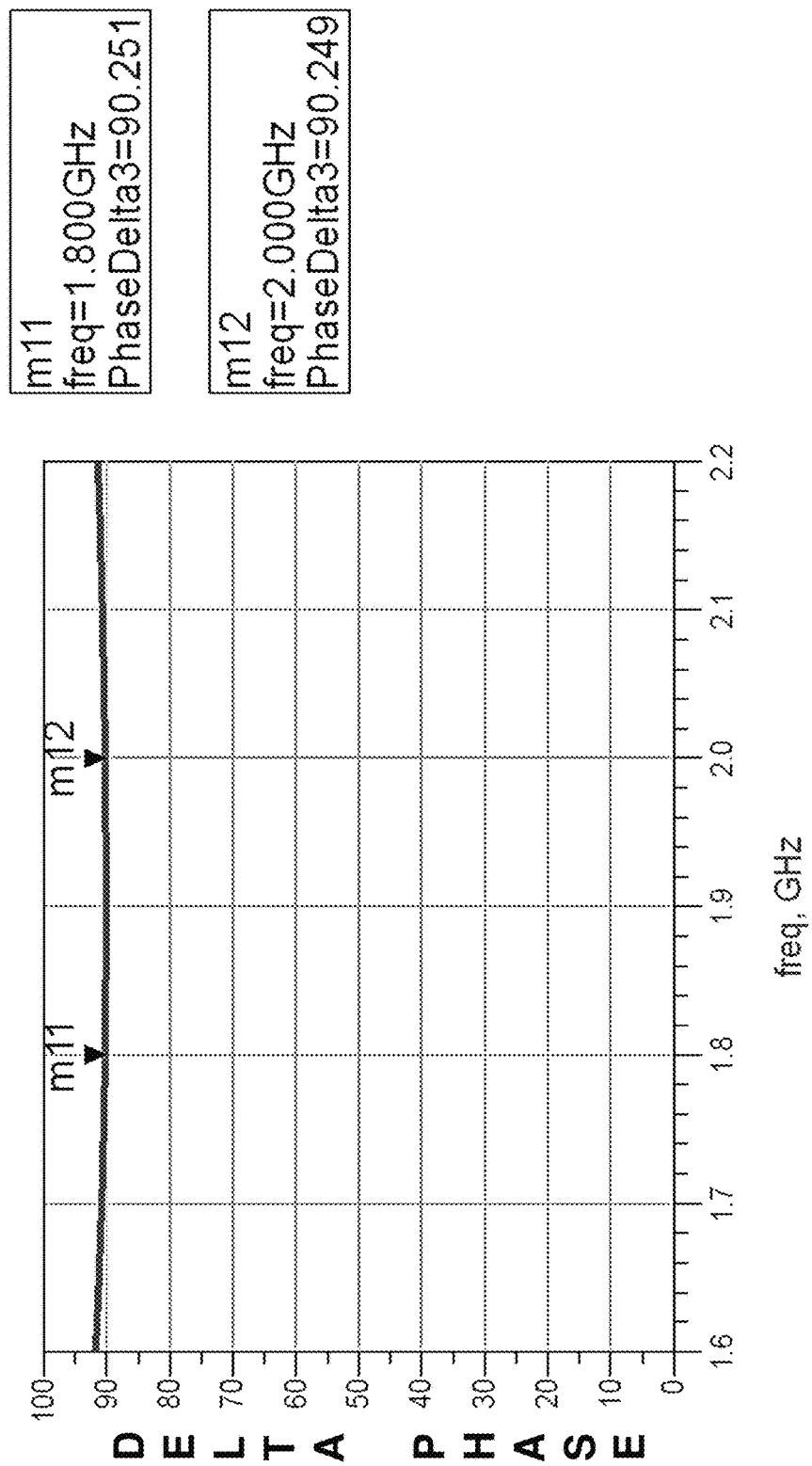
Figure 6J:
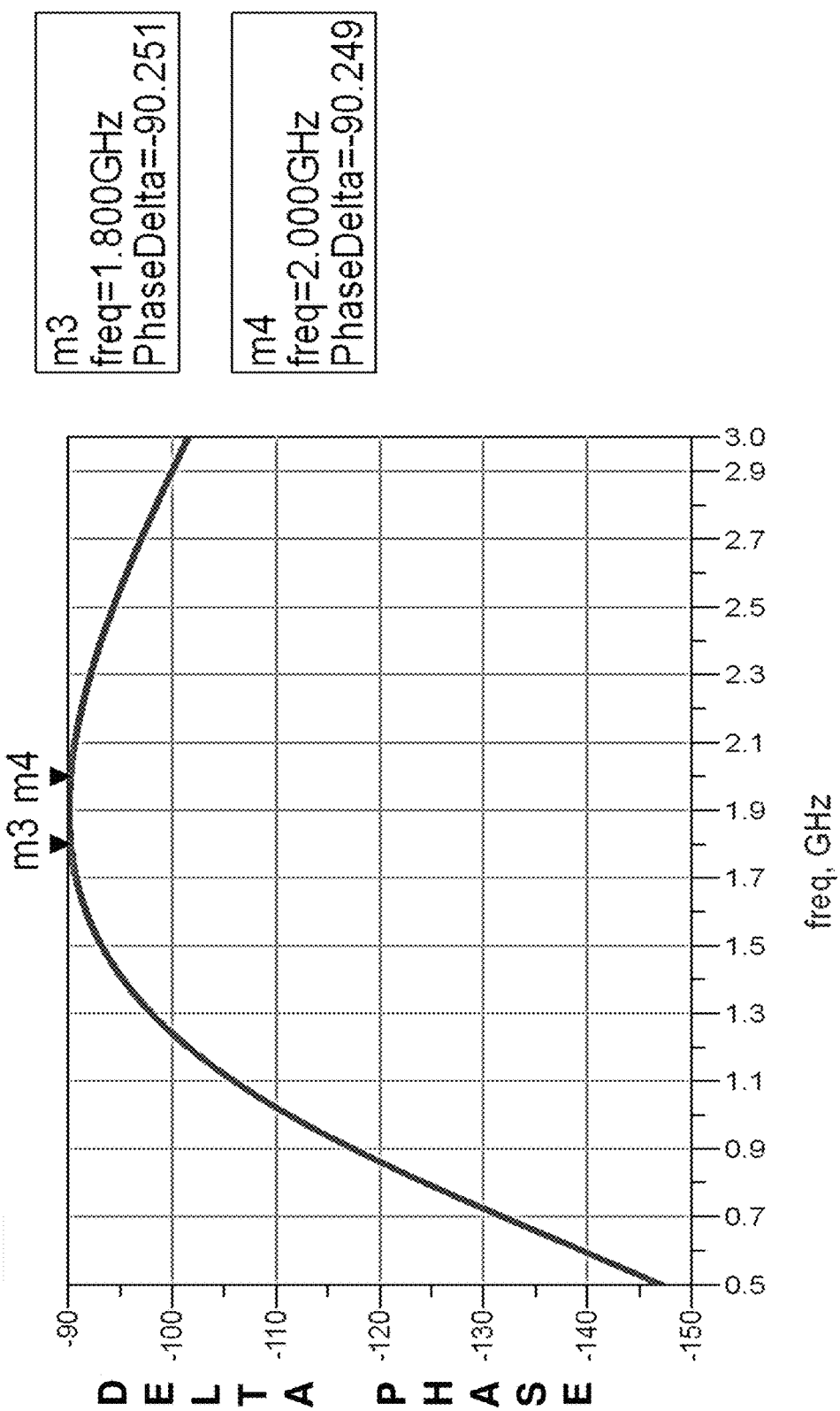
Figure 6K:
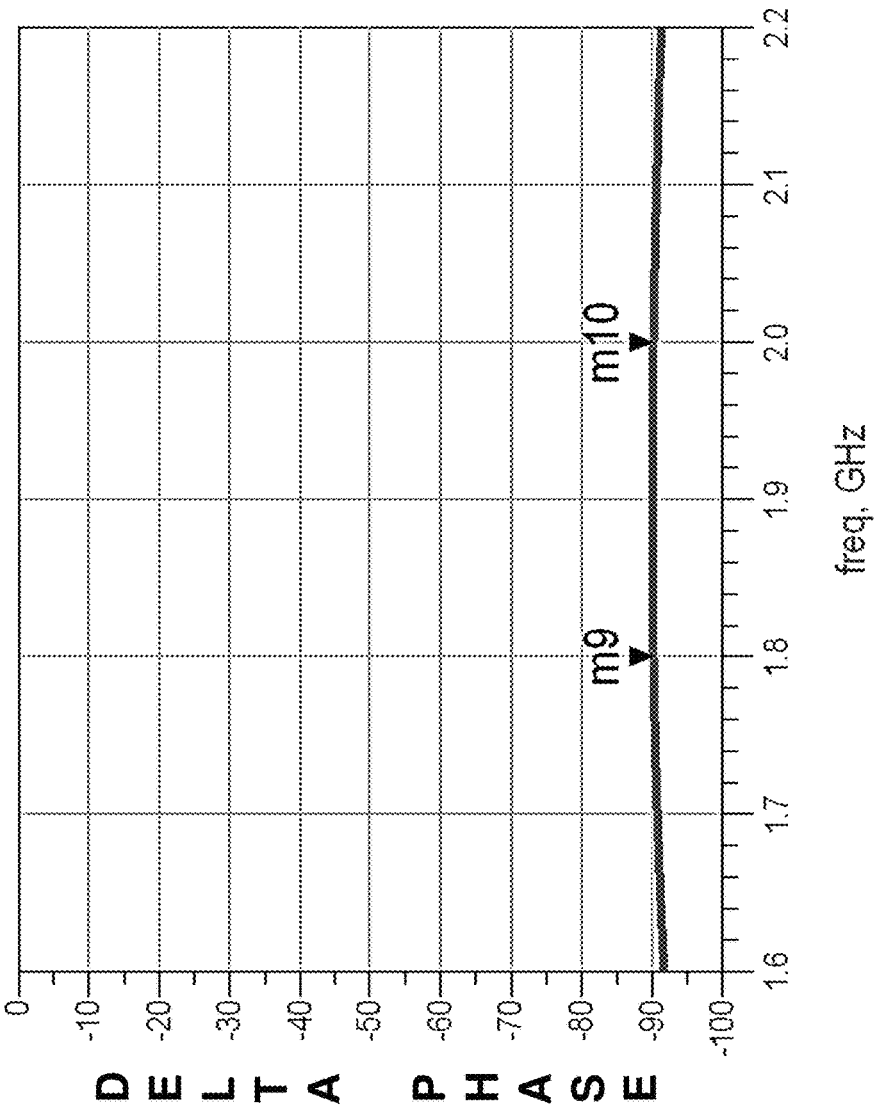
Figure 6L:
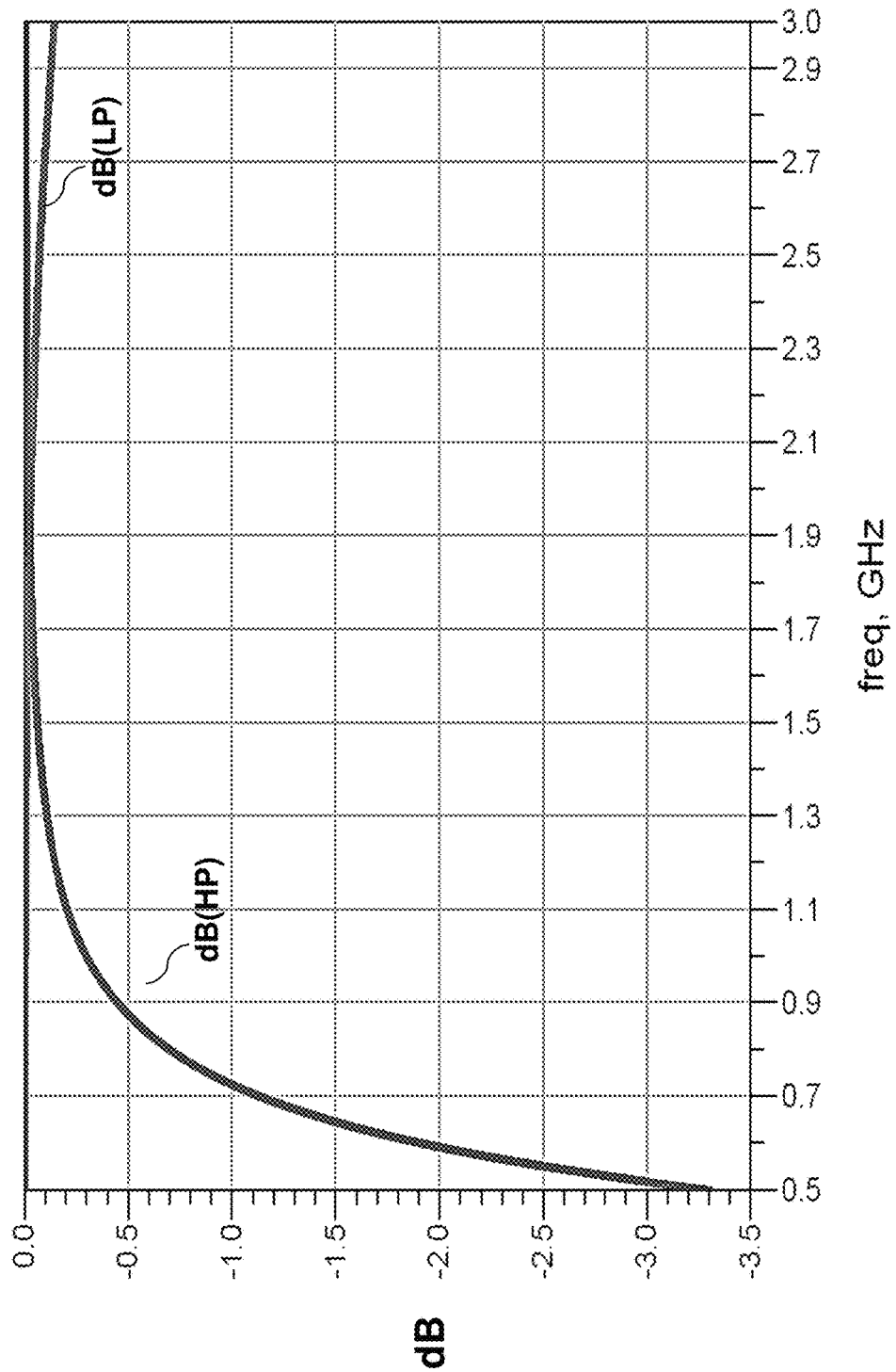
FIGS. 6L-6S show amplitude and phase response plots for an exemplary implementation of the phase shift modules depicted in FIGS. 6A-6B for a 45° relative phase shift at an operating frequency band of 1.8-2.0 GHz.
Figure 6M:
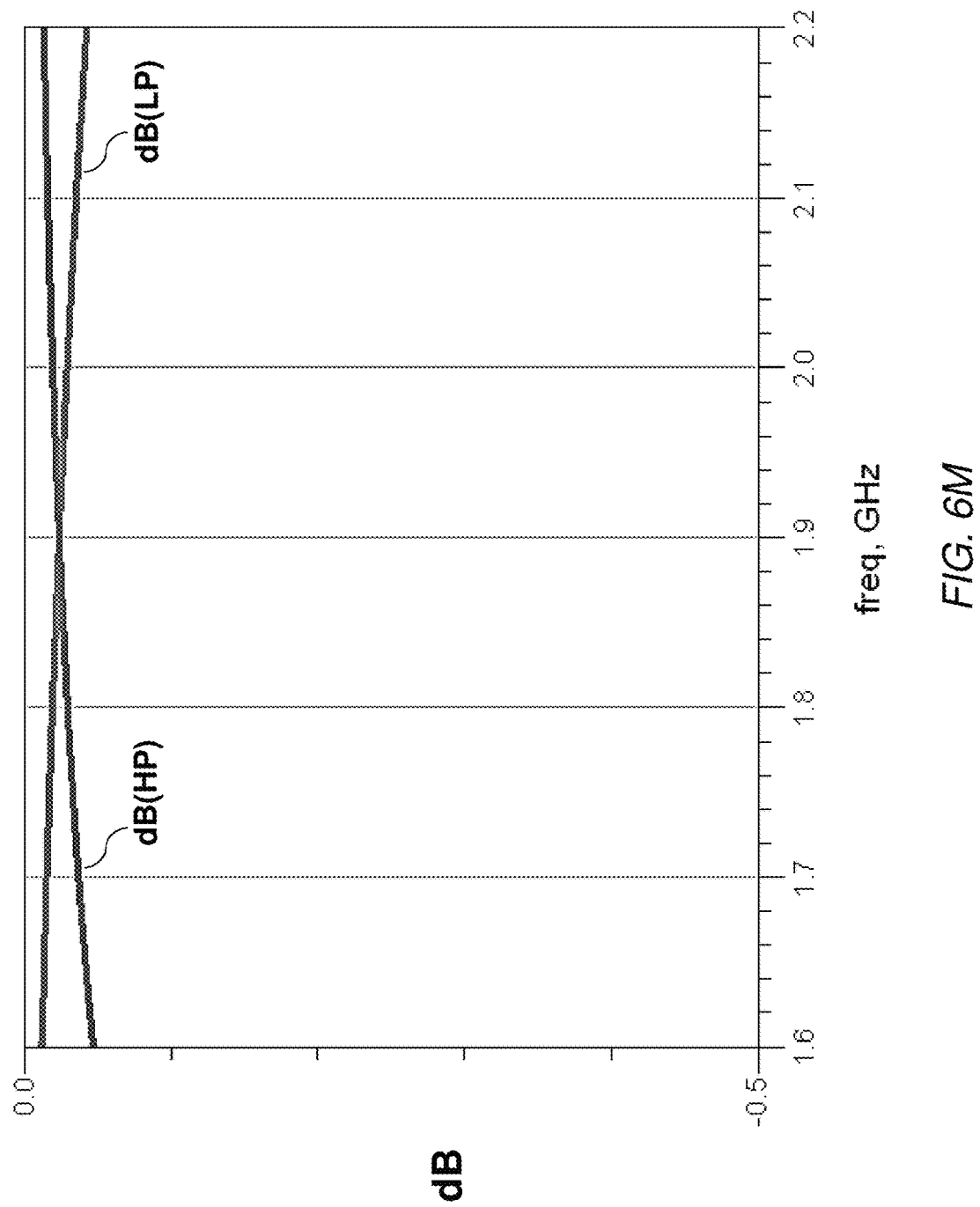
Figure 6N:
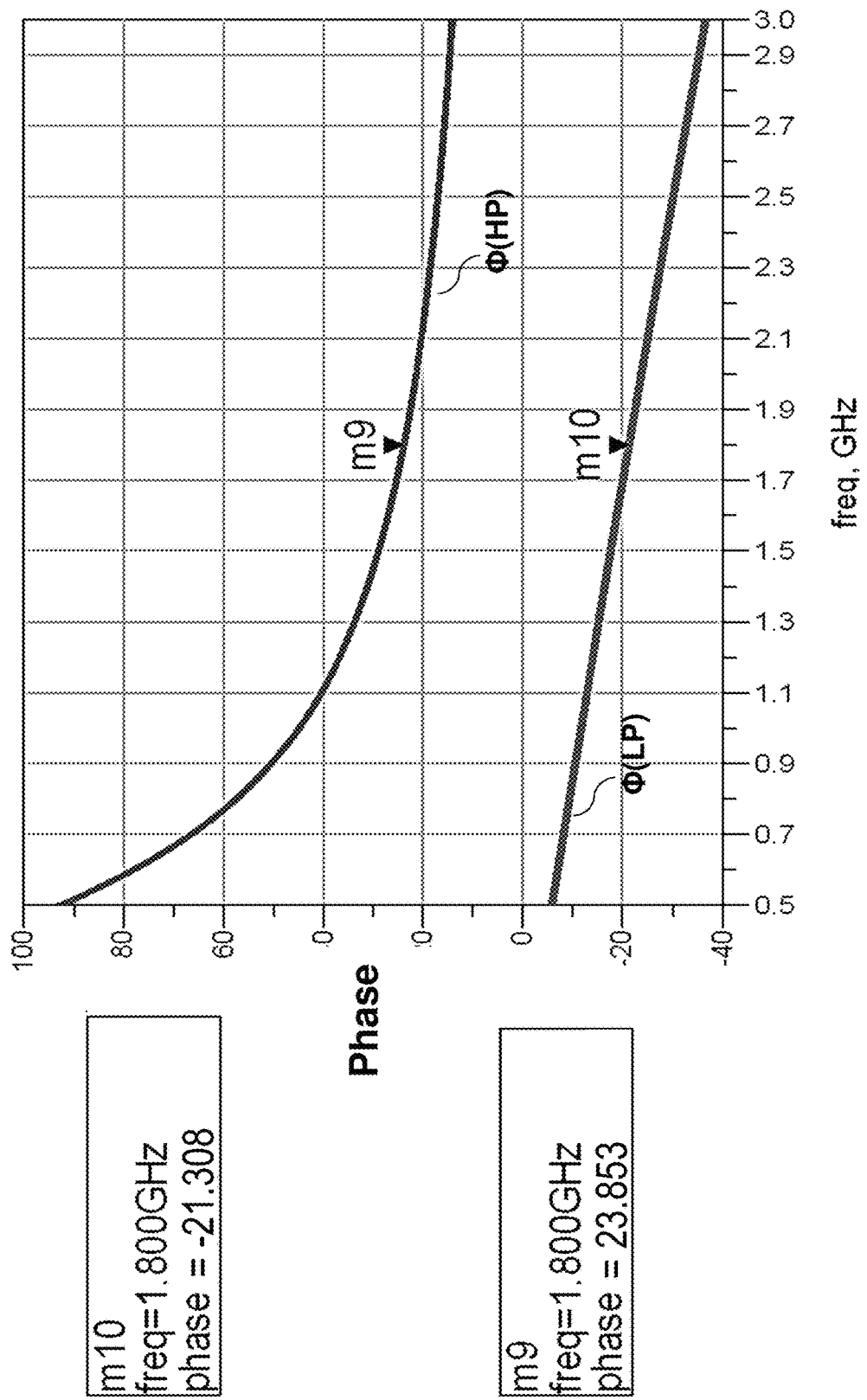

As shown in FIG. 6E, signal attenuation around the target frequency band of operation (e.g. centered at around 1.9 GHz) is less than about 0.4 dB for either the low pass or high pass filter (600AC, 600BC). Absolute phase shift of filters (600AC, 600BC) is depicted in the plots of FIGS. 6F and 6G, latter figure showing a zoomed version of the former around the center frequency of operation (e.g. center of the frequency band of operation). Various markers on these figures, denoted ($m_k$), indicate specific plot points whose values are given next to the plots. For example, as shown by markers ($m_1$, $m_2$, $m_7$, $m_8$) of FIGS. 6F and 6G, low pass filter (600AC) provides a phase shift of value −45.105° at the center frequency of operation (e.g. 1.9 GHz) and the high pass filter (600BC) provides a phase shift of value +44.987° at the center frequency of operation. Finally, FIGS. 6H, 6I and 6J, 6K show expanded and zoomed plots of phase differences of the two filters (e.g. phase (HP-LP) and phase (LP-HP) respectively) covering the frequency band of operation 1.8-2.0 GHz. In particular, markers (m11, m12) of FIG. 6I show value of the high pass filter phase minus value of the low pass filter phase at the respective frequencies (1.8 GHz, 2.0 GHz), and markers (m9, m10) of FIG. 6K show value of the low pass filter phase minus value of the high pass filter phase at same respective frequencies. The person skilled in the art readily appreciates the relatively large frequency band within which the relative phase provided by the two filters (600AC, 600BC) remains substantially constant. In the particular case of the filters (600AC, 600BC) of FIG. 6C whose frequency responses are depicted in FIGS. 6D-6K, variation of the relative phase (e.g. FIGS. 6I-6K) provided by such filters within a frequency range of 1.8 GHz to 2.0 GHz is less than 0.0025% of a nominal relative phase of −/+90.250°. Such substantially constant phase difference over said frequency range can be obtained while the absolute phase shift provided by each of the filters (600AC, 600BC) at a given frequency within the frequency range is different, as depicted in FIG. 6G. For example, as seen in FIG. 6G, an absolute value of the phase shift of the high pass filter (600BC) is |+44.987| at 1.9 GHz while the absolute value of the phase shift of the low pass filter (600AC) is |−45.105| at the same frequency. Moving along the graph represented in FIG. 6G, for a different frequency point, such absolute values are different for a same filter of the two filters, and are also different across the two filters.

Figure 6O:
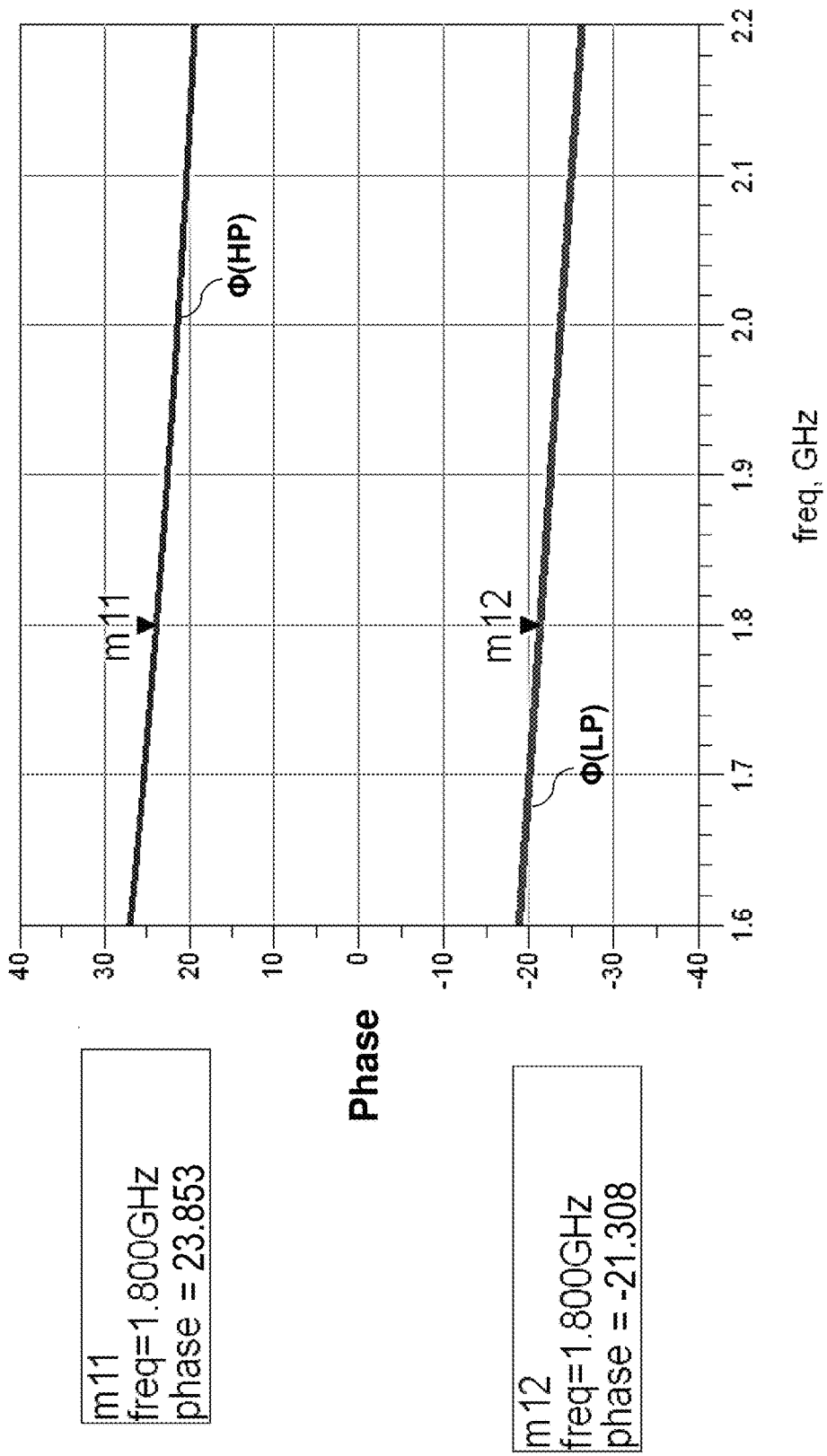
Figure 6P:
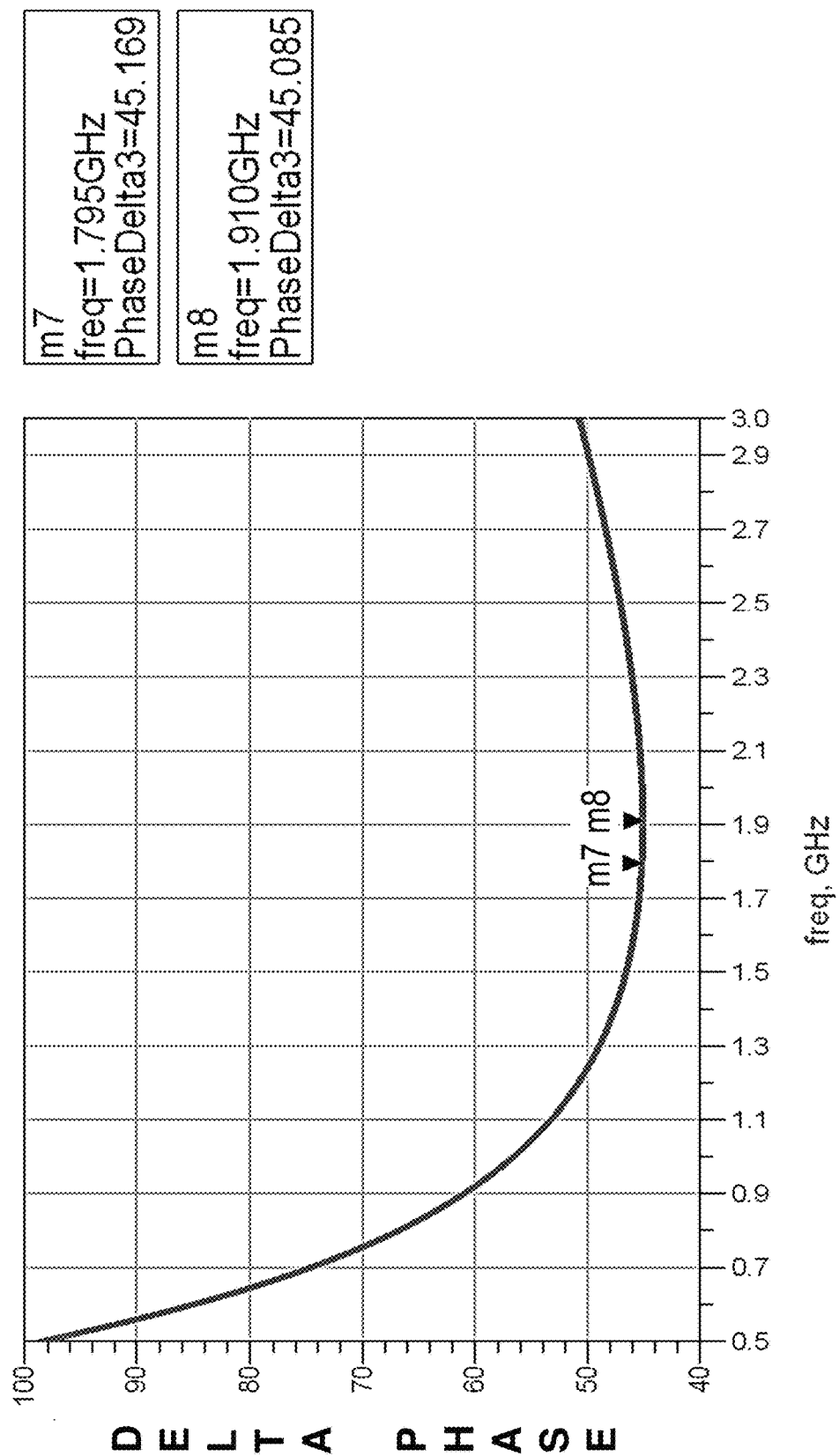
Figure 6Q:
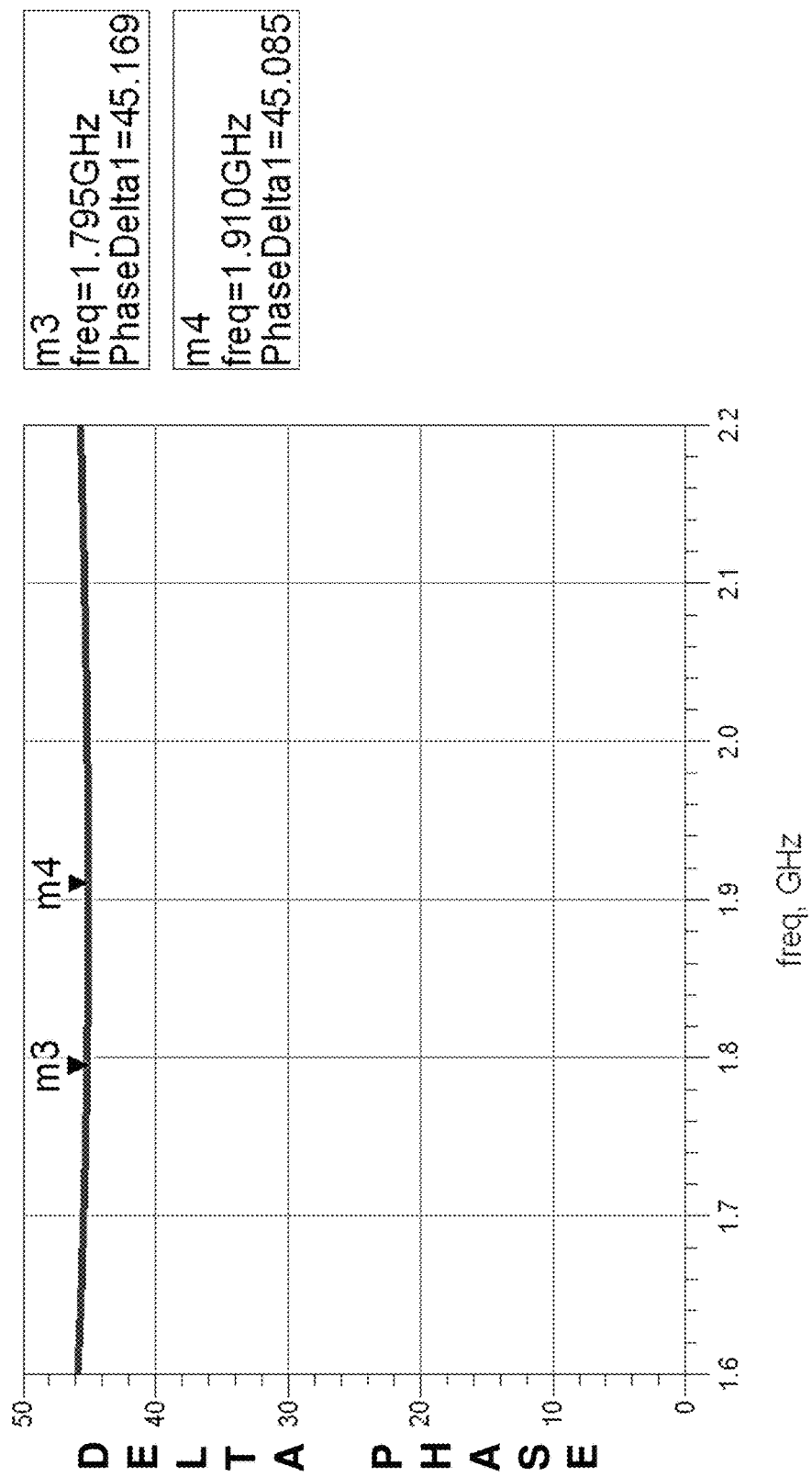
Figure 6R:
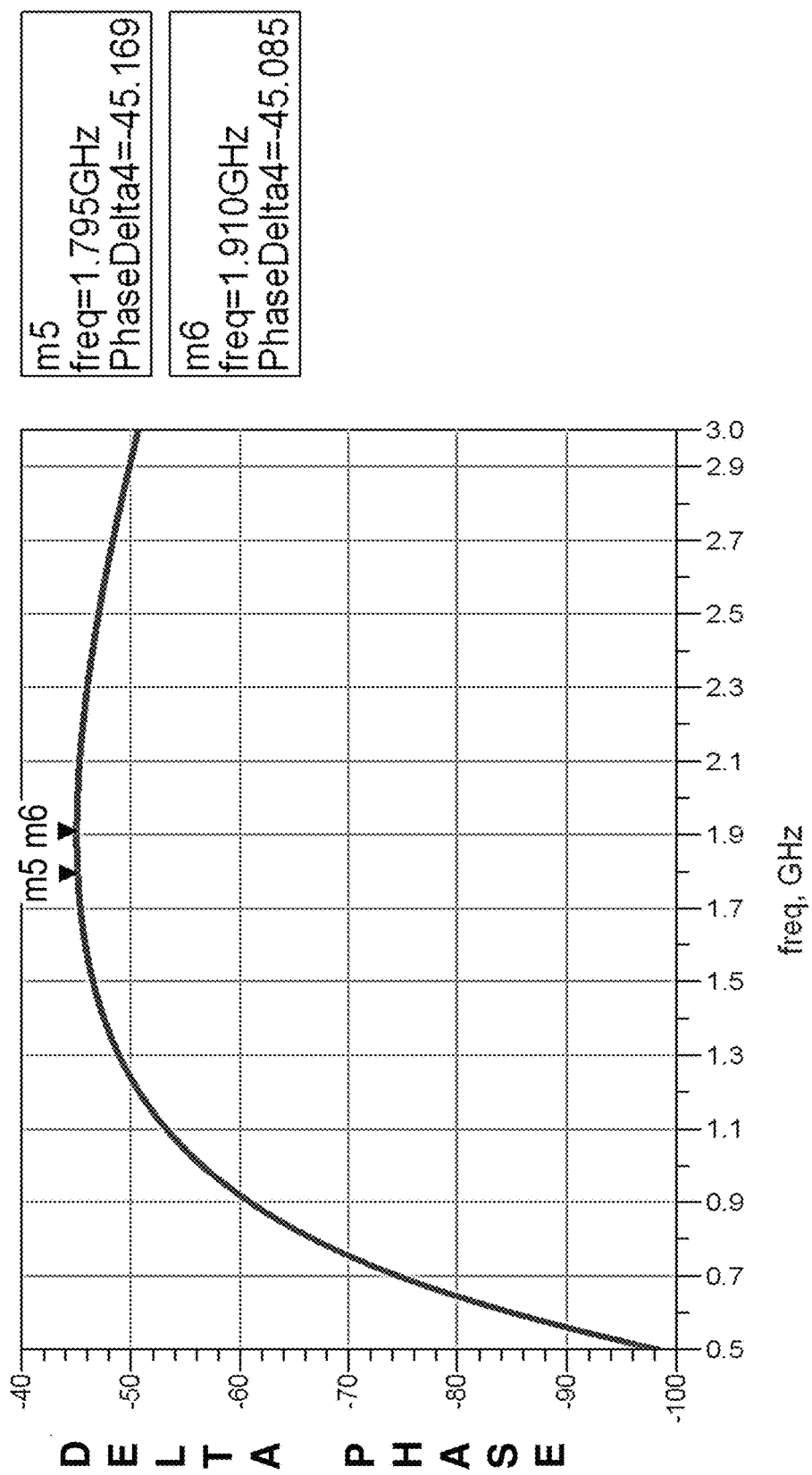
Figure 6S:
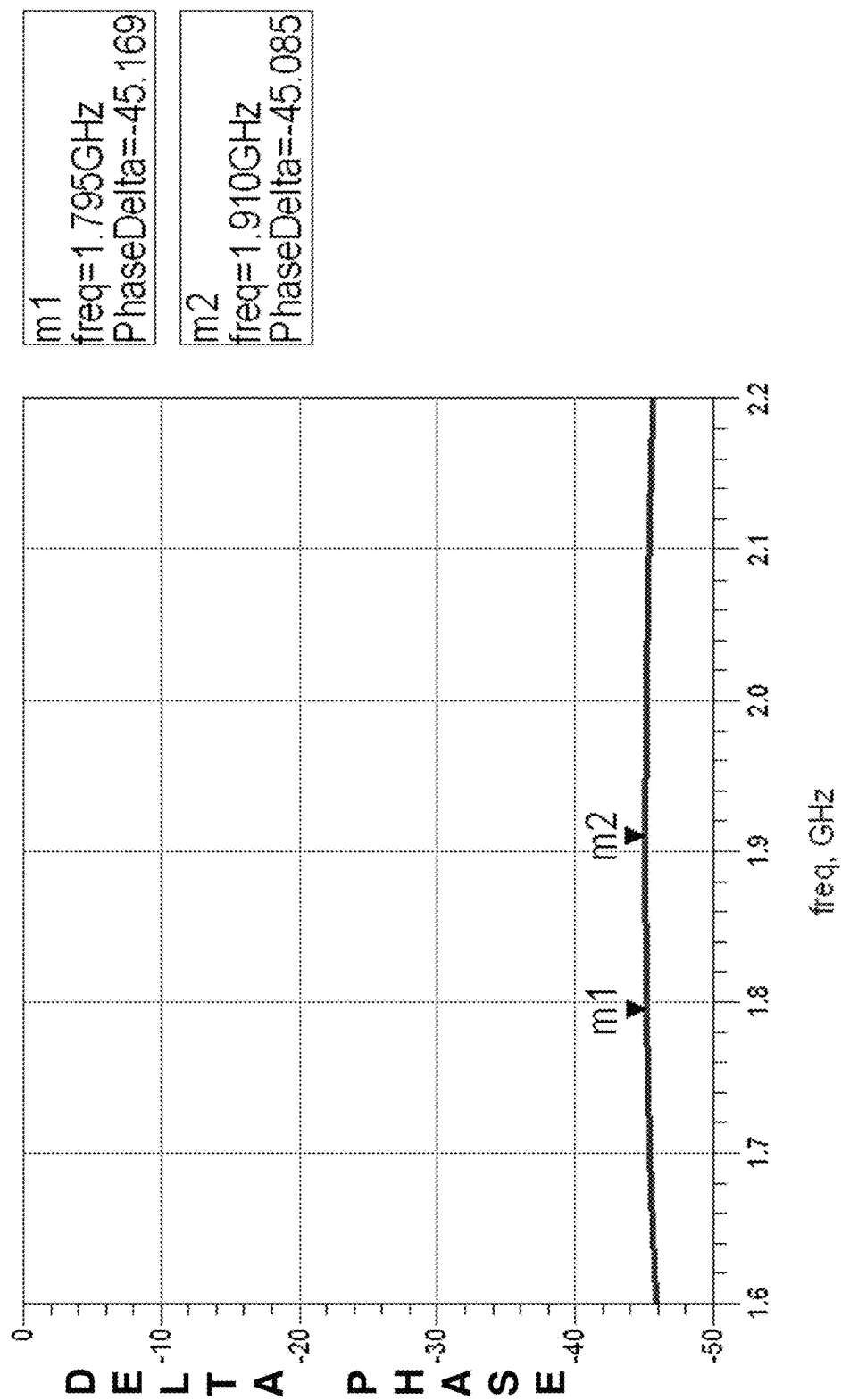

The inventors of the present disclosure have realized similar filters to filters (600AC, 600BC) for use as phase shift modules of the power splitter with programmable output phase shift according to the various embodiments of the present disclosure for different relative phase shift values (e.g. phase difference) at the corresponding output ports (e.g. OP1, OP2). For example, by using inductance values of (1.61 nH, 10.896 nH) for inductors (610, 640) and capacitance values of (0.644 pF, 4.358 pF) for capacitors (620, 630) of the filters (600AC, 600BC) depicted in FIG. 6C, phase shifts in the range of −/+21.0° to −/+24.0° can be provided by these filters for a near constant relative phase shift of +/−45° within a desired frequency of operation. FIGS. 6L-6S show graphs representative of the response (e.g. gain and frequency) of the two filters. In particular, graph depicted in FIG. 6O shows that the high-pass filter (600BC) has a phase shift of about 23.8° at a frequency of 1.800 GHz (as noted by marker m11 of FIG. 6O) and low-pass filter (600AC) has a phase shift of about −21.3° at a frequency of 1.800 GHz (as noted by marker m12 of FIG. 6O). The graph depicted in FIG. 6O also shows that within a frequency band including the frequency 1.800 GHz and spanning several GHz, phase shifts of the two filters vary with a substantially same slope, which therefore can provide a near constant phase difference (e.g. near +/−+/−45°) of the two filters within said frequency band, as shown in, for example, FIGS. 6Q and 6S.

It should be noted that in some exemplary cases of the power splitter with programmable output phase shift device according to the various embodiments of the present disclosure, the absolute value of the phase shift=|Φ| (e.g. with respect to an input RF signal at the input port (IP)) at a given frequency provided by two conductions paths of the split RF signals at ports (OP1, OP2) can be different while the relative phase shift (e.g. its absolute value) of the RF signals at the same output ports can be substantially the same (e.g. less than +/−2°) in the first and the second modes of operation of the device. For example, the filters (600AC, 600BC) of FIG. 6C realized by the applicants of the present disclosure using inductance values of (3.07 nH, 5.6 nH) for inductors (610, 640) and capacitance values of (1.23 pF, 2.34 pF) for capacitors (620, 630), provide a relative phase of (−/+45.169°, −/+45.085°) at frequencies (1.795 GHz, 1.910 GHz) (e.g. and flat relative phase between the two frequencies as depicted by the 'delta phase' data in the graph depicted in FIG. 6Q) while providing absolute phase shift values of (+23.853°, −21.308°) at the frequency of 1.800 GHz, as depicted in graphs of FIGS. 6N and 6O. As previously mentioned, system design specification (e.g. frequency band of operation, phase shift and attenuation within the band of operation, etc.) can further dictate performance of the power splitter with programmable output phase shift according to the present teachings which in turn can set the type and order of filters used.

According to further embodiments of the present disclosure, the difference in the absolute value of the phase shift provided by the two conduction paths of the split RF signals at ports (OP1, OP2) by the selectable phase shift modules (570, 580), as described in the previous paragraph, can be set to provide a desired performance of other related RF parameters of the modules, such as, for example, the insertion loss, the return loss and a die area of the modules. The design flexibility provided by the choice of the absolute value of the phase shifts where the only constraint can be their relative phase (e.g. as obtained at the output ports (OP1, OP2)), can allow, for example, setting a uniform insertion loss and/or a uniform return loss in the corresponding conduction paths of the two modes of operation. Such design flexibility can also allow reducing a corresponding die area used for the integrated circuit (400) by optimizing values (e.g. physical sizes) of corresponding filter (e.g. 600A, 600B) capacitors and inductors.

The RF power splitter with programmable output phase shift according to the teachings of the present disclosure depicted in FIGS. 5A-5B comprises selectable phases shift modules (570, 580) which use switches (550, 555, 560, 565) to select different phase shift modules (520a, 520b, 530a, 530b) within a conduction path of split RF signals for a desired relative phase shift of the split RF signals at a corresponding output pair ports (OP1, OP2). As discussed in the prior sections of the present disclosure, such phase shift modules (520a, 520b, 530a, 530b) within the selectable phase shift modules (570, 580) can provide a fixed phase shift and selection of a desired phase shift of the selectable phase shift module can be performed via insertion within an RF conduction path of a corresponding phase shift module via said switches. In contrast and according to a further embodiment of the present disclosure, the selectable phase shift modules (570, 580) can each be a single configurable phase shift module (e.g. as opposed to fixed selectable phase shift modules) which under control of an external control signal can provide a different phase shift. This can be accomplished via the configurable phase shift module (700) depicted in FIGS. 7A-7C.

Figure 7A:
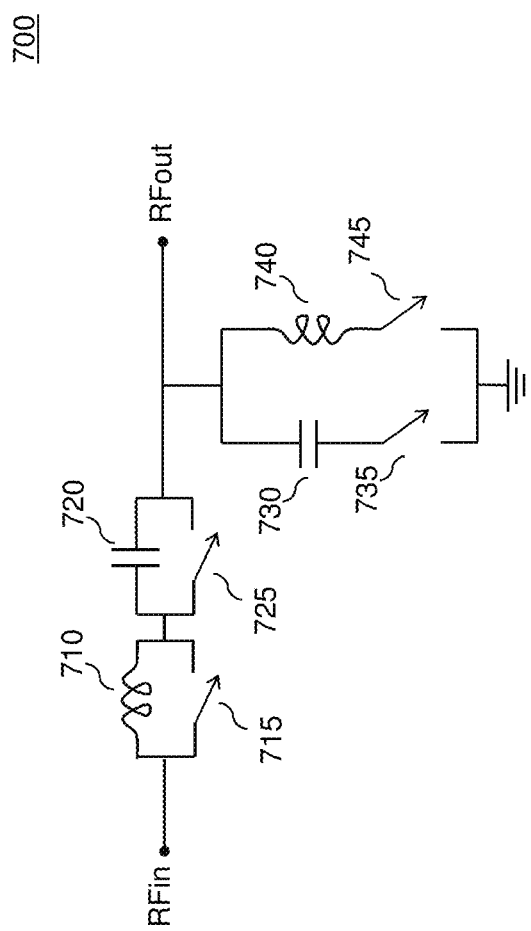
FIGS. 7A-7C show a configurable low/high pass filter which according to exemplary embodiments of the present disclosure can be used as a configurable phase shift module.
Figure 7B:
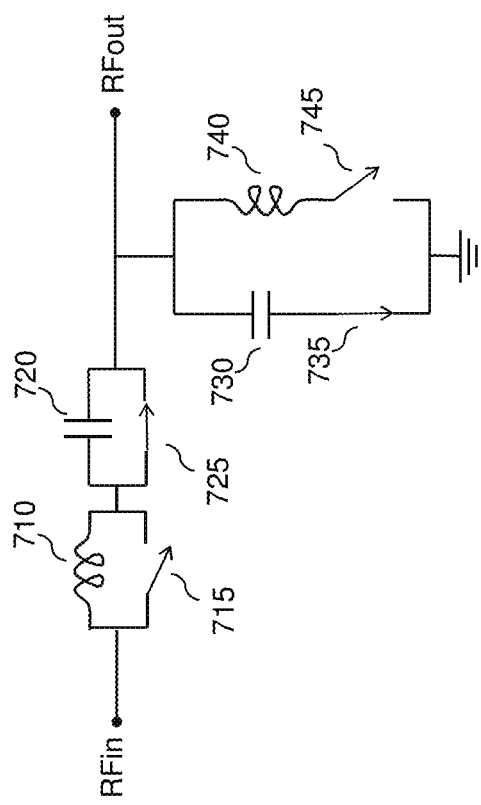
Figure 7C:
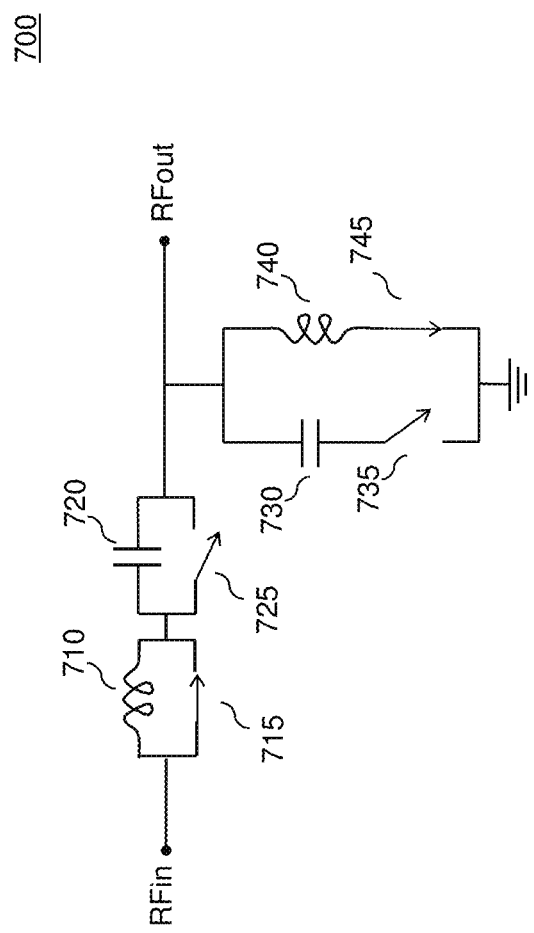

The circuital arrangement (700) depicted in FIG. 7A is an exemplary configurable phase shift module according to an embodiment of the present disclosure which can be used as the selectable phase shift module (570, 580) of the RF power splitter with programmable output phase shift depicted in FIG. 4. Circuital arrangement (700) comprises series reactances (710, 720) and shunted reactances (730, 740); during operation of the circuital arrangement, each reactance (710, 720, 730, 740) can be included or excluded to respectively influence or not influence an RF signal through the circuital arrangement via a corresponding configuration control switch (715, 725, 735, 745). For example, closing (e.g. ON position) of switch (725) as depicted in FIG. 7B provides a short path for conduction of an RF signal flowing through the circuit and therefore bypassing the corresponding reactive capacitive element (720). Bypassing a series element (e.g. (710, 720)) in the circuital arrangement (700) by closing a corresponding configuration control switch can effectively decouple such element in order not to affect the RF signal, or in other words, remove said element from a conduction path of the RF signal. On the other hand, opening (e.g. OFF position) of the switch (725), as depicted in FIG. 7C, provides a high impedance path preventing conduction of an RF signal through the switch and therefore forcing the RF signal to flow through the path of lesser impedance defined by the reactive capacitive element (720). Therefore opening a switch corresponding to a series reactance (e.g. inductor (710), capacitor (720)) can effectively include such series reactance within a conduction path of the RF signal. It is within the ability of a person skilled in the art to deduce that opening of a switch (735, 745) associated to a shunted reactive element (capacitor (730), inductor (740)) can decouple such shunted element from influencing the RF signal flowing through the circuital arrangement (e.g. opened switch provides a series high impedance to the corresponding series connected shunted element), and that closing said switch can include the corresponding shunted reactive element (730, 740) within a conduction path of the RF signal. It should be noted that although not shown in FIGS. 7A-7C, configuration control switches (715, 725, 735, 745) can be controlled for a corresponding ON/OFF position via corresponding control signals. The person skilled in the art is well versed on various available designs and techniques to control such switches, using analog signals, digital signals or combination thereof.

With further reference to FIG. 7A, according to further exemplary embodiments of the present disclosure, the configuration control switches (715, 725, 735, 745) can be controlled to configure the circuital arrangement (700) to one of two filters with a desired phase shift. In a first configuration mode of the configurable phase shift module (700) depicted in FIG. 7B, the configurable phase shift module (700) can be a low pass filter similar to the low pass filter (600A) depicted in FIG. 6A as discussed in the prior sections of the present disclosure. In a second configuration mode of the configurable phase shift module (700) depicted in FIG. 7C, the configurable phase shift module (700) can be a high pass filter similar to the high pass filter (600A) depicted in FIG. 6B as discussed in the prior sections of the present disclosure.

With further reference to FIGS. 7B-7C and as previously mentioned in the present disclosure with reference to filters (600A, 600B), capacitive elements (720, 730) and inductive elements (710, 740) of the configurable phase shift module (700) can be chosen such as to provide a desired positive phase shift and a desired negative phase shift at a frequency band of operation for each of the low pass and high pass filters of the configurable module (700). For example, when configured as a low pass filter as depicted in FIG. 7B, the series inductor (710) and shunt capacitor (730) can provide a low pass filter with a desired phase shift within a frequency band of operation, and when configured as a high pass filter as depicted in FIG. 7C, the series capacitor (720) and the shunt inductor (740) can provide a high pass filter with a desired phase shift within the same frequency band of operation. According to an exemplary embodiment of the present disclosure, the phase shift in the low pass configuration can be opposite of the phase shift in the high pass configuration within the frequency band of operation. According to another exemplary embodiment of the present disclosure, the phase shift in the low pass configuration can be the complement of (e.g. different from) the phase shift in the high pass configuration such as to provide a nearly constant phase shift difference within the frequency band of operation. Insertion loss in the pass band regions of the two filters can be made to fit required design specification within the frequency band of operation. In the exemplary case of the filters whose attenuation graphs are provided in FIGS. 6E and 6M, insertion loss of about −0.3 dB per filter (e.g. per phase shift module) can be obtained.

Figure 8A:
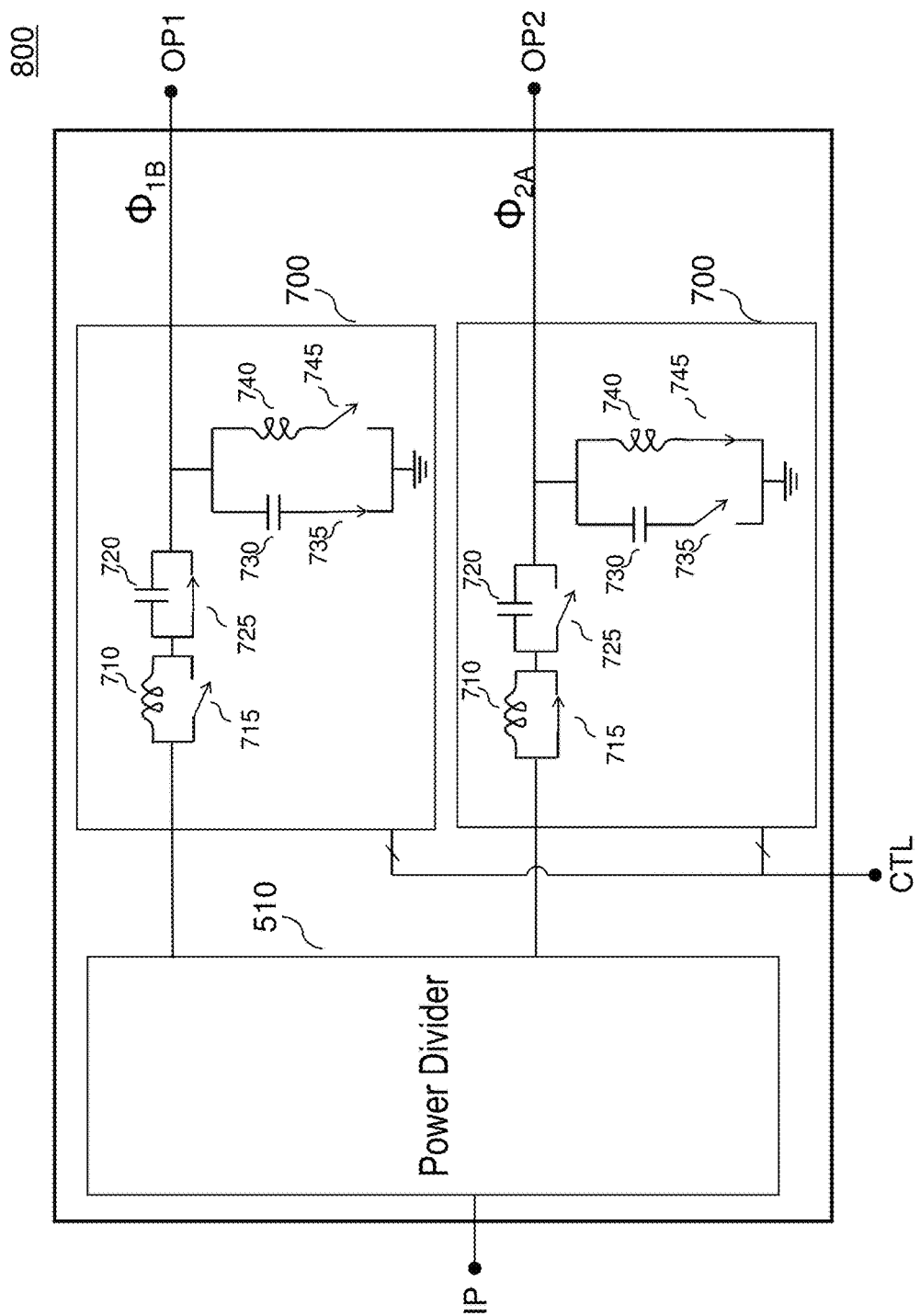
FIGS. 8A-8B show a power splitter with programmable output phase shift IC according to an embodiment of the present disclosure which uses the configurable phase shift module depicted in FIGS. 7A-7C.
Figure 8B:
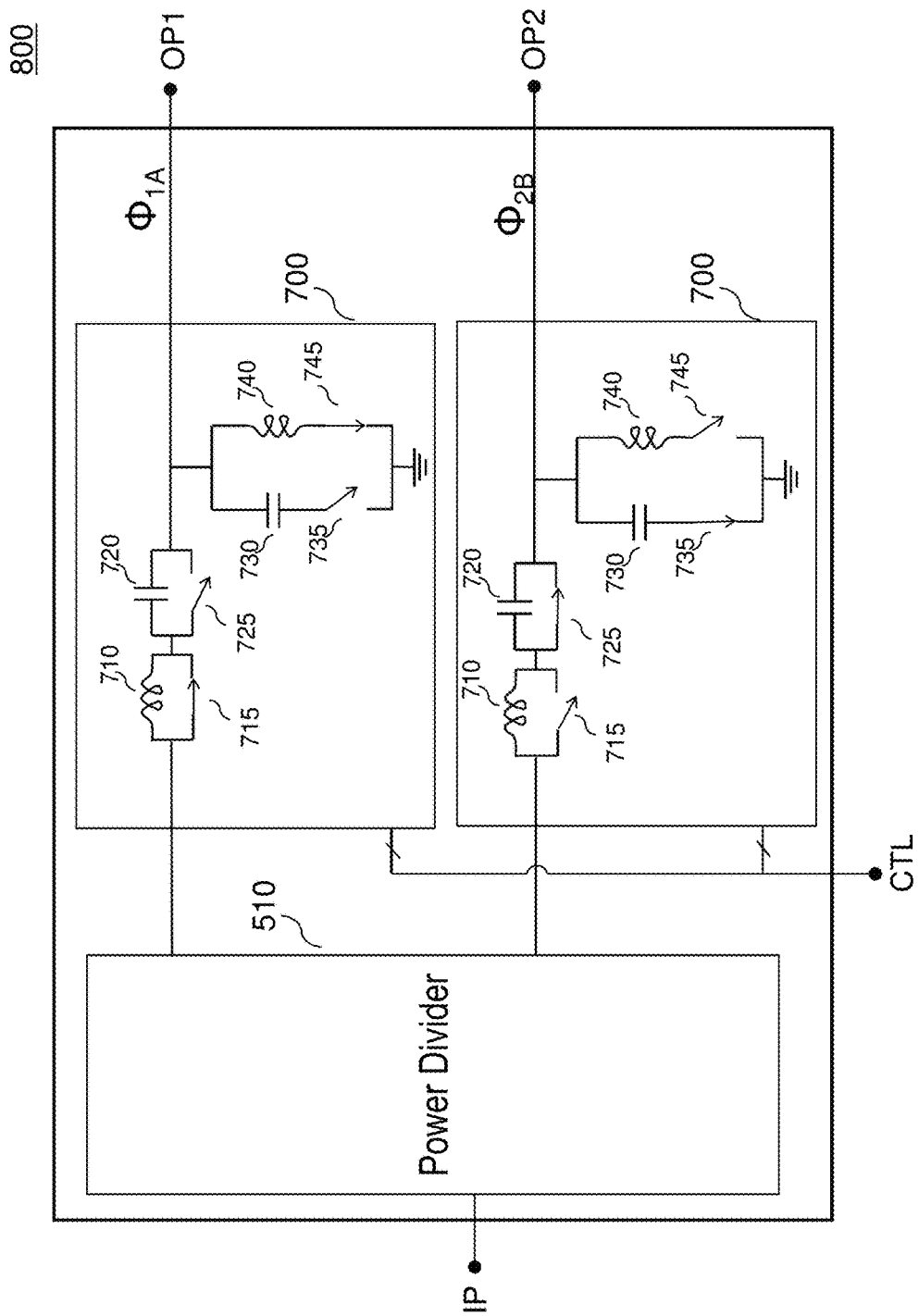

According to an embodiment of the present disclosure, FIGS. 8A and 8B depict a power splitter with programmable output phase shift IC (800) using configurable phase shift modules (700) as presented in the previous section of the present disclosure. The system architecture of the IC (800) is similar to the system architecture of IC (400) depicted in FIG. 4, where each of the selectable phase shift modules (570, 580) is chosen to be the configurable phase shift module (700) and where the phase shifts of the corresponding low pass filter and high pass filter of the configurable phase shift module (700) are ($\Phi_{1A}$, $\Phi_{1B}$) for the configurable phase shift module coupled to the output port (OP1) and ($\Phi_{2A}$, $\Phi_{2B}$) for the configurable phase shift module coupled to the output port (OP2). As discussed in the prior sections of the present disclosure in relation to FIGS. 4 and 5A-5B, such phases can be chosen to provide a desired relative phase between signals at output ports (OP1) and (OP2) in each mode of operation of the IC (800). As previously discussed and according to various embodiments of the present disclosure, such relative output phases can be opposite phases, such as ΔPhase_m1=−ΔPhase_m2, while generally $|\Phi_{1A}|\neq|\Phi_{2A}|\neq|\Phi_{1B}|\neq|\Phi_{2B}|$. According to further embodiments as discussed in same sections related to FIGS. 4 and 5A-5B, the absolute value of the phase difference of signals at the output ports (OP1, OP2) in the first mode of operation can be offset by a desired phase offset value with respect to the absolute value of the phase difference of the signals at the output port (OP1, OP2) in the second mode of operation, as expressed by: |ΔPhase_m1|−|ΔPhase_m2|=K, where K is the desired phase offset value. According to some embodiments the value of K can be any value comprised in a range of 0° to 180°.

As depicted in FIG. 8A, in a first mode of operation of the IC (800), a low pass version of an input RF signal provided at the input (IP) port of the IC is provided with a relative phase shift $\Phi_{1B}$ with respect to the input RF signal at an output port (OP1) of the IC (800), and a high pass version of the input RF signal is provided with a relative phase shift $\Phi_{2A}$ with respect to the input RF signal at an output port (OP2) of the IC (800). Therefore, the relative phase shift between the signal at output port (OP2) with respect to signal at output port (OP1) in the first mode of operation is provided by the expression ΔPhase_m1=$\Phi_{2A}$−$\Phi_{1B}$.

As depicted in FIG. 8B, in a second mode of operation of the IC (800), a high pass version of an input RF signal provided at the input (IP) port of the IC is provided with a relative phase shift $\Phi_{1A}$ with respect to the input RF signal at an output port (OP1) of the IC (800), and a low pass version of the input RF signal is provided with a relative phase shift $\Phi_{2B}$ with respect to the input RF signal at an output port (OP2) of the IC (800). Therefore, the relative phase shift between the signal at output port (OP2) with respect to signal at output port (OP1) in the second mode of operation is provided by the expression ΔPhase_m2=$\Phi_{2B}$−$\Phi_{1A}$. As previously mentioned and according to the various teachings of the present disclosure, phases ($\Phi_{1A}$, $\Phi_{1B}$, $\Phi_{2A}$, $\Phi_{2B}$) are chosen such as ΔPhase_m1=−ΔPhase_m2. In the particular case where $|\Phi_{1A}|=|\Phi_{1B}|=|\Phi_{2A}|=|\Phi_{2B}|=\Phi$, then ΔPhase_m2=−ΔPhase_m1=−2Φ.

As mentioned in the prior sections of the present disclosure, the power divider module (510) can split the input RF signal of a given power amplitude provided at the input port (IP) of the IC (800) into two equal powers (based on the power amplitude of the input RF signal) and equal phase signals (e.g. in phase), each split signal being fed to one of the configurable phase shift modules (700, 700) as depicted in FIGS. 8A-8B. Accordingly, the signals output at the output ports (OP1, OP2) in the first and second modes of operation of the IC (800) can have a relative phase of same magnitude and opposite polarity, and a same power amplitude (e.g. as measured in a same value load). As previously mentioned, according to some embodiments of the present disclosure, the split signals can have different power amplitudes. In some embodiments further circuitry may be used to further equalize/adjust power of the split signals without affecting their relative phase.

In an exemplary case according to the present disclosure, by having the magnitude $|\Phi_{1A}|=|\Phi_{1B}|=|\Phi_{2A}|=|\Phi_{2B}|$ of the configurable phase shift module (700) be equal to 45°, a relative phase of +/−90° at output ports (OP1, OP2) in the first/second mode of operation of the IC (800) can be obtained. According to yet another exemplary case of the present disclosure, by having the magnitude $|\Phi_1|$ of the configurable phase shift module (700) be equal to 90°, a relative phase of +/−180° at output ports (OP1, OP2) in the first/second mode of operation of the IC (800) can be obtained. It is within the abilities of the person skilled in the art to use teachings according to the present disclosure to design/implement a power splitter with programmable output phase shift where the relative output phase shift (e.g. between output ports (OP1, OP2)) is according to a desired set of values. According to some embodiments of the present disclosure, the absolute value of such relative output phase shift can be within a range of 0° to 180°, or similarly, the absolute value $|\Phi_{1A}|=|\Phi_{1B}|=|\Phi_{2A}|=|\Phi_{2B}|$ of the configurable phase shift module (700) be within a range of 0° to 90°.

As used within the present disclosure, the term integrated circuit can refer to a circuit comprising various passive and/or active electrical elements that are monolithically integrated on a same substrate using one of the many semiconductor device fabrication processes and technologies known to the skilled person. Such technologies can include complementary metal-oxide-semiconductor (CMOS) fabrication technology using bulk silicon or silicon on insulator (SOI) substrates. An exemplary case of an SOI substrate is silicon on sapphire (SOS).

As known to the person skilled in the art, due to the nature of a semiconductor device fabrication technology used for IC fabrication, corresponding reactive components can have fabrication tolerances of up to +/−20% of a desired reactive component value. In some cases such tolerances can be the effect of parasitic elements inherent to the fabrication technology which couple to the designed reactive component. Therefore, in a case of a filter fabricated using such fabrication technology, a corresponding filter response (e.g. amplitude/phase response with respect to frequency) can vary according to the corresponding fabrication tolerances. In the exemplary cases of the various phase shift modules according to the various teachings of the present disclosure discussed in the previous sections, such variation in a filter response can translate to offsets in a pass band region position (e.g. bandwidth) of a corresponding filter (e.g. 600A, 600B, 700) and therefore cause offsets in the phase shift magnitude and amplitude response of the filter within a desired RF frequency range. In an exemplary case, such offsets can create phase imbalance of the power splitter with programmable output phase shift, such as a magnitude of the relative phase shift at the output ports (OP1, OP2) is different when the device is operating in the first mode and the second mode. Therefore, it is an object of the present disclosure to provide methods and devices for compensating for such offsets due to the IC device fabrication technology.

Figure 9:
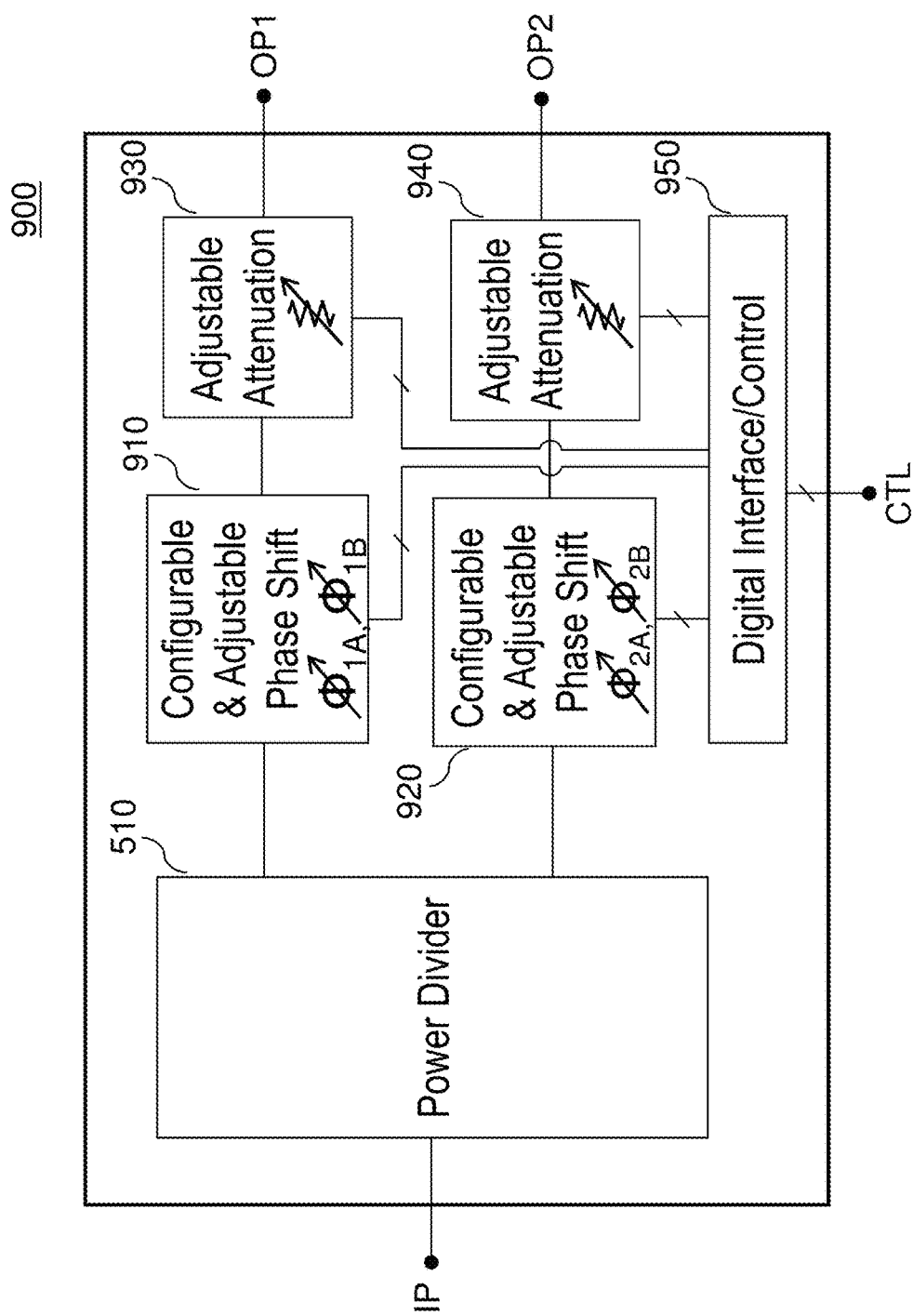
FIG. 9 shows a functional block diagram of a power splitter with programmable output phase shift IC device according to an embodiment of the present disclosure with independently adjustable phase shift and signal attenuation for different selectable operating modes of the IC device.

According to an embodiment of the present disclosure, FIG. 9 represents a functional block diagram of a power splitter with programmable output phase shift IC (900) where phase shift and signal attenuation for each of the selectable operating modes (e.g. first/second mode of operation) can be independently adjusted. By adjusting the phase shift of the configurable and adjustable phase shift modules (910, 920) in each of the modes of operation of the IC (900), relative phase between output RF signals at output ports (OP1, OP2) can be adjusted. Such adjustment can be used, for example, to compensate for undesired phase shift offsets introduced via a corresponding IC fabrication process as described in the above sections of the present disclosure. According to an exemplary embodiment of the present disclosure, in a case where modules (910, 920) are designed to provide a same magnitude and opposite sign phase shift in either first or second mode of operation (e.g. $\Phi_{1A}=-\Phi_{1B}$, and $\Phi_{2A}=-\Phi_{2B}$), adjustment of the modules (910, 920) can effectively provide a desired same magnitude and opposite sign relative phase for RF signals output at ports (OP1, OP2).

With further reference to IC (900) of FIG. 9, offsets in amplitude (e.g. power) of RF signals at output ports (OP1, OP2) with respect to a desired amplitude (e.g. designed value) can be adjusted by using the adjustable attenuation modules (930, 940) independently for each of the operating modes of the IC (900). For example, module (930) can be programmed to provide a first attenuation value to an incoming RF signal (e.g. from module (910)) when the IC (900) is operating in a first mode of operation, and to provide a second attenuation value, different from the first attenuation value, to the incoming RF signal when the IC (900) is operating in a second mode of operation.

Configuration control (e.g. first/second mode of operation) and adjustments of phase shift and amplitude attenuation of modules (910, 920, 930, 940) of the IC (900) can be performed via the digital interface/control module (950) depicted in the FIG. 9. During operation of the IC (900), module (950) can control operation of the various modules (910, 920, 930, 940) based on a digital control word provided at the control port (CTL) of the IC (900). Upon receipt of a control word, module (950) can decode such word and accordingly route related instructions to the various modules (910, 920, 930, 940). Such instructions can be directly decoded from the input control word, or in some exemplary cases can be used as an input to an instruction lookup table internal to the module (950). The instruction lookup table can be preloaded (e.g. via a one time or multiple time programmable storage device) during a manufacturing/production phase of the IC (900). The person skilled in the art readily knows of a variety of design techniques suited for implementation of a control interface (e.g. within module (950)) between the outside world and the configurable/adjustable modules (910, 920, 930, 940) of the IC (900). According to some exemplary embodiments of the IC (900), amplitude attenuation adjustments of 0 dB to 15.75 dB in 0.25 dB steps can be performed by the amplitude attenuation modules (930, 940). According to some further exemplary embodiments of the IC (900), phase shift adjustments of 0° to 88.5° in 1.4° steps can be performed by modules (910, 920). Again, it is within the ability of the person skilled in the art to use the teachings of the present disclosure to generate modules (910, 920, 930, 940) for a performance complying to specific system design requirements. For example, in some embodiments the amplitude attenuation adjustment can be provided with a step resolution included in a range of 0.05 dB to 0.50 dB and the phase shift adjustment can be provided with a step resolution included in a range of 1.4° to 5.6°. Other ranges can also be provided depending on specific system design requirements.

Figure 10:
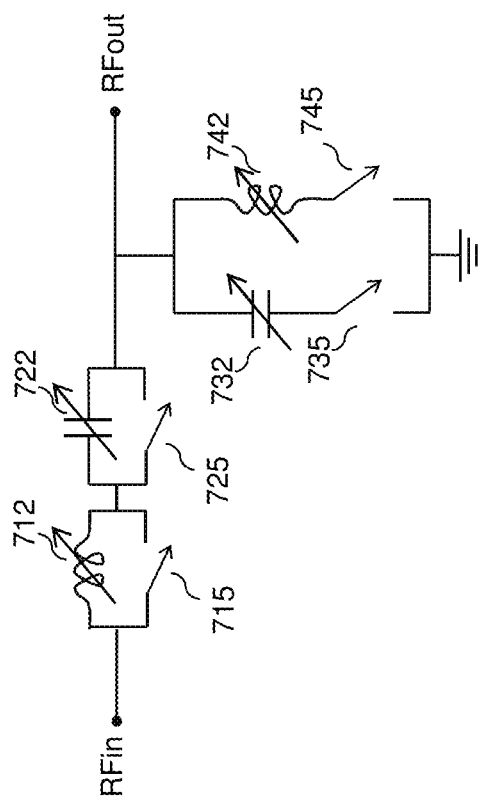
FIG. 10 shows a configurable and adjustable phase shift module according to an embodiment of the present disclosure.

FIG. 10 depicts a configurable and adjustable phase shift module (700A) according to a further embodiment of the present disclosure which can be used as modules (910, 920) of the IC (900) depicted in FIG. 9. Architecture of the module (700A) is similar to the architecture of the module (700) depicted in FIG. 7 of the present disclosure and therefore can provide a configurable low pass and high pass filter in a corresponding first mode and second mode of operation of the module (700A) as described in the present disclosure in the sections related to module (700) (e.g. FIGS. 7A-7C). Furthermore, by using tunable reactive elements (712, 722, 732, 742) in module (700A), the corresponding low pass and high pass filters can be adjusted independently of one another (e.g. (712, 732), (722, 742)). Such adjustment can therefore allow a corresponding filter response to be adjusted/modified such as to provide a desired phase shift of the filter at a desired frequency of operation. As mentioned in the previous sections of the present disclosure, filter design, including type of filter and a corresponding filter order, can be selected according to system design specification which can dictate performance of such filters. Although such filters have been referred to as low pass and high pass filters, other types of filters can also be chosen to provide a same desired response within a frequency band of operation.

According to some embodiments of the present disclosure, the tunable reactive elements used in module (700A) depicted in FIG. 10 can be digitally tunable capacitors and/or digitally tunable inductors. Some examples of digitally tunable capacitors and digitally tunable inductors are described, for example, in the above referenced International Publication No. WO2009/108391 and US Published Application No. 2013/0222075A1, both of which are incorporated herein by reference in their entirety.

As mentioned in the previous sections of the present disclosure, adjustability of the phase shift and signal amplitude at output ports (OP1, OP2) of the power splitter with programmable output phase shift IC (900) via modules (910, 920, 930, 940) can be used to compensate for offsets introduced via parasitic elements inherent to the fabrication process of the IC device. The person skilled in the art readily appreciates the flexibility of such adjustability which can be used to compensate for other unintended variations in design parameters. In some exemplary embodiments, variation in a load subjected to output ports (OP1, OP2) at an operating frequency band of interest can be compensated via the same compensation means, regardless of the nature and origin of the variation. For example, load variations can be caused by variations in an input impedance of a device coupled to the ports (OP1, OP2), by imbalance between input impedances of devices coupled to the ports (OP1, OP2), or simply caused by poor layout techniques of the circuit coupling output ports (OP1, OP2) of the IC (900) to corresponding loads.

According to an exemplary embodiment of the present disclosure, the power splitter with programmable output phase shift IC (900) can be configured in the first/second mode of operation to provide split RF signals with a relative phase of $+/-\Phi_1$ and a same power amplitude at input ports of two devices coupled to output ports (OP1, OP2) irrespective of parasitic elements introduced via IC (900) manufacturing, input impedance imbalance and layout issues.

According to a further exemplary embodiment of the present disclosure, the two devices coupled to the output ports (OP1, OP2) can be the constituent amplifiers of a Doherty power amplifier and the relative phase of the split RF signals can be from 0° to +/−90°. The person skilled in the art is readily aware of the critical nature of the phase and amplitude balance of the split RF signals at the input of a Doherty power amplifier. In some cases, best performance of the Doherty amplifier as measured by a corresponding characteristics of an RF output signal of the Doherty amplifier (e.g. efficiency of the amplifier) is not obtained by perfectly balanced split RF signals at the input of the constituent Doherty amplifiers, but rather by providing a controlled offset (e.g. in relative phase) between the split RF signals, as depicted in FIG. 11A.

Figure 11A:
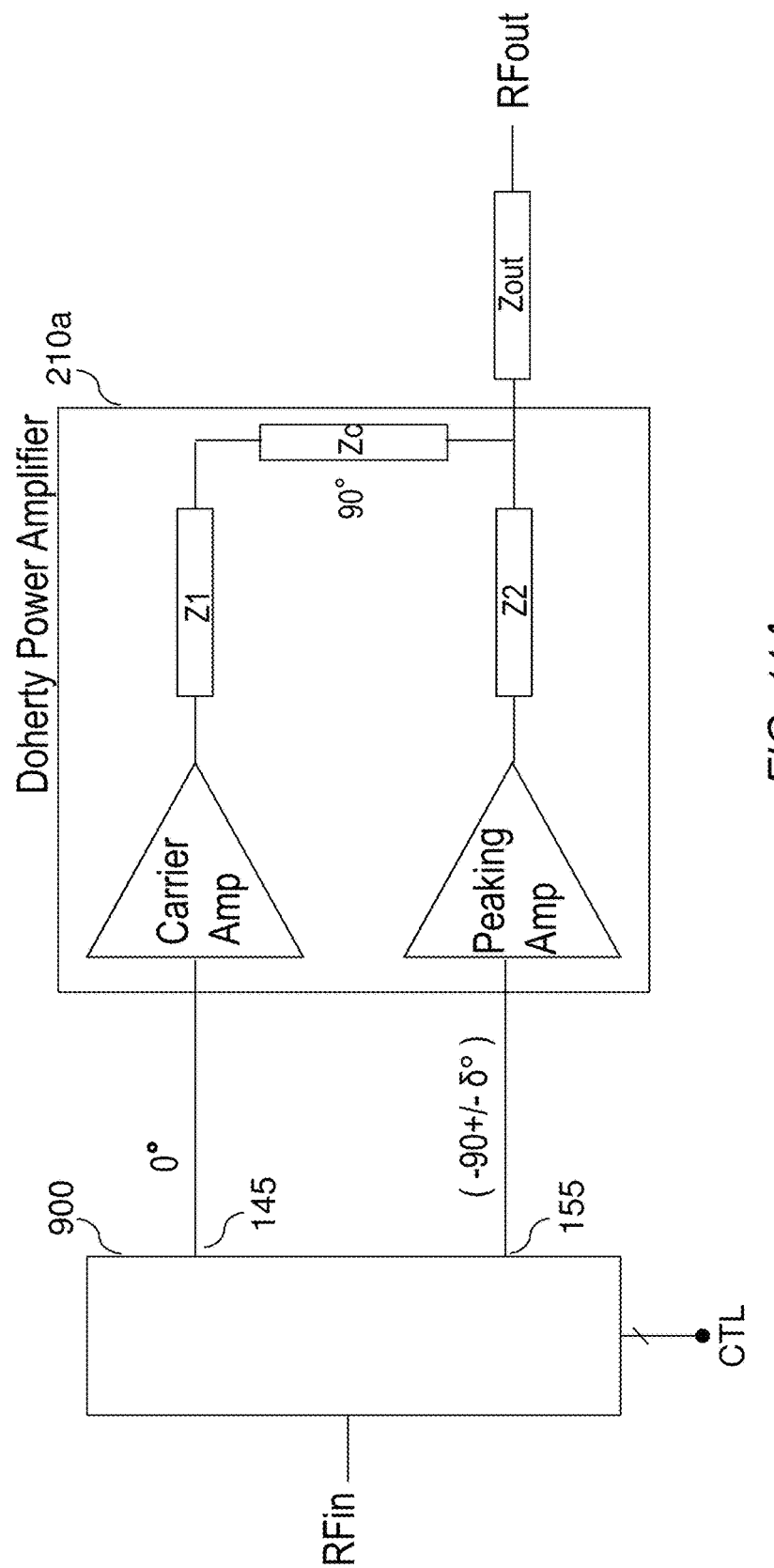
FIGS. 11A and 11B show alternate exemplary implementations of a Doherty power amplifier using the power splitter with programmable output phase shift according to an embodiment of the present disclosure, which allows for a practical tuning of the amplifier and flexibility in circuital layout of the amplifier.
Figure 11B:
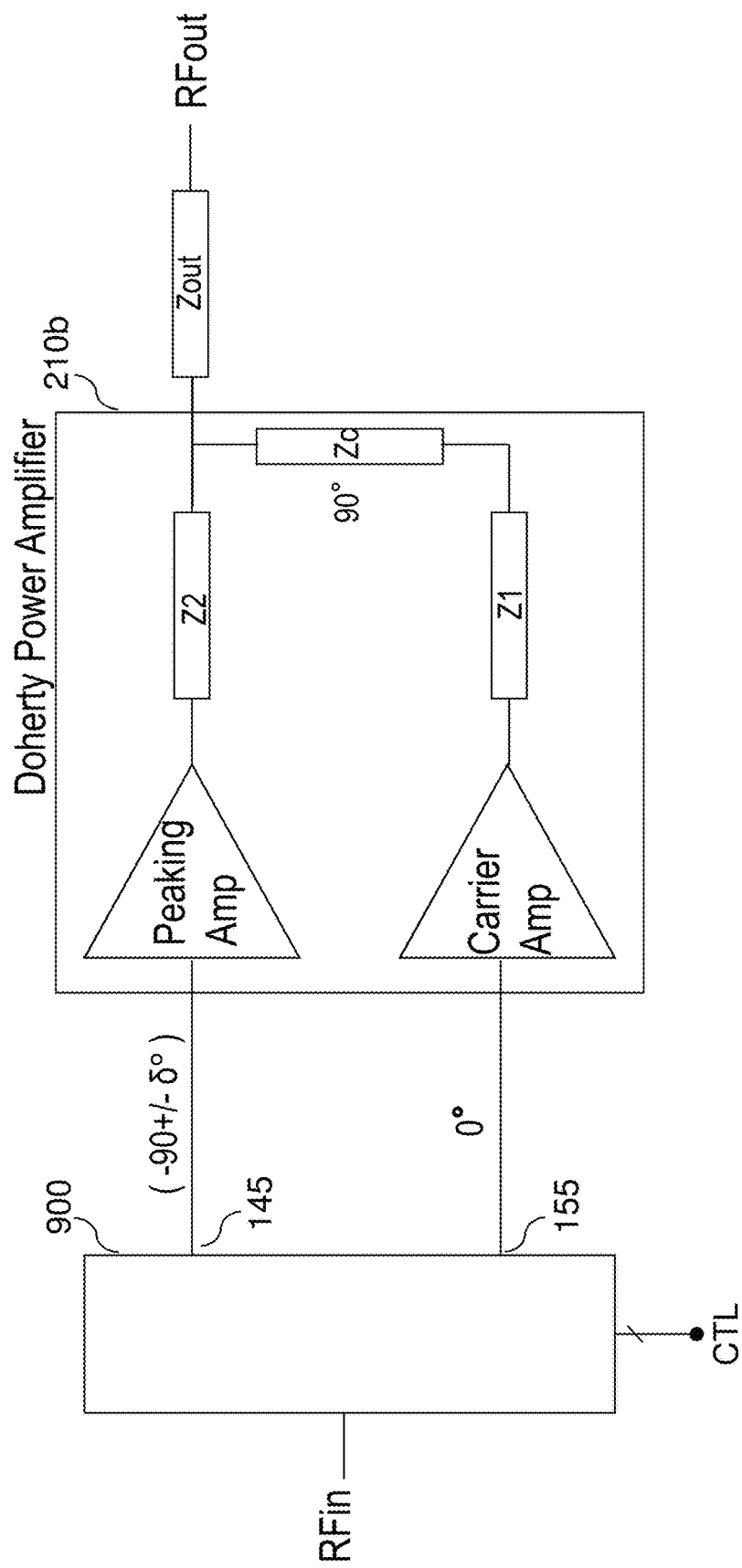

The person skilled in the art readily appreciates the flexibility provided in the Doherty configuration depicted in FIG. 11A, where a single module (900) can provide a tunability of the Doherty power amplifier (210a) for a desired output signal characteristic of the Doherty amplifier via a controlled relative phase shift offset (+/−δ°) at the inputs of the constituent Doherty amplifiers (e.g. carrier/peaking amplifiers). Further flexibility in the physical layout of the Doherty amplifier is provided by the output phase programmability feature of the module (900) as described in the prior sections of the present disclosure, where the relative phase between outputs (145, 155) can be programmed and selected (via the two modes of operation of module 900). Accordingly, outputs (145, 155) connections to the Doherty amplifier can be configurable which can allow a Doherty amplifier (210b) with a physical layout different from the amplifier (210a) of FIG. 11A to be connected to module (900), as depicted in FIG. 11B.

In the configuration depicted in FIG. 11A, a desired physical layout of the Doherty amplifier (210a) may be achieved by connecting the carrier amplifier of the Doherty to the output port (145) of module (900) and connecting the peaking amplifier of the Doherty to the output port (155) of module (900). Alternatively, in the configuration depicted in FIG. 11B, a desired physical layout of the Doherty amplifier (210b) may be achieved by connecting the carrier amplifier of the Doherty to the output port (155) of module (900) and connecting the peaking amplifier of the Doherty to the output port (145) of module (900). The person skilled in the art readily appreciates such flexibility in design and layout provided by the module (900) according to the various teachings of the present disclosure.

As mentioned in the previous sections and according to some embodiments of the present disclosure, time delay elements can be used to provide a desired phase difference of RF signals at output ports (OP1, OP2). A corresponding exemplary embodiment is depicted in FIGS. 12A and 12B, where transmission lines (L1, L2, L3, L4) with controlled characteristic impedances (Z0, Z0/√2, Z0, Z0/√2) are used to provide a desired power (e.g. a same power) and relative phase of RF signals at output ports (OP1, OP2). The circuit architecture according to the embodiment of the present disclosure depicted in FIGS. 12A and 12B is a switched branchline architecture that integrates a power splitter and a programmable phase shift (e.g. 90°) into a single structure. The person skilled in the art will understand that other types of couplers, such as Lange couplers and hybrid couplers, or any structure that can inherently provide a relative phase shift based on a configuration of its four ports, can be used to provide the desired phase difference of RF signals at output ports (OP1, OP2).

The exemplary circuit depicted in FIGS. 12A and 12B is programmed for +90 and −90° relative phase shift between output ports OP1 and OP2 respectively, via selection of the lengths of the corresponding transmission lines (L1, L2, L3, L4), and equal power at output ports OP1 and OP2 via selection of the characteristic impedances of the transmission lines. In the switched branchline circuit depicted in FIGS. 12A and 12B, the RF input signal path ($RF_{IN}$) can be applied to either input port (e.g. at L2 or at L4), one at a time, where each input port has a corresponding switch (e.g. single pole, single throw switch indicated in the figures as SPST) which can be used for termination of the unused input port via a resistor. The unused input port is terminated in the characteristic impedance (e.g. resistor) via closing of a corresponding switch (denoted SPST in FIGS. 12A-12B), while a SPST switch associated to an active signal path is opened. A direct signal path to an output port (e.g. via L4 to OP2 in FIG. 12A and via L2 to OP1 in FIG. 12B) experiences a −90° phase delay while a branch path (e.g. via L4 and L3 to OP1 in FIG. 12A and via L2 and L3 to OP2 in FIG. 12B) experiences an additional −90° phase shift for a total phase shift of −180°. The input signal power is equally split between both outputs in the circuit shown in FIGS. 12A and 12B. Each quarter-wave L1-L4 transmission line can provide a −90° phase shift to an RF signal passing through it.

Although the exemplary embodiments of the present disclosure depicted in FIGS. 12A and 12B provide equal power to and +/−90° phase difference between RF signals at output ports (OP1, OP2), alternative embodiments based on these teachings and within the reach of the person skilled in the art can provide different values power split and different values of phase difference by selecting the appropriate characteristics (e.g. length and impedance) of the transmission lines (L1, L2, L3, L4). As mentioned in the above sections, the present teachings can enable the person skilled in the art to design a power splitter with programmable output phase shift which can operate at any frequency band contained within the frequencies of 100 MHz to 100 GHz.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

LIST OF REFERENCES

[1] W. H. Doherty: "A new High-Efficiency Power Amplifier for Modulated Waves", presented before the Annual Convention of the Institute of Radio Engineers, May 11-13, 1936, at Cleveland, Ohio.
[2] Ernest J. Wilkinson: "An N-Way Hybrid Power Divider", published in the January 1960 edition of the IRE Transactions on Microwave Theory and Techniques.
[3] J. R. Bois et al., "A Wide Band GaAs MMIC Delay Line Phase Shifter with On-Chip Drivers", presented at the 1992 Asia-Pacific Microwave Conference, Adelaide.
[4] John G. Willms et al., "A Wideband GAAS 6-Bit True-Time Delay MMIC Employing On-Chip Digital Drivers", published in the Microwave Conference, 2000. 30$^{th}$ European.

The invention claimed is:
1. An integrated circuit (IC) device configured for operation within a desired operating frequency range, the IC device comprising:
an input port configured to receive an input radio frequency (RF) signal;
a first output port configured to output a first output RF signal based on the input RF signal; and
a second output port configured to output a second output RF signal based on the input RF signal,
wherein during operation within the desired operating frequency range and with respect to an input power level of the input power signal:
the IC device is configured to operate in one of two modes of operation: a first mode of operation and a second mode of operation,
a power of the first output RF signal in the first mode of operation is equal to a power of the first output RF signal in the second mode of operation,
a power of the second output RF signal in the first mode of operation is equal to a power of the second output RF signal in the second mode of operation,
a sum of the power of the first output RF signal and the power of the second output RF signal is constant, and
a relative phase of the first output RF signal to the second output RF signal in the first mode of operation, ΔPhase_m1, is opposite of a relative phase of the first output RF signal to the second output RF signal in the second mode of operation, ΔPhase_m2, such that ΔPhase_m1=−ΔPhase_m2.

2. The IC device of claim 1, wherein the sum of the power of the first output RF signal and the power of the second output RF signal is equal within −2 dB to the input power level of the input RF signal.

3. The IC device of claim 2, wherein the power of the first output RF signal is equal within 1 dB to the power of the second output RF signal.

4. The IC device of claim 2, further comprising a power divider module configured, during operation of the IC device within the desired operating frequency range, to split the input RF signal into a first split RF signal and a second split RF signal, wherein a phase difference between the input RF signal and the first split RF signal is equal to a phase difference between the input RF signal and the second split RF signal.

5. The IC device of claim 4, further comprising a first phase shift module and a second phase shift module, wherein the first phase shift module and the second phase shift module are configured, during operation of the IC device within the desired operating frequency range, to respectively generate the first output RF signal from the first split RF signal and the second output RF signal from the second split RF signal.

6. The IC device of claim 5, wherein:
an absolute value of a relative phase shift between the first output RF signal and the first split RF signal in the first mode of operation, $|\Phi_{1A}|$, is different from an absolute value of a relative phase shift between the first output RF signal and the first split RF signal in the second mode of operation, $|\Phi_{1B}|$, such that $|\Phi_{1A}|\neq|\Phi_{1B}|$, and
an absolute value of a relative phase shift between the second output RF signal and the second split RF signal in the first mode of operation, $|\Phi_{2B}|$, is different from an absolute value of a relative phase shift between the second output RF signal and the second split RF signal in the second mode of operation, $|\Phi_{2A}|$, such that $|\Phi_{2A}|\neq|\Phi_{2B}|$.

7. The IC device of claim 5, wherein:
a relative phase shift between the first output RF signal and the first split RF signal in the first mode of operation, $\Phi_{1A}$, and a relative phase shift between the first output RF signal and the first split RF signal in the second mode of operation, $\Phi_{1B}$, are of opposite signs, such that $\Phi_{1A}=-\Phi_{1B}$, and
a relative phase shift between the second output RF signal and the second split RF signal in the first mode of operation, $\Phi_{2B}$, and a relative phase shift between the second output RF signal and the second split RF signal in the second mode of operation, $\Phi_{2A}$, are of opposite signs, such that $\Phi_{2A}=-\Phi_{2B}$.

8. The IC device of claim 5, wherein:
a relative phase shift between the first output RF signal and the first split RF signal in the first mode of operation, $\Phi_{1A}$, and a relative phase shift between the second output RF signal and the second split RF signal in the second mode of operation, $\Phi_{2A}$, are equal, such that $\Phi_{1A}=\Phi_{2A}$, and
a relative phase shift between the first output RF signal and the first split RF signal in the second mode of operation, $\Phi_{1B}$, and a relative phase shift between the second output RF signal and the second split RF signal in the first mode of operation, $\Phi_{2B}$, are equal, such that $\Phi_{1B}=\Phi_{2B}$.

9. The IC device of claim 5, wherein:
absolute values of relative phase shifts between the first and the second output RF signals and corresponding first and second split RF signals in the first and second modes of operation, $|\Phi_{1A}|$, $|\Phi_{1B}|$, $|\Phi_{2A}|$, $|\Phi_{2B}|$, are different, such that $|\Phi_{1A}|\neq|\Phi_{2A}|\neq|\Phi_{1B}|\neq|\Phi_{2B}|$.

10. The IC device of any one of claim 6, 8 or 9, wherein:
an absolute value of a difference between the absolute value of the relative phase shift between the first output RF signal and the first split RF signal in the first mode of operation, $|\Phi_{1A}|$, and the absolute value of the relative phase shift between the first output RF signal and the first split RF signal in the second mode of operation, $|\Phi_{1B}|$, is equal to or larger than 2°, such that $||\Phi_{1A}|-|\Phi_{1B}||\geq 2°$, and
an absolute value of a difference between the absolute value of the relative phase shift between the second output RF signal and the second split RF signal in the first mode of operation, $|\Phi_{2B}|$, and the absolute value of the relative phase shift between the second output RF signal and the second split RF signal in the second mode of operation, $|\Phi_{2A}|$, is equal to or larger than 2°, such that $||\Phi_{2A}|-|\Phi_{2B}||\geq 2°$.

11. The IC device of claim 5,
wherein during the first mode of operation:
   the first phase shift module provides a first conduction path between the first split RF signal and the first output RF signal, and
   the second phase shift module provides a second conduction path between the second split RF signal and the second output RF signal,
and
wherein during the second mode of operation:
   the first phase shift module provides a third conduction path between the first split RF signal and the first output RF signal, and
   the second phase shift module provides a fourth conduction path between the second split RF signal and the second output RF signal.

12. The IC device of claim 11, wherein the first phase shift module and the second phase shift module each comprise one or more switches configured to select a conduction path between the first/second split RF signals and the first/second output RF signals in correspondence of the first and the second modes of operation.

13. The IC device of claim 11, wherein the each of the first, the second, the third and the fourth conduction path comprises a circuit network configured to provide a phase shift and a signal attenuation of equal to or less than 0.3 dB within the desired operating frequency range.

14. The IC device of claim 13, wherein the phase shift of the circuit network is selected such as to provide one or more of: a) a desired insertion loss, b) a desired return loss, and c) a desired physical size of the circuit network.

15. The IC device of claim 13, wherein the circuit network is a filter network comprising a capacitive element and an inductive element.

16. The IC device of claim 14, wherein the filter network is one of: a) a low pass filter, b) a high pass filter, c) a band pass filter, d) a band reject filter, and e) an all pass filter.

17. The IC device of claim 14, wherein the filter network in the first and fourth conduction paths is a low pass filter, and the filter network in the second and the third conduction paths is a high pass filter.

18. The IC device of claim 13, wherein the circuit network is a time delay circuit.

19. The IC device of claim 18, wherein the time delay circuit comprises a constant-R network.

20. The IC device of claim 13, wherein:
   the circuit network in the first and the second conduction paths are configured to provide the relative phase of the first output RF signal to the second output RF signal in the first mode of operation, and
   the circuit network in the third and the fourth conduction paths are configured to provide the relative phase of the first output RF signal to the second output RF signal in the second mode of operation.

21. The IC device of claim 11, wherein the first phase shift module is a first configurable low pass/high pass filter network comprising reactive components, and the second phase shift module is a second configurable low pass/high pass filter network comprising reactive components.

22. The IC device of claim 21, wherein at least one reactive component of the first/second configurable low pass/high pass filter networks includes series reactive components with parallel coupled switches, and shunted reactive components with series coupled switches.

23. The IC device of claim 21, wherein a at least one reactive component of the first or second configurable low pass/high pass filter networks is a tunable reactive component.

24. The IC device of claim 23, wherein the tunable reactive component is one of: a) a digitally tunable capacitor, and b) a digitally tunable inductor.

25. The IC device of claim 23, wherein the first/second configurable low pass/high pass filter network is configured, during operation within the desired operating frequency range, to adjust in discrete phase steps the relative phase of the first output RF signal to the second output RF signal in first and the second modes of operation.

26. The IC device of claim 25, wherein a step of the discrete phase steps is in a range between 1.4° and 5.6°.

27. The IC device of claim 25, wherein the first/second configurable low pass/high pass filter network is further configured, during operation within the desired operating frequency range, to adjust the power of the first and the second output RF signals in the first and the second modes of operation.

28. The IC device of claim 27, wherein the power is adjusted in discrete attenuation steps with a step resolution in a range between 0.05 dB and 0.50 dB.

29. The IC device of claim 25, further comprising an adjustable attenuation module coupled between the power divider module and one or both of the first and second output ports, wherein the adjustable attenuation module is configured, during operation within the desired operating frequency, to attenuate an RF power of a signal at the one or both of the first and the second output ports.

30. The IC device of claim 29, wherein the adjustable attenuation module is adapted to attenuate the RF power in discrete attenuation steps with a step resolution in a range between 0.05 dB and 0.50 dB.

31. The IC device of claim 1, wherein the desired operating frequency range comprises a range between 100 MHz and 100 GHz.

32. The IC device of claim 1, wherein the desired operating frequency range is $F_R$, wherein $F_R$ is one of: a) 1.8 GHz$\leq F_R \leq$2.0 GHz, b) 3.6 GHz$\leq F_R \leq$4.0 GHz, c) 1.8 GHz$\leq F_R \leq$2.2 GHz, d) 2.3 GHz$\leq F_R \leq$2.7 GHz, e) 3.4 GHz$\leq F_R \leq$3.8 GHz, and f) 5.0 GHz$\leq F_R \leq$12.0 GHz.

33. The IC device of claim 31, wherein an absolute value of the relative phase of the first output RF signal to the second output RF signal in the first mode of operation is in a range $\Phi_R$, wherein $0° \leq \Phi_R \leq 90°$.

34. The IC device of claim 31, wherein an absolute value of the relative phase of the first output RF signal to the second output RF signal in the first mode of operation is one of: a) 45°, b) 90°, and c) 180°.

35. A radio frequency (RF) circuital arrangement comprising a first Doherty amplifier coupled to the IC device of claim 1, the first Doherty amplifier comprising a first peaking amplifier and a first carrier amplifier.

36. The RF circuital arrangement of claim 35, comprising a second Doherty amplifier coupled to the IC device, the second Doherty amplifier comprising a second peaking amplifier and a second carrier amplifier, wherein a coupling of the first peaking amplifier and the first carrier amplifier of the first Doherty amplifier to the first and the second output ports of the IC device is opposite from a coupling of the second peaking amplifier and the second carrier amplifier of the second Doherty amplifier to the first and the second output ports of the IC device.

37. The IC device of claim 1, further comprising a plurality of transmission lines configured during operation of the arrangement to provide ΔPhase_m1 and ΔPhase_m2.

38. The IC device of claim 37, further comprising an input switch configured to provide a first conduction path for the input RF signal between the input port and the first output port, and a second conduction path for the input RF signal between the input port and the second output port.

39. The IC device of claim 38, wherein the first conduction path between the input port and the first output port and the second conduction path between the input port and the second output port comprise one or more common transmission lines of the plurality of transmission lines.

40. The IC device of claim 39, further comprising a first termination switch and a second termination switch, each configured to terminate the input RF signal at the input port in the first and the second mode of operation respectively.

41. The IC device of claim 40, wherein the first and the second termination switches are respectively connected to a first end and a second end of an input transmission line of the plurality of transmission lines.

42. The IC device of claim 41, wherein the input switch connects the input port to the first end and the second end of the input transmission line in the second and the first mode of operation respectively.

43. The IC device of claim 42, wherein a transmission line of the plurality of transmission lines is a quarter-wave transmission line.

44. The IC device of claim 39, wherein a difference in the first conduction path between the input port and the first output port and the second conduction path between the input port and the second output port is one transmission line of the plurality of transmission lines.

45. The IC device of claim 37, wherein the desired operating frequency range comprises a range between 100 MHz and 100 GHz.

46. The IC device of claim 37, wherein the desired operating frequency range is $F_R$, wherein $F_R$ is one of: a) 1.8 GHz≤$F_R$≤2.0 GHz, b) 3.6 GHz≤$F_R$≤4.0 GHz, c) 1.8 GHz≤$F_R$≤2.2 GHz, d) 2.3 GHz≤$F_R$≤2.7 GHz, e) 3.4 GHz≤$F_R$≤3.8 GHz, and f) 5.0 GHz≤$F_R$≤12.0 GHz.

47. An integrated circuit (IC) device configured for operation within a desired operating frequency range, the IC device comprising:

an input port configured to receive an input radio frequency (RF) signal;
a first output port configured to output a first output RF signal based on the input RF signal; and
a second output port configured to output a second output RF signal based on the input RF signal,
wherein during operation within the desired operating frequency range and with respect to an input power level of the input RF signal:
the IC device is configured to operate in one of two modes of operation: a first mode of operation and a second mode of operation,
a power of the first output RF signal in the first mode of operation is equal to a power of the first output RF signal in the second mode of operation,
a power of the second output RF signal in the first mode of operation is equal to a power of the second output RF signal in the second mode of operation,
a sum of the power of the first output RF signal and the power of the second output RF signal is constant, and
an absolute value of a difference between a relative phase of the first output RF signal to the second output RF signal in the first mode of operation, ΔPhase_m1, and a relative phase of the first output RF signal to the second output RF signal in the second mode of operation, ΔPhase_m2, is a desired phase offset, K, such that |ΔPhase_m1|−|ΔPhase_m2|=K.

48. The IC device of claim 47, further comprising a first phase shift module and a second phase shift module, wherein the first phase shift module and the second phase shift module are configured, during operation of the IC device within the desired operating frequency range, to generate ΔPhase_m1 and ΔPhase_m2.

49. The IC device of claim 48, wherein the first phase shift module and the second phase shift module comprise one or more filter networks.

50. The IC device of claim 49, wherein a filter network of the one or more filter networks is a configurable filter.

51. The IC device of claim 47, wherein the sum of the power of the first output RF signal and the power of the second output RF signal is equal within −2 dB to the input power level of the input RF signal.

* * * * *